United States Patent
Kakizaki et al.

(10) Patent No.: US 11,469,568 B2
(45) Date of Patent: Oct. 11, 2022

(54) LASER APPARATUS AND LASER PROCESSING SYSTEM

(71) Applicant: Gigaphoton Inc., Tochigi (JP)

(72) Inventors: Kouji Kakizaki, Oyama (JP); Osamu Wakabayashi, Oyama (JP)

(73) Assignee: Gigaphoton Inc., Tochigi (JP)

( * ) Notice: Subject to any disclaimer, the term of this patent is extended or adjusted under 35 U.S.C. 154(b) by 683 days.

(21) Appl. No.: 16/389,860

(22) Filed: Apr. 19, 2019

(65) Prior Publication Data

US 2019/0245321 A1    Aug. 8, 2019

Related U.S. Application Data

(63) Continuation of application No. PCT/JP2016/086572, filed on Dec. 8, 2016.

(51) Int. Cl.
*H01S 3/00* (2006.01)
*H01S 3/10* (2006.01)
(Continued)

(52) U.S. Cl.
CPC ...... *H01S 3/10015* (2013.01); *H01S 3/10007* (2013.01); *H01S 3/10084* (2013.01);
(Continued)

(58) Field of Classification Search
None
See application file for complete search history.

(56) References Cited

U.S. PATENT DOCUMENTS 5,978,394 A * 11/1999 Newman ............... G01J 9/0246
  372/32
9,531,151 B2   12/2016 Fuchs et al.
(Continued)

FOREIGN PATENT DOCUMENTS

CN      105576480 A    5/2016
JP      2009-188031 A  8/2009
(Continued)

OTHER PUBLICATIONS

An Office Action; "Notification of Reasons for Refusal," mailed by the Japanese Patent Office dated Jun. 22, 2020, which corresponds to Japanese Patent Application No. 2018-555400 and is related to U.S. Appl. No. 16/389,860 with English language translation.
(Continued)

*Primary Examiner* — Mark Hellner
(74) *Attorney, Agent, or Firm* — Studebaker & Brackett PC

(57) ABSTRACT

A laser apparatus includes: (A) a solid-state laser apparatus that outputs burst seed pulsed light containing a plurality of pulses; (B) an excimer amplifier that amplifies the burst seed pulsed light in a discharge space in a single occurrence of discharge and outputs the amplified light as amplified burst pulsed light; (C) an energy sensor that measures the energy of the amplified burst pulsed light; and (D) a laser controller that corrects the timing at which the solid-state laser apparatus is caused to output the burst seed pulsed light based on the relationship of the difference between the timing at which the solid-state laser apparatus outputs the burst seed pulsed light and the timing at which the discharge occurs in the discharge space with a measured value of the energy.

17 Claims, 42 Drawing Sheets

(51) Int. Cl.
  *H01S 3/11* (2006.01)
  *H01S 3/23* (2006.01)
  *H01S 3/225* (2006.01)
  *H01S 3/097* (2006.01)
  *H01S 5/50* (2006.01)
  *H01S 3/13* (2006.01)
  *H01S 3/16* (2006.01)
  *H01S 3/0971* (2006.01)

(52) U.S. Cl.
  CPC .............. *H01S 3/11* (2013.01); *H01S 3/2375* (2013.01); *H01S 3/0092* (2013.01); *H01S 3/0971* (2013.01); *H01S 3/09702* (2013.01); *H01S 3/1301* (2013.01); *H01S 3/1625* (2013.01); *H01S 3/1636* (2013.01); *H01S 3/225* (2013.01); *H01S 3/2251* (2013.01); *H01S 3/2325* (2013.01); *H01S 5/50* (2013.01)

(56) References Cited

U.S. PATENT DOCUMENTS

| | | |
|---|---|---|
| 2002/0044586 A1 | 4/2002 | Myers et al. |
| 2009/0232171 A1 | 9/2009 | Abe et al. |
| 2011/0182306 A1 | 7/2011 | Hosseini et al. |
| 2012/0243565 A1 | 9/2012 | Onose et al. |
| 2012/0250710 A1 | 10/2012 | Yoshino et al. |
| 2013/0279526 A1 | 10/2013 | Kakizaki et al. |
| 2017/0279241 A1 | 9/2017 | Onose et al. |

FOREIGN PATENT DOCUMENTS

| | | | | |
|---|---|---|---|---|
| JP | 2009-246345 A | 10/2009 | | |
| JP | 2012-515450 A | 7/2012 | | |
| JP | 2013-222173 A | 10/2013 | | |
| JP | 2014-053627 A | 3/2014 | | |
| JP | 2016-051897 A | 4/2016 | | |
| WO | WO 2004012308 A2 * | 2/2004 | .............. | H01S 3/22 |
| WO | 2010/083091 A2 | 7/2010 | | |
| WO | 2011/011461 A1 | 1/2011 | | |
| WO | 2016/121281 A1 | 8/2016 | | |

OTHER PUBLICATIONS

An Office Action mailed by the Chinese Patent Office dated Jun. 19, 2020, which corresponds to Chinese Patent Application No. 201680090114.7 and is related to U.S. Appl. No. 16/389,860.

International Search Report issued in PCT/JP2016/086572; dated Feb. 21, 2017.

International Preliminary Report on Patentability and Written Opinion issued in PCT/JP2016/086572; dated Jun. 11, 2019.

The extended European search report issued by the European Patent Office dated Dec. 5, 2019, which corresponds to European Patent Application No. 16923248.5 and is related to U.S. Appl. No. 16/389,860.

Communication pursuant to Article 94(3) EPC issued by the European Patent Office dated Jul. 12, 2022, which corresponds to European Patent Application No. 16 923 248.5-1206 and is related to U.S. Appl. No. 16/389,860.

* cited by examiner

FIG. 16

| J | D(J) | E(J) |
|---|---|---|
| 1 | D(1) | E(1) |
| 2 | D(2) | E(2) |
| 3 | D(3) | E(3) |
| . | . | . |
| . | . | . |
| Jmax | D(Jmax) | E(Jmax) |

| n | Ip(n) | Td(n) | Tw(n) |
|---|---|---|---|
| 1 | Ip(1) | Td(1) | Tw(1) |
| 2 | Ip(2) | Td(2) | Tw(2) |
| 3 | Ip(3) | Td(3) | Tw(3) |
| · | · | · | · |
| · | · | · | · |
| m | Ip(m) | Td(m) | Tw(m) |
| BURST PULSE ENERGY | E | | |

| J | D(J) | Isum(J) |
|---|------|---------|
| 1 | D(1) | Isum(1) |
| 2 | D(2) | Isum(2) |
| 3 | D(3) | Isum(3) |
| . | . | . |
| . | . | . |
| Jmax | D(Jmax) | Isum(Jmax) |

T3

LASER APPARATUS AND LASER PROCESSING SYSTEM

CROSS REFERENCE TO RELATED APPLICATIONS

The present application is a continuation application of International Application No. PCT/JP2016/086572 filed on Dec. 8, 2016. The content of the application is incorporated herein by reference in its entirety.

BACKGROUND

1. Technical Field

The present disclosure relates to a laser apparatus and a laser processing system.

2. Related Art

A semiconductor exposure apparatus is required to improve the resolution as a semiconductor integrated circuit is increasingly miniaturized and highly integrated. A semiconductor exposure apparatus will be hereinafter simply referred to as an "exposure apparatus." To this end, reduction in the wavelength of the light emitted from a light source for exposure is underway. A gas laser apparatus based on discharge excitation is used as the light source for exposure in place of a mercury lamp in related art. At present, a KrF excimer laser apparatus, which outputs ultraviolet light having a wavelength of 248.4 nm, and an ArF excimer laser apparatus, which outputs ultraviolet light having a wavelength of 193.4 nm, are used as a laser apparatus for exposure.

As a current exposure technology, liquid-immersion exposure, in which the gap between the exposure lens of the exposure apparatus and a wafer is filled with a liquid, has been put into use. In the liquid-immersion exposure, since the refractive index of the gap changes, the apparent wavelength of the light from the light source for exposure is shortened. In the liquid-immersion exposure with an ArF excimer laser apparatus as the light source for exposure, the wafer is irradiated with ultraviolet light having a wavelength of 134 nm in water. The technology described above is called ArF liquid-immersion exposure. The ArF liquid-immersion exposure is also called ArF liquid-immersion lithography.

Since KrF and ArF excimer laser apparatuses each have a wide spectral linewidth ranging from about 350 to 400 pm in spontaneous oscillation, the chromatic aberrations occur in association with the laser light (ultraviolet light) projected with the size of the laser light reduced onto the wafer via the projection lens of the exposure apparatus, resulting in a decrease in the resolution. To avoid the decrease in resolution, the spectral linewidth of the laser light outputted from the gas laser apparatus needs to be narrow enough to make the chromatic aberrations negligible. A line narrowing module including a line narrowing element is therefore provided in the laser resonator of the gas laser apparatus. The line narrowing module narrows the spectral linewidth. The line narrowing element may, for example, be an etalon or a grating. A laser apparatus having a narrowed spectral linewidth as described above is called a narrowed-linewidth laser apparatus.

The ultraviolet laser light outputted from an excimer laser apparatus, which has a pulse width of about several tens of nanoseconds and has a short wavelength, such as 248.4 nm and 193.4 nm, is used in some case to directly process a polymer material, a glass material, and other materials. A polymer material is so processed that the molecules that form the polymer material are unbound from each other by the ultraviolet laser light having photon energy higher than the binding energy. Unheated processing can therefore be performed by using the ultraviolet laser light, and it is known that an excellent processed shape is achieved by unheated processing. Further, it is difficult to process a glass material, a ceramic material, or any other similar material with visible or infrared laser light, but ultraviolet laser light outputted from an excimer laser apparatus can process such a material because the material absorbs the ultraviolet laser light by a large amount.

CITATION LIST

Patent Literature

[PTL 1] JP-A-2013-222173
[PTL 2] JP-A-2016-51897
[PTL 3] JP-A-2014-53627
[PTL 4] JP-T-2012-515450

SUMMARY

A laser apparatus according to one viewpoint of the present disclosure includes:

(A) a solid-state laser apparatus that outputs burst seed pulsed light containing a plurality of pulses;

(B) an excimer amplifier that amplifies the burst seed pulsed light in a discharge space in a single occurrence of discharge and outputs the amplified light as amplified burst pulsed light;

(C) an energy sensor that measures energy of the amplified burst pulsed light; and (D) a laser controller that corrects a timing at which the solid-state laser apparatus is caused to output the burst seed pulsed light based on a relationship of a difference between a timing at which the solid-state laser apparatus outputs the burst seed pulsed light and a timing at which discharge occurs in the discharge space with a measured value of the energy.

A laser processing system according to one viewpoint of the present disclosure includes:

(K) the laser apparatus described above; and (L) a laser radiator that radiates the amplified burst seed pulsed light inputted from the laser apparatus onto a workpiece.

BRIEF DESCRIPTION OF THE DRAWINGS

Embodiments of the present disclosure will be described below only by way of example with reference to the accompanying drawings.

FIG. 16 shows a table.

FIG. 23 shows another table.

FIG. 25 shows another table.

DETAILED DESCRIPTION

Figure 1:
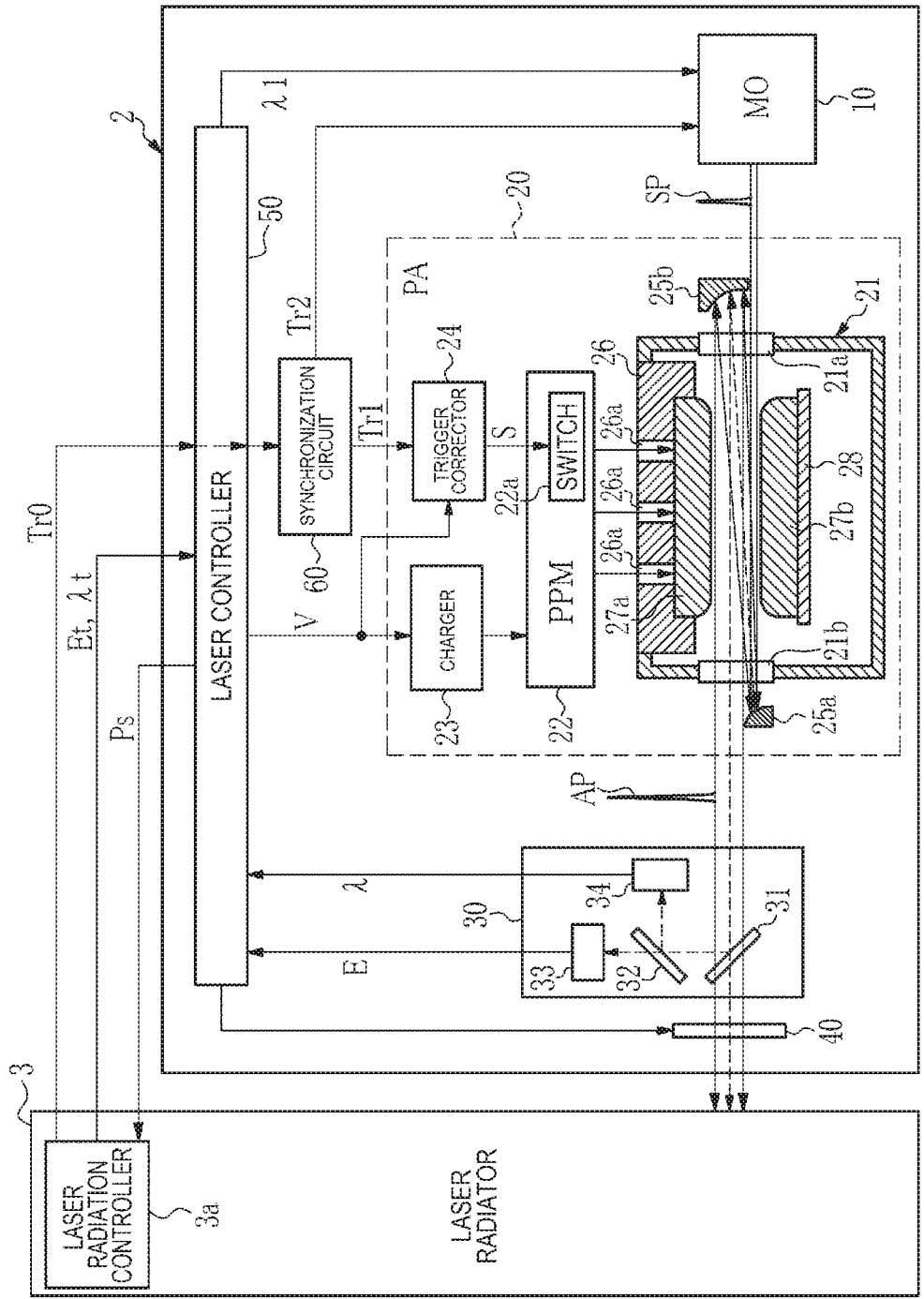
FIG. 1 schematically shows the configuration of a laser apparatus according to Comparable Example.

<Contents>
1. Comparable Example
1.1 Configuration
1.2 Operation
1.3 Problems
1.4 Conversion of seed light into burst pulses
2. First Embodiment
2.1 Configuration
2.2 Definitions
2.2.1 Waveform of amplified burst pulsed light
2.2.2 Waveform of burst pulse signal
2.3 Operation
2.3.1 Basic operation timings
2.3.2 Correction of trigger delay period
2.3.3 Oscillation control
2.4 Effects
3. Second Embodiment
3.1 Configuration
3.2 Operation
3.2.1 Basic operation timings
3.2.2 Correction of trigger delay period
3.2.3 Oscillation control
3.3 Effects
4. Third Embodiment
4.1 Configuration
4.2 Operation
4.2.1 Oscillation control
4.3 Effects
5. Variation of solid-state laser apparatus
5.1 First variation
5.1.1 Configuration
5.1.2 Operation
5.1.3 Effects
5.2 Second variation
5.2.1 Configuration and operation
6. Laser processing system
6.1 Configuration
6.2 Effects
7. Specific example of semiconductor laser and semiconductor optical amplifier
7.1 Configuration
7.2 Operation
7.3 Effects
8. Variation of discharge sensor
8.1 Configuration and operation
8.2 Effects
9. Other variations Embodiments of the present disclosure will be described below in detail with reference to the drawings. The embodiments described below show some examples of the present disclosure and are not intended to limit the contents of the present disclosure. Further, all configurations and operations described in the embodiments are not necessarily essential as configurations and operations in the present disclosure. The same component has the same reference character, and no redundant description of the same component will be made.

1. Comparable Example

1.1 Configuration

Figure 2:
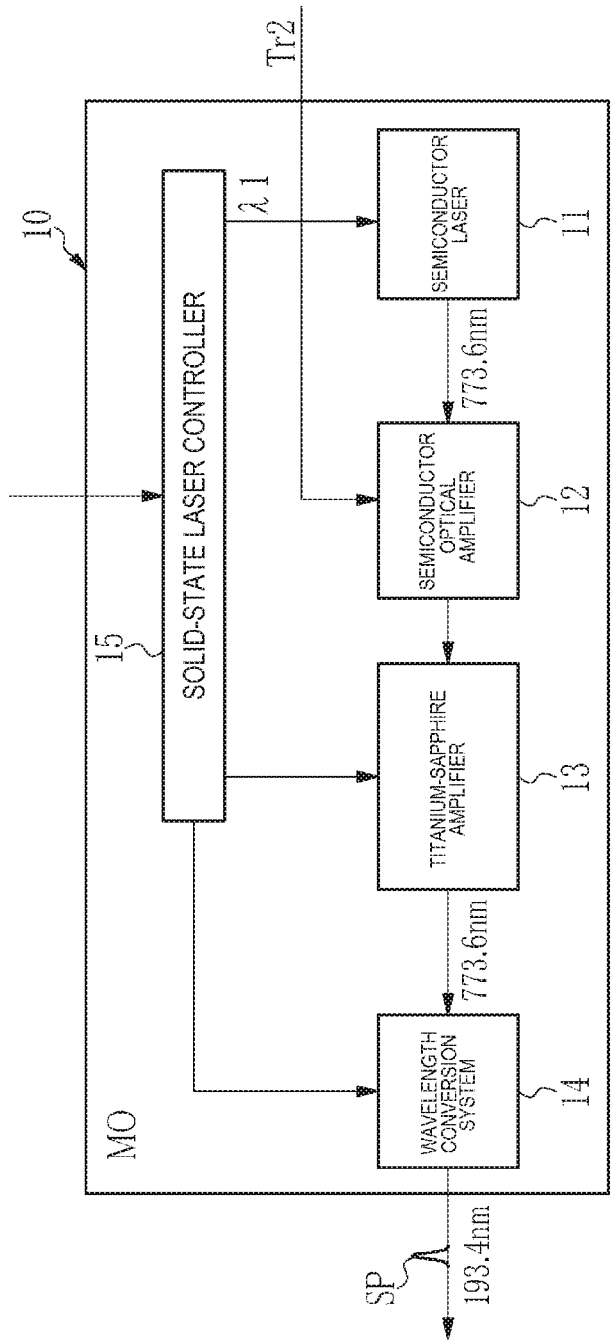
FIG. 2 is a block diagram showing the configuration of a solid-state laser apparatus according to Comparable Example.

FIGS. 1 and 2 schematically show the configuration of a laser apparatus 2 according to Comparable Example. The laser apparatus 2 is a master-oscillator-power-amplifier-type (MOPA-type) laser apparatus. In FIG. 1, the laser apparatus 2 includes a solid-state laser apparatus 10 as a master oscillator (MO), an excimer amplifier 20 as a power amplifier (PA), a monitor module 30, a shutter 40, a laser controller 50, and a synchronization circuit 60.

FIG. 2 shows the configuration of the solid-state laser apparatus 10. The solid-state laser apparatus 10 includes a semiconductor laser 11, a semiconductor optical amplifier 12, a titanium-sapphire amplifier 13, a wavelength conversion system 14, and a solid-state laser controller 15. The solid-state laser controller 15 controls the operations of the semiconductor laser 11, the titanium-sapphire amplifier 13, and the wavelength conversion system 14.

The semiconductor laser 11 is a distributed-feedback-type semiconductor laser that outputs continuous-wave (CW) laser light having a wavelength of about 773.6 nm. The semiconductor laser 11 is preferably configured to be capable of changing the oscillation wavelength by changing the setting of the temperature of the semiconductor material. The semiconductor optical amplifier 12 performs pulse amplification on seed light outputted from the semiconductor laser 11 in accordance with a second internal trigger signal Tr2, which will be described later. The pulsed laser light formed by the semiconductor optical amplifier 12 is hereinafter referred to as seed pulsed light.

The titanium-sapphire amplifier 13 includes a titanium-sapphire crystal and a pumping laser that are both not shown. The titanium-sapphire crystal is disposed in the optical path of the seed pulsed light outputted from the semiconductor optical amplifier 12. The pumping laser is, for example, a laser apparatus that outputs second harmonic light from an YLF laser. The titanium-sapphire amplifier 13 amplifies the seed pulsed light outputted from the semiconductor optical amplifier 12.

The wavelength conversion system 14 includes an $LiB_3O_5$ (LBO) crystal and a $KBe_2BO_3F_2$ (KBBF) crystal that are each a nonlinear crystal. The wavelength conversion system 14 receives the seed pulsed light outputted from the titanium-sapphire amplifier 13 and converts the wavelength of the seed pulsed light to generate fourth harmonic light. That is, the wavelength conversion system 14 outputs ultraviolet seed pulsed light SP having a wavelength of about 193.4 nm.

To configure the wavelength conversion system 14 to be capable of changing the oscillation wavelength of the semiconductor laser 11, it is preferable to dispose the LBO crystal and the KBBF crystal on respective rotary stages that are not shown but allow a change in the angle of incidence of the seed pulsed light incident on each of the crystals. The solid-state laser controller 15 rotates each of the rotary stages in such a way that the angle of incidence of the seed pulsed light incident on each of the crystals coincides with a phase matching angle corresponding to a target wavelength.

In FIG. 1, the excimer amplifier 20 includes a laser chamber 21, a pulse power module (PPM) 22, a charger 23, a trigger corrector 24, a convex mirror 25a, and a concave mirror 25b. The laser chamber 21 is provided with windows 21a and 21b. The laser chamber 21 encapsulates a laser gas as a laser medium. The laser gas is, for example, an argon-fluorine (ArF) gas.

The laser chamber 21 is further provided with an opening, and an electrically insulating plate 26, in which a plurality of feedthroughs 26a are buried, is so provided as to close the opening. The PPM 22 is disposed on the electrically insulating plate 26. First and second discharge electrodes 27a, 27b, which each serve as a primary electrode, and a ground plate 28 are disposed in the laser chamber 21.

The first and second discharge electrodes 27a, 27b are so disposed as to face each other as a pair of discharge electrodes for exciting the laser medium based on discharge. The first discharge electrode 27a and the second discharge electrode 27b are so disposed that the discharge surfaces thereof face each other. The space between the discharge surfaces of the first and second discharge electrodes 27a, 27b is called a discharge space. The first discharge electrode 27a is so disposed that the surface opposite the discharge surface is supported by the electrically insulating plate 26. The first discharge electrode 27a is connected to the feedthroughs 26a. The second discharge electrode 27b is so disposed that the surface opposite the discharge surface is supported by the ground plate 28.

The PPM 22 includes a switch 22a and further includes a charging capacitor, a pulse transformer, a magnetic compression circuit, and a peaking capacitor that are not shown. The peaking capacitor is connected to the feedthroughs 26a via a connector that is not shown. The charger 23 charges the charging capacitor. Specifically, the charger 23 charges the charging capacitor based on a set value of charging voltage V inputted from the laser controller 50.

The switch 22a is turned on and off by a switch signal S inputted from the trigger corrector 24 based on a first internal trigger signal Tr1, which will be described later. When the switch signal S is inputted to the switch 22a and the switch 22a is therefore turned on, current flows from the charging capacitor to the primary side of the pulse transformer, and electromagnetic induction causes current in the opposite direction to flow to the secondary side of the pulse transformer. The magnetic compression circuit is connected to the secondary side of the pulse transformer and compresses the pulse width of the current pulses. The peaking capacitor is charged by the current pulses. When the voltage across the peaking capacitor reaches breakdown voltage of the laser gas, the laser gas between the first discharge electrode 27a and the second discharge electrode 27b undergoes dielectric breakdown and discharge occurs.

The convex mirror 25a and the concave mirror 25b are so disposed that the seed pulsed light SP outputted from the solid-state laser apparatus 10 passes three times through the discharge space between the first and second discharge electrodes 27a, 27b for an increase in the beam width of the seed pulsed light SP. The seed pulsed light SP outputted from the solid-state laser apparatus 10 passes through the window 21a, passes through the discharge space, passes through the window 21b, and is reflected off the convex mirror 25a. The seed pulsed light SP reflected off the convex mirror 25a passes through the window 21b, passes through the discharge space, passes through the window 21a, and is reflected off the concave mirror 25b. The seed pulsed light SP reflected off the concave mirror 25b passes through the window 21a, passes through the discharge space, passes through the window 21b, and exits out of the excimer amplifier 20. The beam width of the seed pulsed light SP increases when the seed pulsed light SP is reflected off the convex mirror 25a.

The synchronization circuit 60 produces the first internal trigger signal Tr1 and the second internal trigger signal Tr2 based on a light emission trigger signal Tr0 received from the laser controller 50. The synchronization circuit 60 inputs the first internal trigger signal Tr1 to the excimer amplifier 20 and the second internal trigger signal Tr2 to the solid-state laser apparatus 10. The first internal trigger signal Tr1 and the second internal trigger signal Tr2 are separate from each other by a predetermined time difference Tmod so that discharge occurs when the seed pulsed light SP outputted from the solid-state laser apparatus 10 enters the discharge space in the excimer amplifier 20. The time difference Tmod is also referred to as a trigger delay period Tmod.

The trigger corrector 24 produces the switch signal S in accordance with the first internal trigger signal Tr1 inputted from the synchronization circuit 60 and outputs the switch signal S. The trigger corrector 24 corrects in accordance with the set value of the charging voltage V a period Tpac from the time at which the first internal trigger signal Tr1 is inputted to the time at which the switch signal S is outputted. The reason for this is that in the case where the PPM 22 includes the magnetic compression circuit, a period Tpas required to cause the discharge to occur after the switch signal S is inputted depends on the charging voltage V, as shown by the following Expression (1):

$$Tpas = K/V \quad (1)$$

where K is a constant.

The trigger corrector 24 corrects the timing at which the switch signal S is produced based on Expression (1) in such a way that a period Tpat from the time at which the first internal trigger signal Tr1 is inputted to the trigger corrector 24 to the time at which the discharge occurs is fixed irrespective of the charging voltage V.

The seed pulsed light SP having entered the discharge space in the excimer amplifier 20 is amplified when the discharge occurs in the discharge space and outputted as amplified pulsed light AP, which is the amplified seed pulsed light SP, from the excimer amplifier 20. The monitor module 30 is disposed in the optical path of the amplified pulsed light AP.

The monitor module 30 includes a first beam splitter 31, a second beam splitter 32, an energy sensor 33, and a wavelength monitor 34. The first beam splitter 31 is disposed in the optical path of the amplified pulsed light AP and reflects part thereof. The second beam splitter 32 is disposed in the optical path of the light reflected off the first beam splitter 31 and reflects part thereof.

The light having passed through the second beam splitter 32 is incident on the energy sensor 33. The energy sensor 33 includes, for example, a photodiode having sensitivity to ultraviolet light. That is, the energy sensor 33 measures the energy of the pulses that form the amplified pulsed light AP. The energy sensor 33 transmits the measured pulse energy E to the laser controller 50.

The light reflected off the second beam splitter 32 is incident on the wavelength monitor 34. The wavelength monitor 34 includes an etalon spectrometer including a diffuser, an air gap etalon, a light focusing lens, and a linear sensor that are not shown. The linear sensor detects the radii of interference fringes produced by the diffuser, the air gap etalon, and the light focusing lens to measure the wavelength of the amplified pulsed light AP. The wavelength monitor 34 transmits the measured wavelength λ to the laser controller 50.

The amplified pulsed light AP having passed through the first beam splitter 31 is supplied to a laser radiator 3 via the shutter 40. The open/close operation of the shutter 40 is controlled by the laser controller 50 between an open state and a closed state. The laser radiator 3 includes a laser radiation controller 3a. The laser radiation controller 3a transmits the light emission trigger signal Tr0, a target wavelength λt, and a target pulse energy Et to the laser controller 50.

1.2 Operation

The operation of the laser apparatus 2 performed under the control of the laser controller 50 will next be described. The laser controller 50, when it receives the target wavelength λt from the laser radiation controller 3a, changes the oscillation wavelength of the semiconductor laser 11 in such a way that the wavelength of the seed pulsed light SP outputted from the solid-state laser apparatus 10 coincides with the target wavelength λt. Specifically, the laser controller 50 sets wavelength data λl, which satisfies the following Expression (2), in the semiconductor laser 11:

$$\lambda 1 = 4\lambda t \quad (2)$$

For example, in a case where the target wavelength λt is 193.4 nm, the wavelength data λ1 is set at 773.6 nm. The laser controller 50, when it changes the wavelength data λ1 to be set in the semiconductor laser 11, also controls the rotary stages provided in the wavelength conversion system 14 via the solid-state laser controller 15. Specifically, the laser controller 50 rotates the rotary stages in such a way that the angles of incidence of the seed pulsed light SP incident on the LBO crystal and the KBBF crystal each coincide with a phase matching angle corresponding to the target wavelength λt. The wavelength conversion efficiency of each of the LBO crystal and the KBBF crystal is thus maximized.

The laser controller 50, when it receives the target pulse energy Et from the laser radiation controller 3a, sets charging voltage V corresponding to the target pulse energy Et in the charger 23. The charger 23 charges the charging capacitor provided in the PPM 22 based on the set charging voltage V.

After the laser controller 50 transmits a radiation permission signal Ps to the laser radiation controller 3a, and when the laser controller 50 receives the light emission trigger signal Tr0 from the laser radiation controller 3a, the laser controller 50 transmits the light emission trigger signal Tr0 to the synchronization circuit 60. The synchronization circuit 60, when it receives the light emission trigger signal Tr0, produces the first internal trigger signal Tr1, waits until the trigger delay period Tmod elapses after the first internal trigger signal Tr1 is produced, and produces the second internal trigger signal Tr2. The synchronization circuit 60 inputs the first internal trigger signal Tr1 to the excimer amplifier 20 and inputs the second internal trigger signal Tr2 to the solid-state laser apparatus 10.

When the first internal trigger signal Tr1 is inputted to the excimer amplifier 20, the trigger corrector 24 produces the switch signal S by delaying the first internal trigger signal Tr1 by the delay period Tpac based on the charging voltage V set in the charger 23 by the laser controller 50. That is, the trigger corrector 24 inputs the switch signal S to the switch 22a in the PPM 22 at the timing at which the period Tpat from the time when the first internal trigger signal Tr1 is inputted to the trigger corrector 24 to the time at which the discharge occurs is fixed irrespective of the charging voltage V.

When the second internal trigger signal Tr2 is inputted to the solid-state laser apparatus 10, the semiconductor optical amplifier 12 performs pulse amplification on the seed light in the form of CW laser light inputted from the semiconductor laser 11 to produce the seed pulsed light. The seed pulsed light produced by the semiconductor optical amplifier 12 is further amplified by the titanium-sapphire amplifier 13 and enters the wavelength conversion system 14. The wavelength conversion system 14, specifically, the LBO crystal and the KBBF crystal, which are each a nonlinear crystal, produce fourth harmonic light. As a result, the solid-state laser apparatus 10 outputs the seed pulsed light SP having the target wavelength $\lambda t$ (193.4 nm).

When the switch signal S is inputted from the trigger corrector 24 to the switch 22, and the PPM 22 performs the pulse compression and other operations, discharge occurs in the discharge space in the excimer amplifier 20. Immediately before the discharge occurs, the seed pulsed light SP enters the discharge space from the solid-state laser apparatus 10. The seed pulsed light SP is amplified by the discharge, and the beam width of the seed pulsed light SP is increased when the seed pulsed light SP travelling back and forth between the convex mirror 25a and the concave mirror 25b is reflected off the two mirrors. The seed pulsed light SP amplified in the discharge space and having the increased beam width is outputted as the amplified pulsed light AP from the excimer amplifier 20.

The amplified pulsed light AP enters the monitor module 30 from the excimer amplifier 20. Part of the amplified pulsed light AP having entered the monitor module 30 is sampled by the first beam splitter 31 for the measurement of the pulse energy and the wavelength. The measured pulse energy E and wavelength $\lambda$ are inputted to the laser controller 50.

The laser controller 50 compares the measured wavelength $\lambda$ with the target wavelength $\lambda t$ and changes the wavelength data $\lambda 1$ to be set in the semiconductor laser 11 in such a way that the measured wavelength $\lambda$ approaches the target wavelength $\lambda t$. Further, the laser controller 50 compares the measured pulse energy E with the target pulse energy Et and controls the charging voltage V to be set in the charger 23 in such a way that the measured pulse energy E approaches the target pulse energy Et.

In the case where the shutter 40 is open, the amplified pulsed light AP having passed through the monitor module 30 enters the laser radiator 3. The laser radiator 3 uses the amplified pulsed light AP supplied from the laser apparatus 2 to perform laser processing on a target object to be processed, such as a polymer material, a glass material, and a ceramic material.

1.3 Problems

To use laser light that belongs to the ultraviolet wavelength region to perform laser processing, the pulse width of the laser light is preferably shortened to increase the peak power of each pulse of the laser light. In Comparative Example described above, the pulse width of the seed pulsed light SP to be inputted to the excimer amplifier 20 is preferably set at about 1 ns. On the other hand, the discharge period (gain duration) of the excimer amplifier 20 is about several tens of nanoseconds. As described above, in the case where the pulse width of the seed pulsed light SP is shortened, the discharge period of the excimer amplifier 20 is greater than the pulse width of the seed pulsed light SP, so that the discharge space cannot be filled with the seed pulsed light SP during the discharge period.

That is, shortening the pulse width of the seed pulsed light SP undesirably lowers the amplification efficiency in the excimer amplifier 20. Further, shortening the pulse width of the seed pulsed light SP undesirably increases the proportion of the spontaneously radiated amplified light (ASE) in the amplified pulsed light AP. Moreover, shortening the pulse width of the seed pulsed light SP is likely to damage optical elements, such as the windows 21a and 21b, resulting in a problem of a decrease in life of these optical elements.

1.4 Conversion of Seed Light into Burst Pulses

Figure 3:
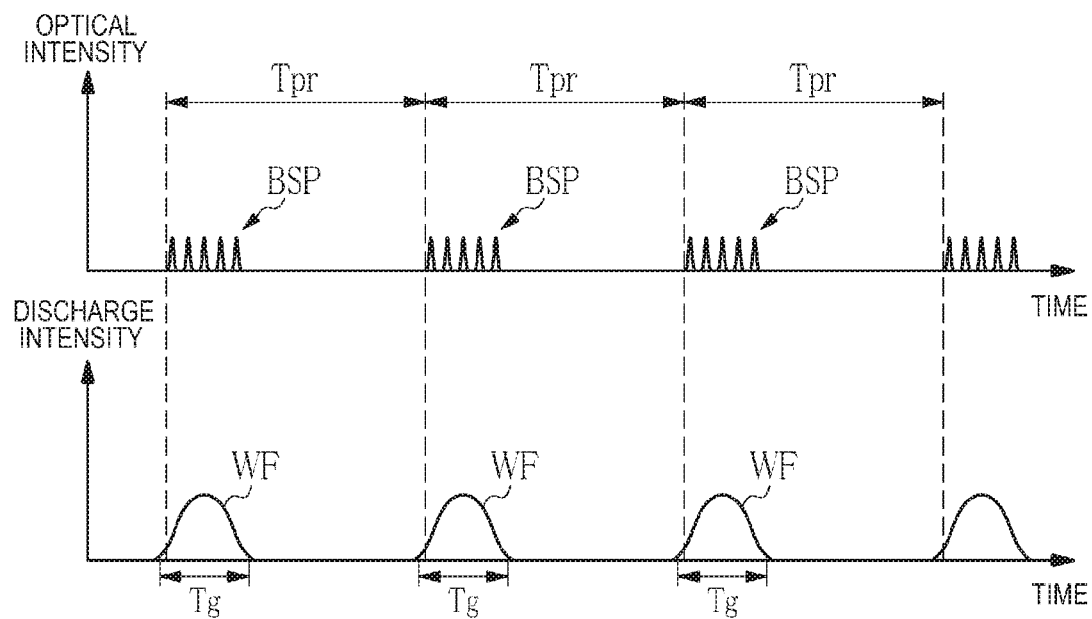
FIG. 3 is a timing chart showing the timings of burst seed pulsed light and discharge.

To solve the problems described above, it is conceivable to convert the seed pulsed light SP into burst pulses each having a temporal width corresponding to the gain duration of the excimer amplifier 20. Specifically, burst seed pulsed light BSP containing a plurality of pulses, as shown in FIG. 3, is caused to enter the discharge space in the excimer amplifier 20 from the solid-state laser apparatus 10.

The burst seed pulsed light BSP contains, for example, five pulses. The pulse width of each of the pulses is set to be smaller than 1 ns, and the interval between the pulses is set at several nanoseconds. The overall pulse width of the burst seed pulsed light BSP is set at a value corresponding to the discharge period (gain duration) Tg described above, for example, several tens of nanoseconds. A repetition frequency Rp of the burst seed pulsed light BSP is set at a value for example, from 1 to 6,000 Hz. In the case where the repetition frequency Rp is 6,000 Hz, a repetition cycle Tpr of the burst seed pulsed light BSP is about 167 µs.

The configuration in which the burst seed pulsed light BSP enters the discharge space in the excimer amplifier 20 allows the discharge space to be filled with the burst seed pulsed light BSP during the discharge period. In this case, the timing at which the burst seed pulsed light BSP enters the discharge space needs to coincide with the timing at which the discharge occurs in the discharge space, as shown in FIG. 3. In FIG. 3, reference character WF represents the discharge waveform (gain waveform) produced per discharge.

Figure 4A:
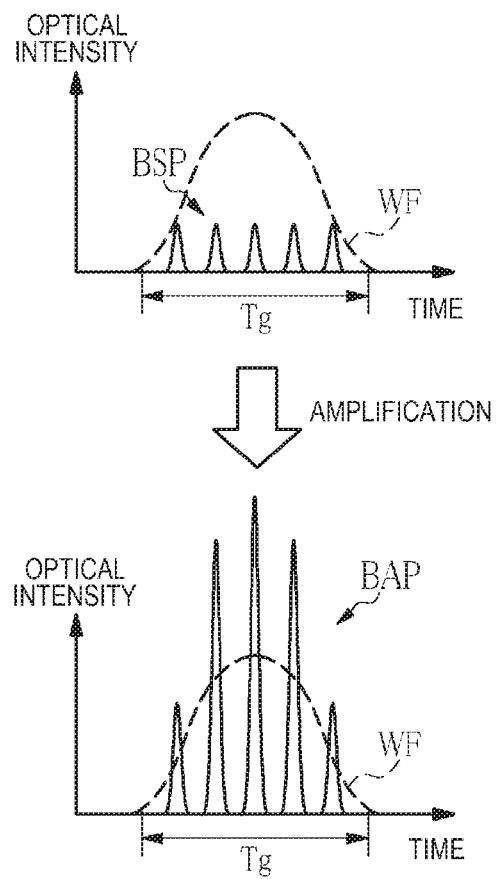
FIG. 4A is a descriptive diagram for describing proper timings of the burst seed pulsed light and the discharge.

In a case where the timing at which the burst seed pulsed light BSP enters the discharge space roughly coincides with the timing at which the discharge occurs in the discharge space, the amplification efficiency in the discharge space is improved, whereby occurrence of the spontaneously radiated amplified light decreases, as shown in FIG. 4A. Further, converting the seed light into burst pulses allows the peak intensity to lower, whereby the damage of the optical elements can be suppressed. In this case, as a result of the amplification of the burst seed pulsed light BSP in the discharge space, amplified burst pulsed light BAP outputted from the excimer amplifier 20 has maximized energy. The energy of the amplified burst pulsed light BAP is defined to be the sum of the pulse energy values of the pulses that form the amplified burst pulsed light BAP amplified in a single occurrence of discharge.

Figure 4B:
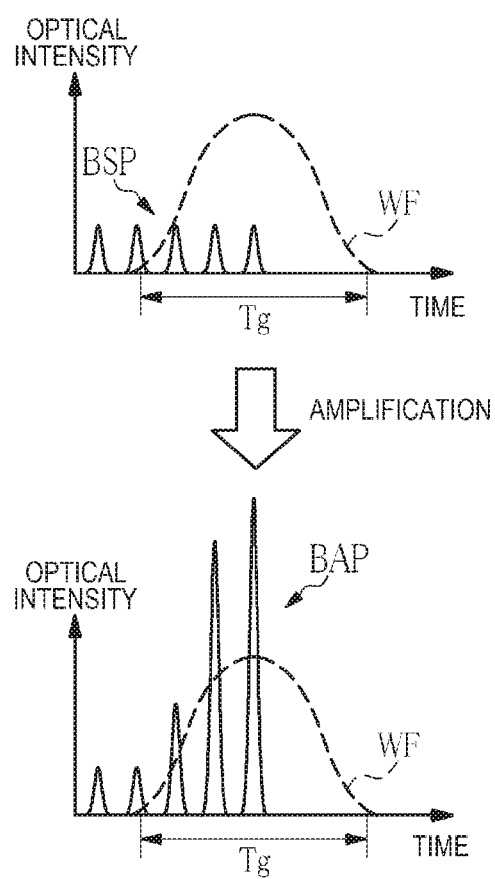
FIG. 4B is a descriptive diagram for describing improper timings of the burst seed pulsed light and the discharge.

In a case where the timing at which the burst seed pulsed light BSP enters the discharge space deviates from the timing at which the discharge occurs in the discharge space, however, only part of the pulses of the burst seed pulsed light BSP is amplified, but the other pulses are not amplified, and undesirable amplified burst pulsed light BAP is outputted from the excimer amplifier 20, as shown in FIG. 4B. In this case, the energy of the amplified burst pulsed light BAP is smaller than the energy in the case shown in FIG. 4A. Further, in this case, the occurrence of the spontaneously radiated amplified light increases.

As described above, even when the seed pulsed light that enters the discharge space is converted into burst pulses, deviation between the timing at which the burst seed pulsed light BSP enters the discharge space and the discharge timing causes the same problems as those in Comparative Example described above. It is desired to minimize the deviation to maximize the energy of the amplified burst pulsed light BAP.

2. First Embodiment

A laser apparatus according to a first embodiment of the present disclosure will next be described. In the following description of the laser apparatus according to the first embodiment, the same components as those of the laser apparatus 2 according to Comparative Example have the same reference characters and will not be described as appropriate.

2.1 Configuration

Figure 5:
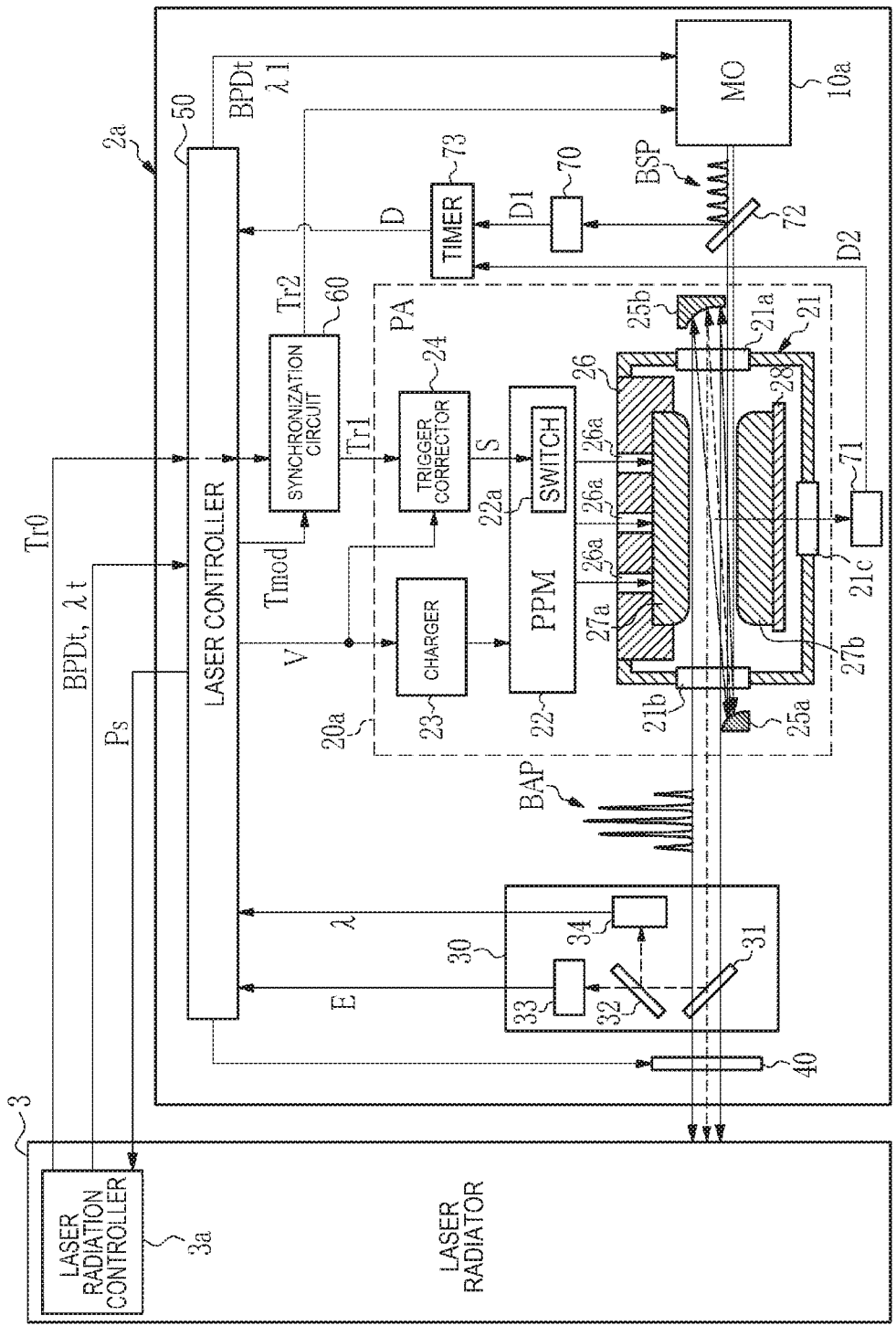
FIG. 5 schematically shows the configuration of a laser apparatus according to a first embodiment.
Figure 6:
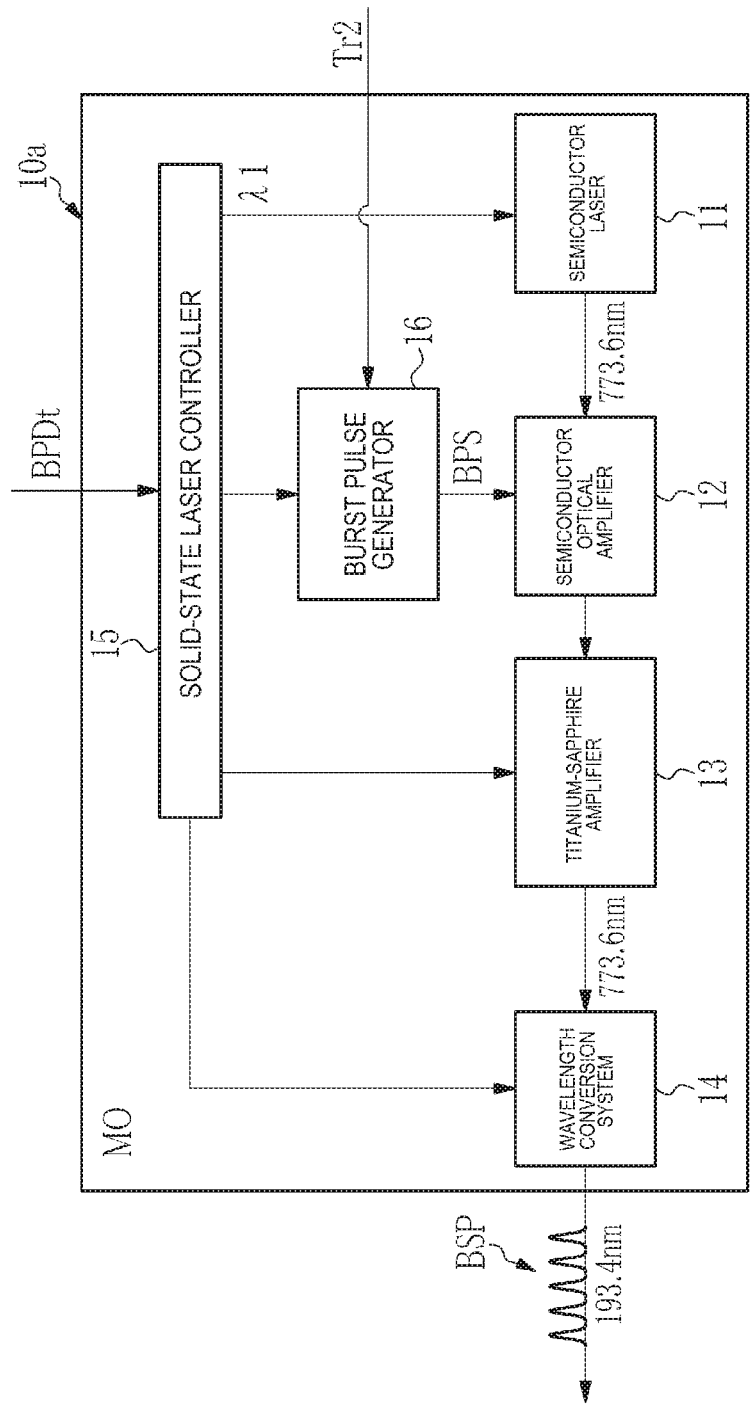
FIG. 6 is a block diagram showing the configuration of a solid-state laser apparatus according to the first embodiment.

FIGS. 5 and 6 schematically show the configuration of a laser apparatus 2a according to the first embodiment. The laser apparatus 2a according to the first embodiment includes a solid-state laser apparatus 10a as the MO, an excimer amplifier 20a as the PA, the monitor module 30, the shutter 40, the laser controller 50, and the synchronization circuit 60. The laser apparatus 2a further includes a first optical sensor 70, a second optical sensor 71, a beam splitter 72, and a timer 73.

In the first embodiment, as described later in detail, the solid-state laser apparatus 10a is configured to output the burst seed pulsed light BSP described above. The beam splitter 72 is disposed in the optical path of the burst seed pulsed light BSP between the solid-state laser apparatus 10a and the excimer amplifier 20a. The beam splitter 72 reflects part of the burst seed pulsed light BSP.

The first optical sensor 70 is, for example, a photodiode having sensitivity to ultraviolet light and receives the light reflected off the beam splitter 72. The first optical sensor 70, when it receives the reflected light, produces a first detection signal D1 and transmits the signal to the timer 73. That is, the first optical sensor 70 is a sensor that detects the timing at which the solid-state laser apparatus 10a outputs the burst seed pulsed light BSP. The burst seed pulsed light BSP having passed through the beam splitter 72 enters the discharge space in the excimer amplifier 20a, as in Comparative Example.

In the first embodiment, a discharge observation window 21c is formed in the laser chamber 21 provided in the excimer amplifier 20a. The second optical sensor 71 is disposed in a position where the light receiving surface thereof faces the discharge observation window 21c.

The second optical sensor 71 receives part of discharge light produced in the discharged space in the excimer amplifier 20a via the discharge observation window 21. The discharge light contains the ultraviolet laser light and visible light. The second optical sensor 71 is, for example, a sensor having sensitivity to ultraviolet or visible light and is formed of a photodiode or a photomultiplier tube. The second optical sensor 71, when it detects the discharge light, produces a second detection signal D2 and transmits the signal to the timer 73. That is, the second optical sensor 71 is a discharge sensor that detects the timing at which the discharge occurs in the discharge space.

The timer 73 measures the delay period from the time at which the timer 73 receives the first detection signal D1 from the first optical sensor 70 to the time at which the timer 73 receives the second detection signal Dw from the second optical sensor 71. The timer 73 inputs a measure delay period D to the laser controller 50. As described later in detail, the laser controller 50 corrects based on the measured delay period D the trigger delay period Tmod from the time at which the synchronization circuit 60 outputs the first internal trigger signal Tr1 to the time at which the synchronization circuit 60 outputs the second internal trigger signal Tr2. The correction of the trigger delay period Tmod corresponds to correction of the timing at which the solid-state laser apparatus 10a is caused to output the burst seed pulsed light BSP.

In the first embodiment, the solid-state laser apparatus 10a includes a burst pulse generator 16 in addition to the semiconductor laser 11, the semiconductor optical amplifier 12, the titanium-sapphire amplifier 13, the wavelength conversion system 14, and the solid-state laser controller 15, as shown in FIG. 6. As described later in detail, the burst pulse generator 16 generates burst pulse signals BPS in accordance with set data based on a target burst pulse data BPDt, which will be described later. The burst pulse generator 16 is formed, for example, of a programmable function generator.

The second internal trigger signal Tr2 described in Comparative Example is inputted from the synchronization circuit 60 to the burst pulse generator 16. The burst pulse generator 16 inputs the burst pulse signals BPS to the semiconductor optical amplifier 12 in response to the input of the second internal trigger signal Tr2. The burst pulse signals BPS are each a current control signal. The semiconductor optical amplifier 12 changes the amplification factor, the number of pulses, the pulse width, and the pulse interval in accordance with the inputted burst pulse signals BPS and produces seed pulsed light formed of burst pulses. The seed pulsed light is amplified by the titanium-sapphire amplifier 13, and the wavelength of the seed pulsed light is converted by the wavelength conversion system 14, as in Comparative Example. As a result, the solid-state laser apparatus 10a outputs the burst seed pulsed light BSP described above.

The excimer amplifier 20a has the same configuration as that of the excimer amplifier 20 according to Comparative Example except that the discharge observation window 21c described above is formed in the laser chamber 21. The excimer amplifier 20a produces discharge at the timing at which the burst seed pulsed light BSP enters the discharge space from the solid-state laser apparatus 10a. The excimer amplifier 20a amplifies the burst seed pulsed light BSP in a single occurrence of discharge and outputs the resultant light as the amplified burst pulsed light BAP.

The monitor module 30 has the same configuration as that in Comparative Example, that is, part of the amplified burst pulsed light BAP is sampled, and the energy of the amplified burst pulsed light BAP is measured with the energy sensor 33. In the present embodiment, the energy sensor 33 measures the sum of the energy values of a plurality of pulses contained in one flash of the amplified burst pulsed light BAP as the measured energy E.

The monitor module 30, specifically, the wavelength monitor 34 measures the wavelength of the amplified burst pulsed light BAP. The monitor module 30 transmits the measured energy E and the measured wavelength λ of the amplified burst pulsed light BAP to the laser controller 50.

The amplified burst pulsed light BAP having passed through the monitor module 30 is supplied to the laser radiator 3 via the shutter 40. In the present embodiment, the laser radiation controller 3a provided in the laser radiator 3 transmits the light emission trigger signal Tr0, the target wavelength λt, and the target burst pulse data BPDt to the laser controller 50. The laser controller 50 transmits the radiation permission signal Ps to the laser radiation controller 3a.

The target burst pulse data BPDt contains a variety of parameters that define a waveform of the amplified burst pulsed light BAP that is a waveform desired by the laser radiator 3. The target burst pulse data BPDt contains, for example, target burst pulse energy Et, a target frequency ft of the pulses contained in the amplified burst pulsed light BAP, a target pulse width Twf, and the number of pulses m. The number of pulses m only needs to be at least 2. In the present embodiment, the number of pulses m is set at The laser controller 50 compares the measured wavelength λ with the target wavelength λt and changes the wavelength data λ1 to be set in the semiconductor laser 11 in such a way that the measured wavelength λ approaches the target wavelength λt. The laser controller 50 further compares the measured burst pulse energy with the target burst pulse energy Et and changes the charging voltage V to be set in the charger 23 in such a way that the measured pulse energy E approaches the target burst pulse energy Et.

2.2 Definitions

2.2.1 Waveform of Amplified Burst Pulsed Light

Figure 7:
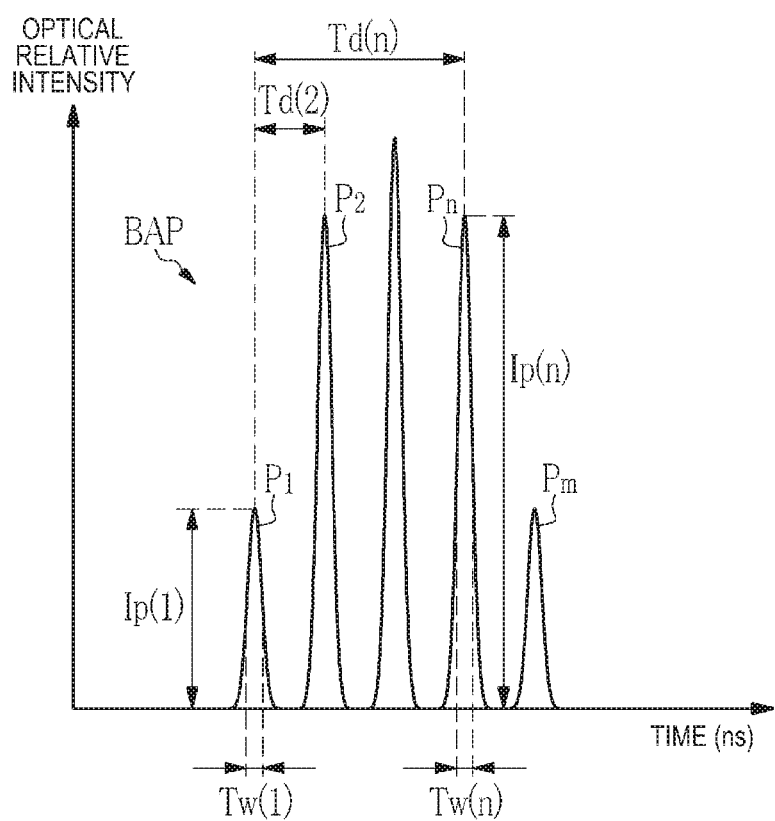
FIG. 7 shows a variety of parameters that define the waveform of amplified burst pulsed light.

FIG. 7 shows the variety of parameters that define the waveform of the amplified burst pulsed light BAP. The amplified burst pulsed light BAP contains m pulses $P_1$ to $P_m$. Assume that the n-th pulse $P_n$ has a peak intensity Ip(n), and let Tw(n) be the pulse width of the n-th pulse $P_n$. The pulse width Tw(n) is, for example, the full width at half maximum. Let Td(n) be the pulse interval from the first pulse $P_1$ to the n-th pulse $P_n$. These parameters correspond to the parameters contained in the target burst pulse data BPDt.

2.2.2 Waveform of Burst Pulse Signal

Figure 8:
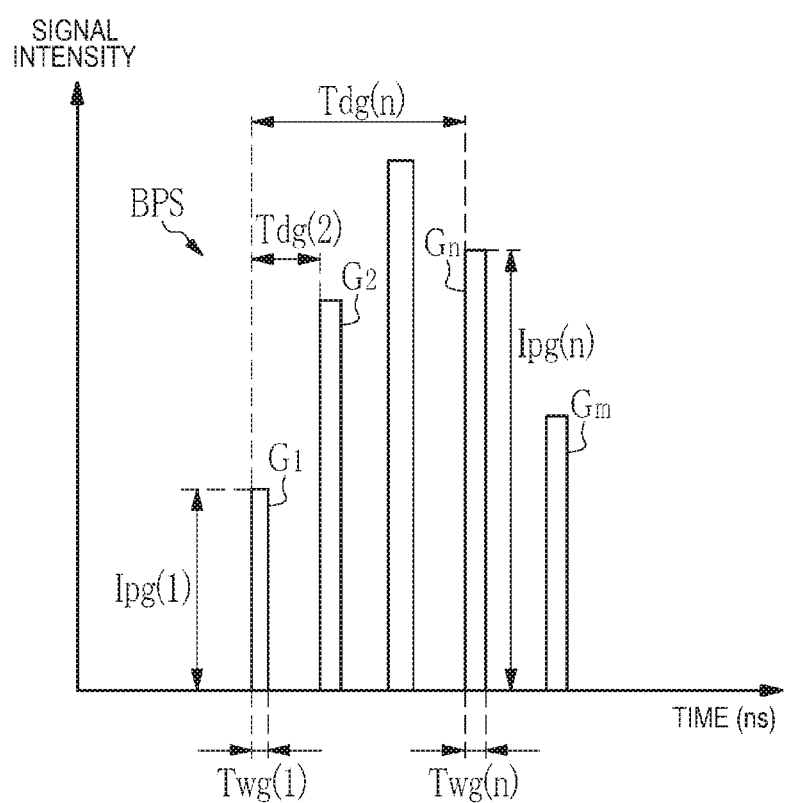
FIG. 8 shows a variety of parameters that define the waveform of a burst pulse signal.

FIG. 8 shows the variety of parameters that define the waveform of the burst pulse signals BPS produced by the burst pulse generator 16 provided in the solid-state laser apparatus 10a. The burst pulse signals BPS contain m pulse signals $G_1$ to $G_m$ in correspondence with the amplified burst pulsed light BAP. Assume that the n-th pulse signal $G_n$ has a signal intensity Ipg(n), and let Twg(n) be the pulse width of the n-th pulse signal $G_n$. Let Tdg(n) be the pulse interval from the first pulse signal $G_1$ to the n-th pulse signal $G_n$. The pulse signal $G_n$ has a roughly rectangular shape. The values of the parameters are calculated by the laser controller 50 based on the target burst pulse data BPDt.

2.3 Operation

2.3.1 Basic Operation Timings

Figure 9:
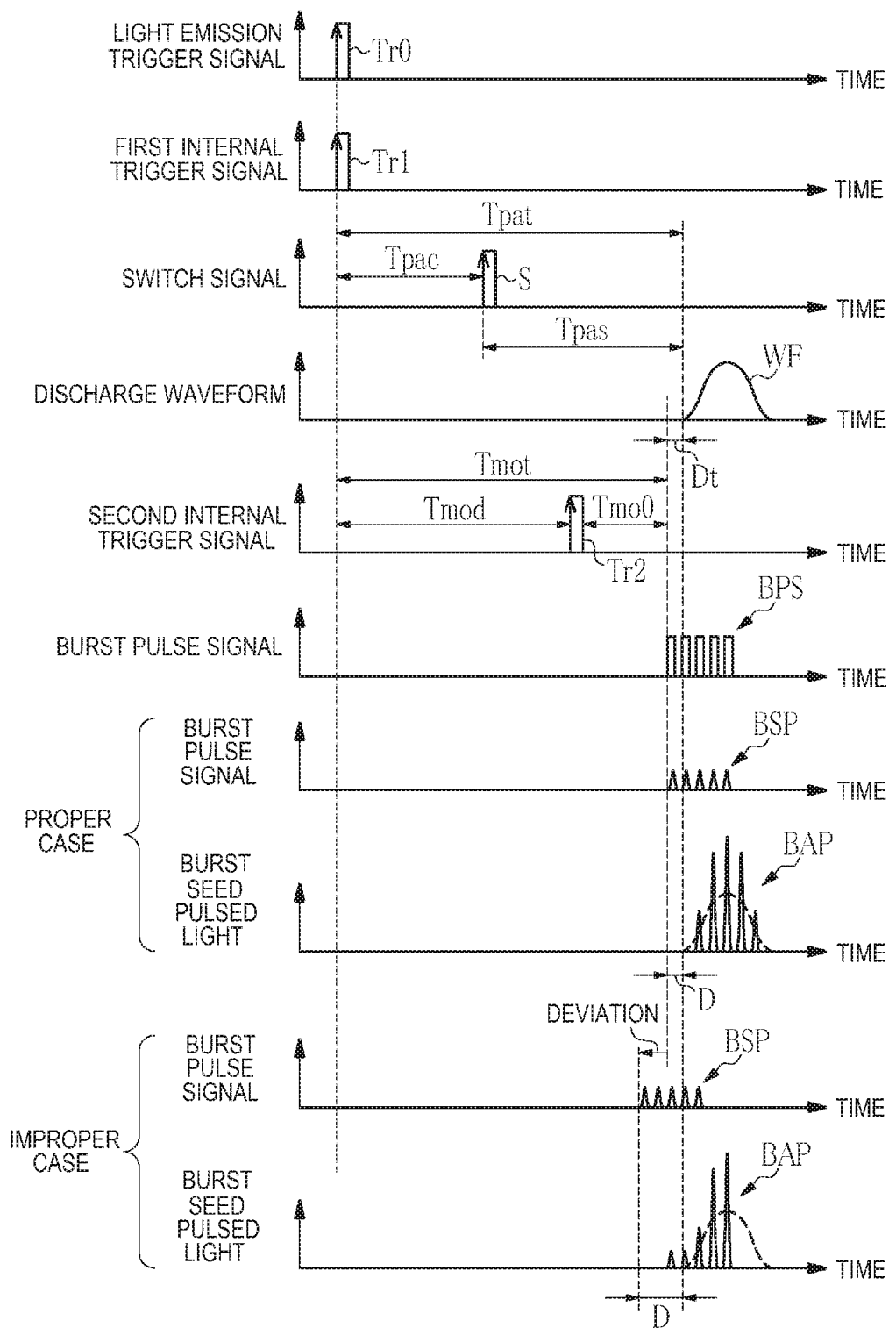
FIG. 9 is a timing chart showing the timings of operations performed by the laser apparatus according to the first embodiment.

FIG. 9 shows basic operation timings in the laser oscillation operation performed by the laser apparatus 2a according to the first embodiment. The synchronization circuit 60 first receives the light emission trigger signal Tr0 from the laser radiation controller 3a via the laser controller 50. The synchronization circuit 60 produces the first internal trigger signal Tr1 roughly simultaneously with the reception of the light emission trigger signal Tr0 and outputs the first internal trigger signal Tr1 to the trigger corrector 24.

In the present specification, the laser oscillation operation performed by the laser apparatus 2a includes in some cases causing the solid-state laser apparatus 10a to perform laser oscillation and causing discharge to occur in the excimer amplifier 20a in synchronization with the burst seed pulsed light BSP outputted from the solid-state laser apparatus 10a.

The trigger corrector 24 corrects the period Tpac described above based on a set value of the charging voltage V, produces the switch signal S after the first internal trigger signal Tr1 is inputted and then the period Tpac elapses, and inputs the switch signal S to the switch 22a. When the switch 22a is turned on by the switch signal S, the discharge starts in the discharge space after the period Tpas elapses. The second optical sensor 72 detects the discharge start timing. The trigger corrector 24 corrects the period Tpac to keep the period Tpat constant.

The synchronization circuit 60 produces the second internal trigger signal Tr2 after it outputs the first internal trigger signal Tr1 and then the trigger delay period Tmod elapses and outputs the second internal trigger signal Tr2 to the burst pulse generator 16. The burst pulse generator 16, when the second internal trigger signal Tr2 is inputted thereto, inputs the burst pulse signals BPS to the semiconductor optical amplifier 12 after a fixed period Tmo0 elapses.

The semiconductor optical amplifier 12 produces seed pulsed light formed of burst pulses in response to the input of the burst pulse signals BPS. As a result of the amplification performed on the seed pulsed light by the titanium-sapphire amplifier 13 and the wavelength conversion performed on the seed pulsed light by the wavelength conversion system 14, the solid-state laser apparatus 10a outputs the burst seed pulsed light BSP. The first optical sensor 71 detects the timing at which the burst seed pulsed light BSP is outputted.

The burst seed pulsed light BSP outputted from the solid-state laser apparatus 10a enters the discharge space in the excimer amplifier 20a. In the discharge space, the discharge described above occurs roughly simultaneously with the incidence of the burst seed pulsed light BSP and amplifies the burst seed pulsed light BSP. The amplified burst seed pulsed light BSP is outputted as the amplified burst pulsed light BAP from the excimer amplifier 20a.

2.3.2 Correction of Trigger Delay Period

The timing at which the solid-state laser apparatus 10a outputs the burst seed pulsed light BSP is adjusted by the trigger delay period Tmod. The trigger delay period Tmod is so set that the period from the time at which the solid-state laser apparatus 10a outputs the burst seed pulsed light BSP to the time at which the burst seed pulsed light BSP enters the discharge space coincides with a target delay period Dt. The target delay period Dt is a period required to cause the discharge start after the solid-state laser apparatus 10a outputs the burst seed pulsed light BSP.

In a case where the burst seed pulsed light BSP is outputted at a proper timing, the timing at which the burst seed pulsed light BSP enters the discharge space roughly coincides with the timing at which the discharge occurs in the discharge space, resulting in high efficiency of the amplification of the burst seed pulsed light BSP. In this case, the delay period D measured with the timer 73 roughly coincides with the target delay period Dt.

However, in a case where the timing at which the burst seed pulsed light BSP is outputted is shifted due to some cause and the output timing is therefore improper, the timing at which the burst seed pulsed light BSP enters the discharge space deviates from the timing at which the discharge occurs in the discharge space, resulting in a decrease in the efficiency of the amplification of the burst seed pulsed light BSP. In this case, the measured delay period D differs from the target delay period Dt.

Figure 10:
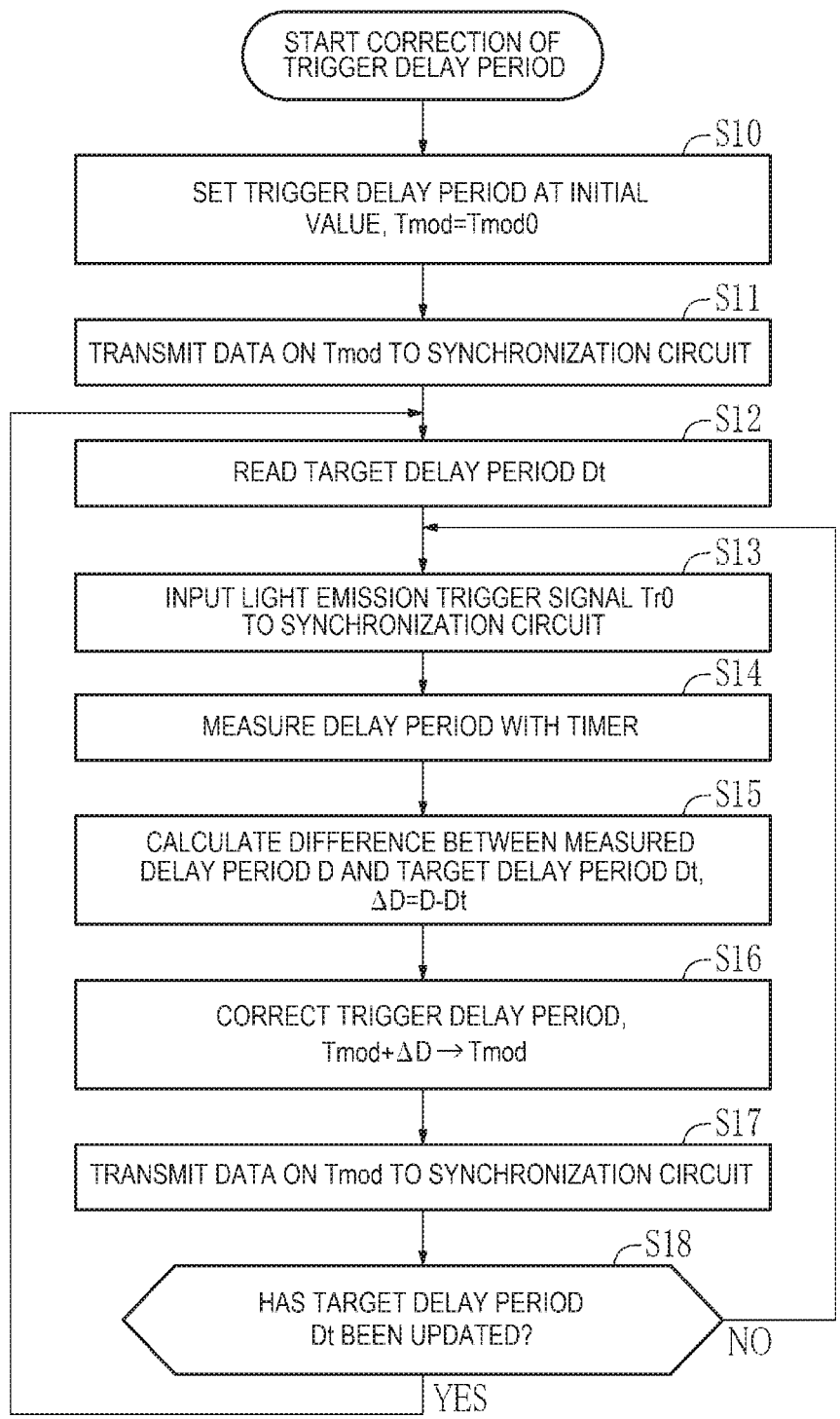
FIG. 10 is a flowchart for describing the operation of correcting a trigger delay period.

FIG. 10 is a flowchart for describing the operation of correcting the trigger delay period Tmod to cause the measured delay period D to approach the target delay period Dt. The correction operation is performed during the laser oscillation operation. The correction operation will be described below.

The operation of correcting the trigger delay period Tmod is performed by the laser radiation controller 3a with the shutter 49 being open. The laser controller 50 first sets the trigger delay period Tmod at an initial value Tmod0 (step S10). The laser controller 50 then transmits data on the trigger delay period Tmod to the synchronization circuit 60 (step S11). The laser controller 50 then reads the target delay period Dt (step S12).

The laser controller 50 then produces the light emission trigger signal Tr0 and inputs the signal to the synchronization circuit 60 (step S13). In this process, the laser controller 50 receives no light emission trigger signal Tr0 from the laser radiation controller 3a but produces the light emission trigger signal Tr0 by itself and inputs the signal to the synchronization circuit 60. The synchronization circuit 60, when the light emission trigger signal Tr0 is inputted thereto, outputs the first internal trigger signal Tr1 and outputs the second internal trigger signal Tr2 after the first internal trigger signal Tr1 is outputted and then the trigger delay period Tmod elapses. Thus, the solid-state laser apparatus 10a outputs the burst seed pulsed light BSP, and the excimer amplifier 20a produces discharge.

The first detection signal D1 is inputted to the timer 73 from the first optical sensor 70, which detects the timing at which the burst seed pulsed light BSP is outputted, and the second detection signal D2 is further inputted to the timer 73 from the second optical sensor 71, which detects the discharge timing. The timer 73 measures the delay period based on the first detection signal D1 and the second detection signal D2 and outputs a measured delay period D to the laser controller 50 (step S14).

The laser controller 50 calculates a difference ΔD between the measured delay period D and the target delay period Dt based on the following Expression (3) (step S15):

$$\Delta D = D - Dt \quad (3)$$

Having calculated the difference ΔD, the laser controller 50 corrects the trigger delay period Tmod (step S16). Specifically, the trigger delay period Tmod to which the difference ΔD is added is newly set as the trigger delay period Tmod. A proper relationship between the trigger delay period Tmod and the target delay period Dt is thus achieved. The laser controller 50 transmits data on the corrected trigger delay period Tmod to the synchronization circuit 60 (step S17).

The laser controller 50 then evaluates whether or not the target delay period Dt has been updated (step S18). The update of the target delay period Dt is performed during oscillation control described later. In a case where the target delay period Dt has not been updated (NO in step S18), the laser controller 50 returns to the process in step S13. In a case where the target delay period Dt has been updated (YES in step S18), the laser controller 50 returns to the process in step S12.

2.3.3 Oscillation Control

Figure 11A:
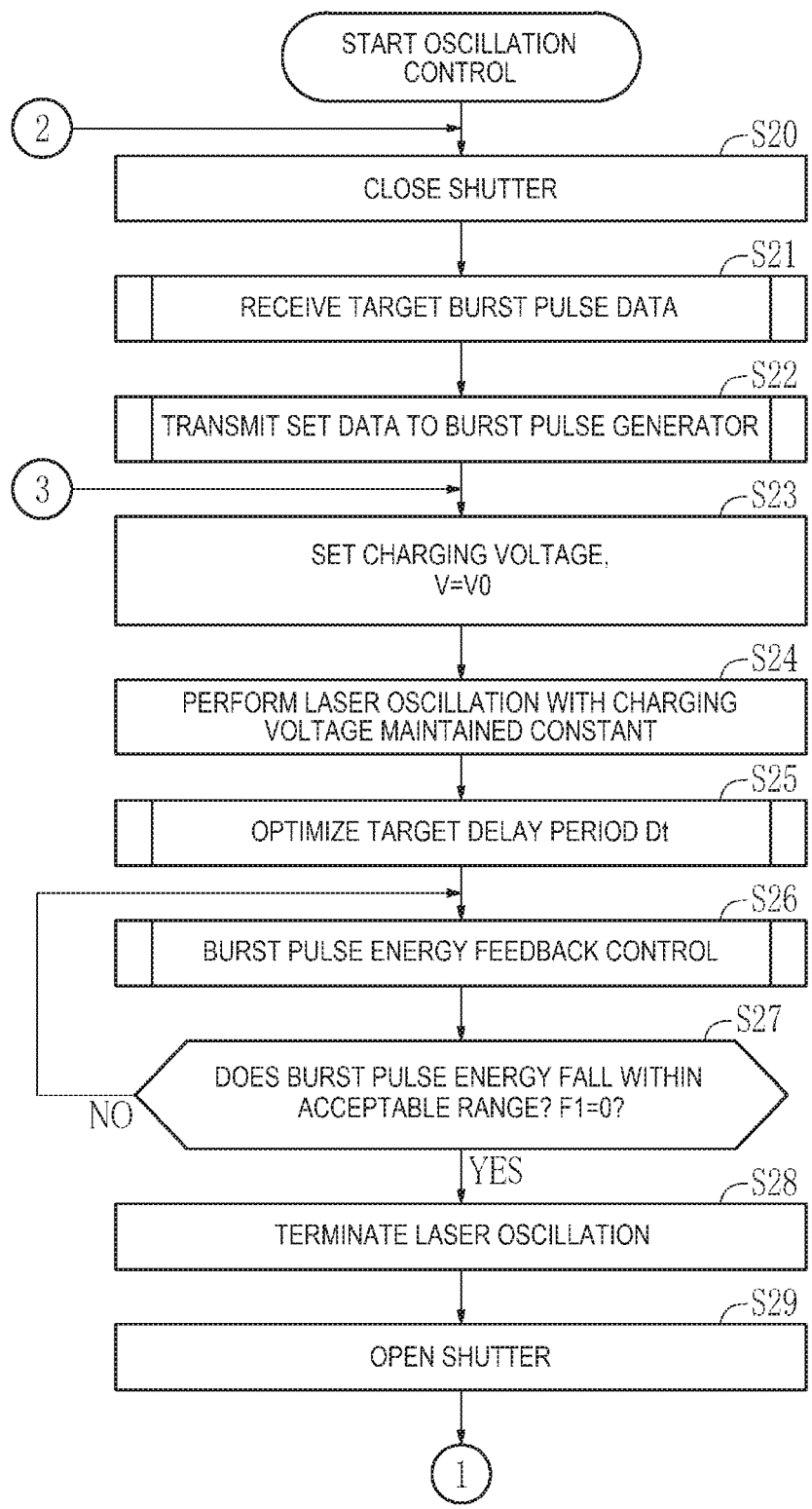
FIG. 11A is a flowchart for describing oscillation preparation operation.
Figure 11B:
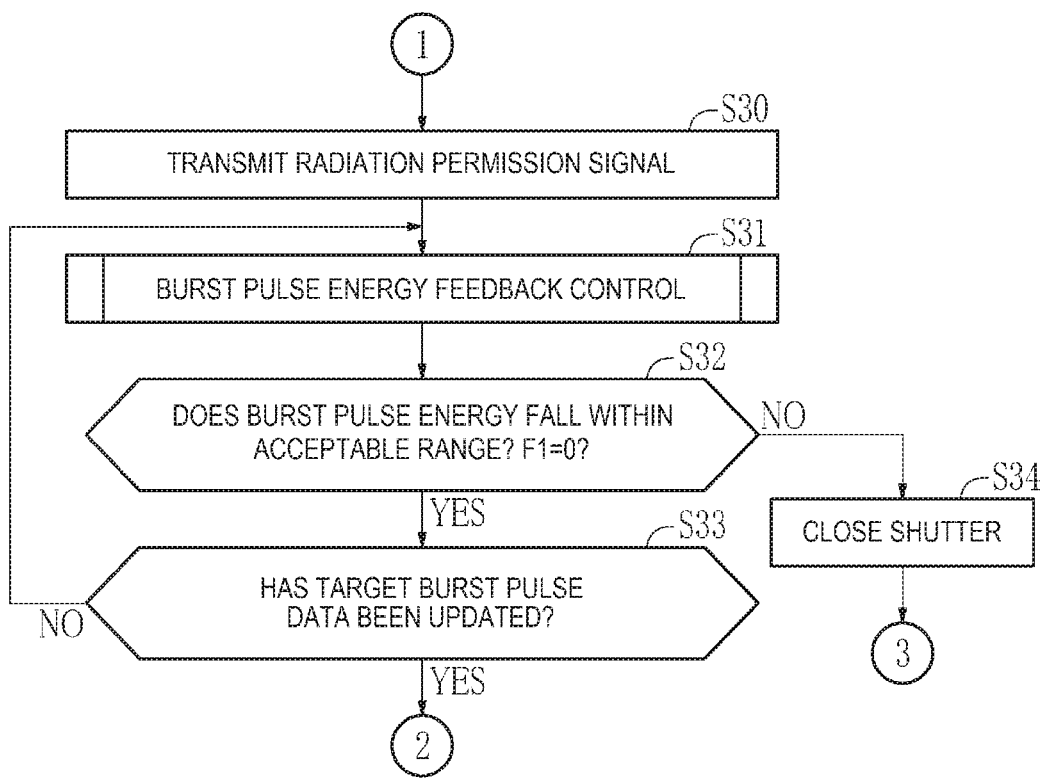
FIG. 11B is a flowchart for describing main oscillation operation.

FIGS. 11A and 11B are flowcharts showing an oscillation control procedure in actual operation of the laser apparatus 2a. FIG. 11A shows a portion corresponding to oscillation preparation operation performed before main oscillation operation. FIG. 11B shows a portion corresponding to the main oscillation operation.

Figure 12:
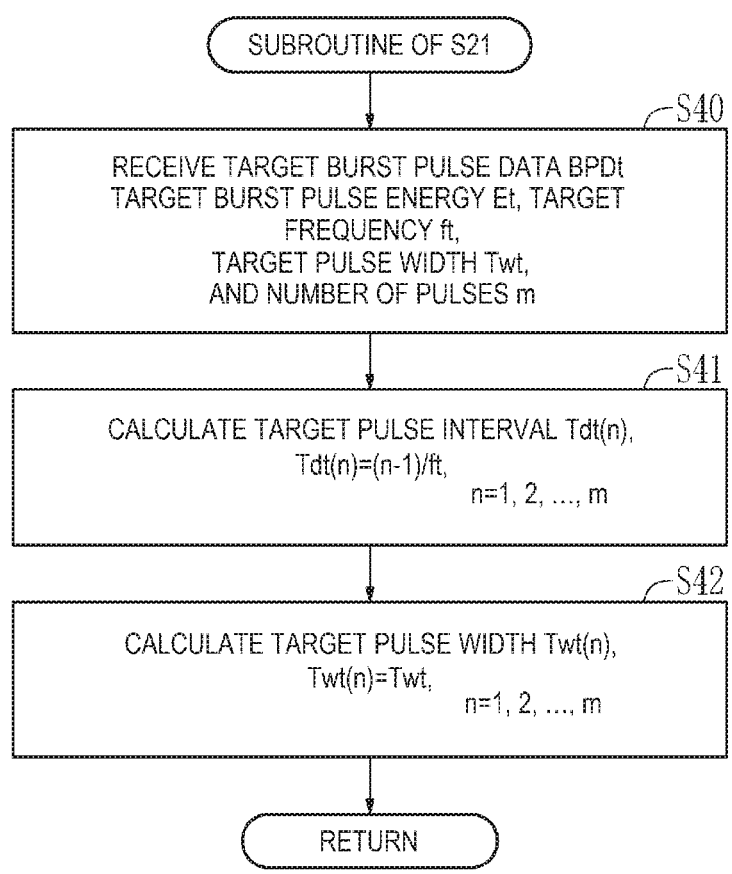
FIG. 12 is a flowchart for describing processes carried out when target burst pulse data is received.

The oscillation control performed by the laser apparatus 2a will be described below. The laser controller 50 first closes the shutter 40 (step S20). The laser controller 50 then receives the target burst pulse data BPDt from the laser radiation controller 3a (step S21). In step S21, the laser controller 50 carries out the processes shown in the flowchart of FIG. 12. The laser controller 50 acquires the target burst pulse energy Et, the target frequency ft, the target pulse width Twf, and the number of pulses m from the received target burst pulse data BPDt (step S40).

The laser controller 50 then uses the target frequency ft to calculate a target pulse interval Tdt(n) based on the following Expression (4) (step S41):

$$Tdt(n) = (n-1)/ft \quad (4)$$

where n=1, 2, ..., m.

The laser controller 50 then uses the target pulse width Twf to calculate a target pulse width Twt(n) based on the following Expression (5) (step S42):

$$Twt(n) = Twf \quad (5)$$

That is, in the present embodiment, the laser controller 50 keeps the target pulse width Twt(n) being the fixed value Twf.

Figure 13:
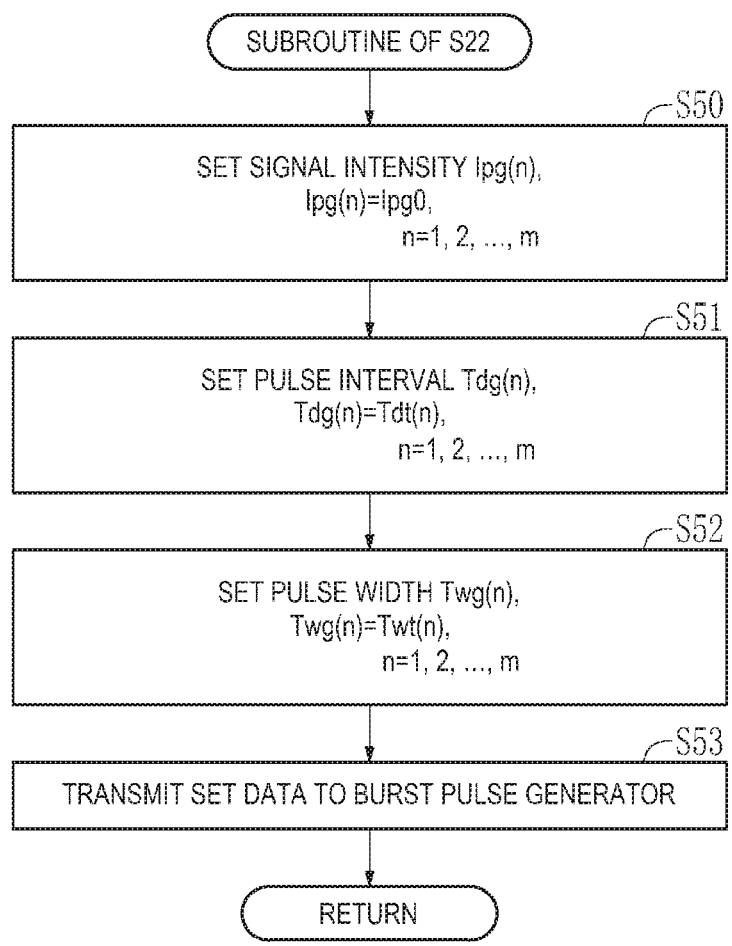
FIG. 13 is a flowchart for describing processes carried out when set data is transmitted to a burst pulse generator.

Referring back to FIG. 11A, the laser controller 50 transmits set data to the burst pulse generator 16 (step S22). In step S22, the laser controller 50 carries out the processes shown in the flowchart of FIG. 13. The set data contains the signal intensity Ipg(n), the pulse interval Tdg(n), and the number of pulses m.

The laser controller 50 first sets the signal intensity Ipg(n), as indicated by the following Expression (6) (step S50):

$$Ipg(n) = Ipg0 \quad (6)$$

That is, the signal intensity Ipg(n) is set at a constant Ipg0. The constant Ipg0 is determined, for example, by the target burst pulse energy Et.

The laser controller 50 then sets the pulse interval Tdg(n), as indicated by the following Expression (7) (step S51):

$$Tdg(n) = Tdt(n) \quad (7)$$

That is, the pulse interval Tdg(n) is set at the target pulse interval Tdt(n).

The laser controller 50 sets the pulse width Twg(n), as indicated by the following Expression (8) (step S52):

$$Twg(n) = Twt(n) \quad (8)$$

That is, the pulse width Twg(n) is set at the target pulse width Twt(n).

The laser controller 50 transmits the set data containing the signal intensity Ipg(n), the pulse interval Tdg(n), and the pulse width Twg(n) set in steps S50 to S52 to the burst pulse generator 16 (step S53).

Referring back to FIG. 11A, the laser controller 50 sets the charging voltage V to be set in the charger 23 at a constant V0 (step S23) and causes the solid-state laser apparatus 10a and the excimer amplifier 20a to perform the laser oscillation operation with the charging voltage V maintained constant (step S24). Specifically, the laser controller 50 receives no light emission trigger signal Tr0 from the laser radiation controller 3a but produces the light emission trigger signal Tr0 by itself and inputs the signal to the synchronization circuit 60. The light emission trigger signal Tr0 is inputted to the synchronization circuit 60 at a predetermined repetition frequency Rp. The solid-state laser apparatus 10a and the excimer amplifier 20a perform the laser oscillation operation described above in synchronization with the light emission trigger signal Tr0.

Figure 14:
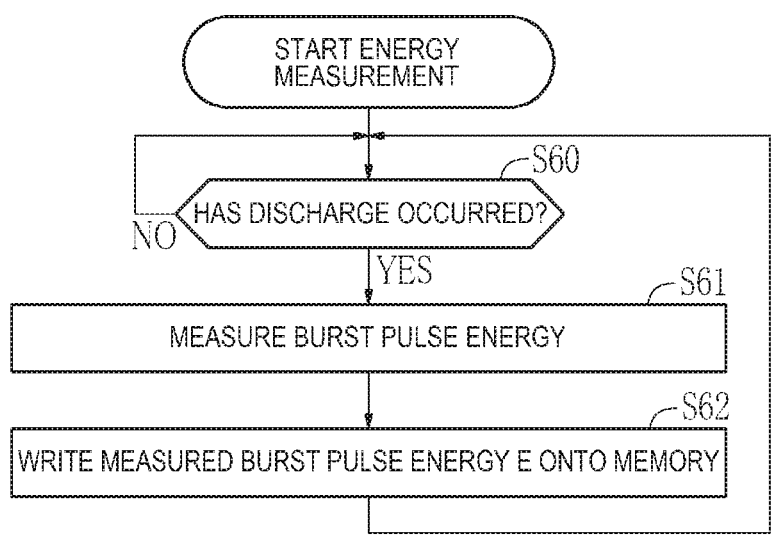
FIG. 14 is a flowchart for describing the operation of measuring burst pulse energy.

The energy sensor 33 measures the burst pulse energy in synchronization with the laser oscillation operation, as shown in the flowchart of FIG. 14. The energy sensor 33 detects incidence of the amplified burst pulsed light BAP to detect whether or not the discharge has occurred in the excimer amplifier 20a (step S60). The energy sensor 33, when it detects the discharge (YES in step S60), measures the burst pulse energy (step S61). The laser controller 50 receives the measured burst pulse energy E from the energy sensor 33 and writes the received burst pulse energy E onto a memory that is not shown (step S62). Thereafter, the processes in steps S61 and S62 are carried out whenever the discharge occurs.

Figure 15:
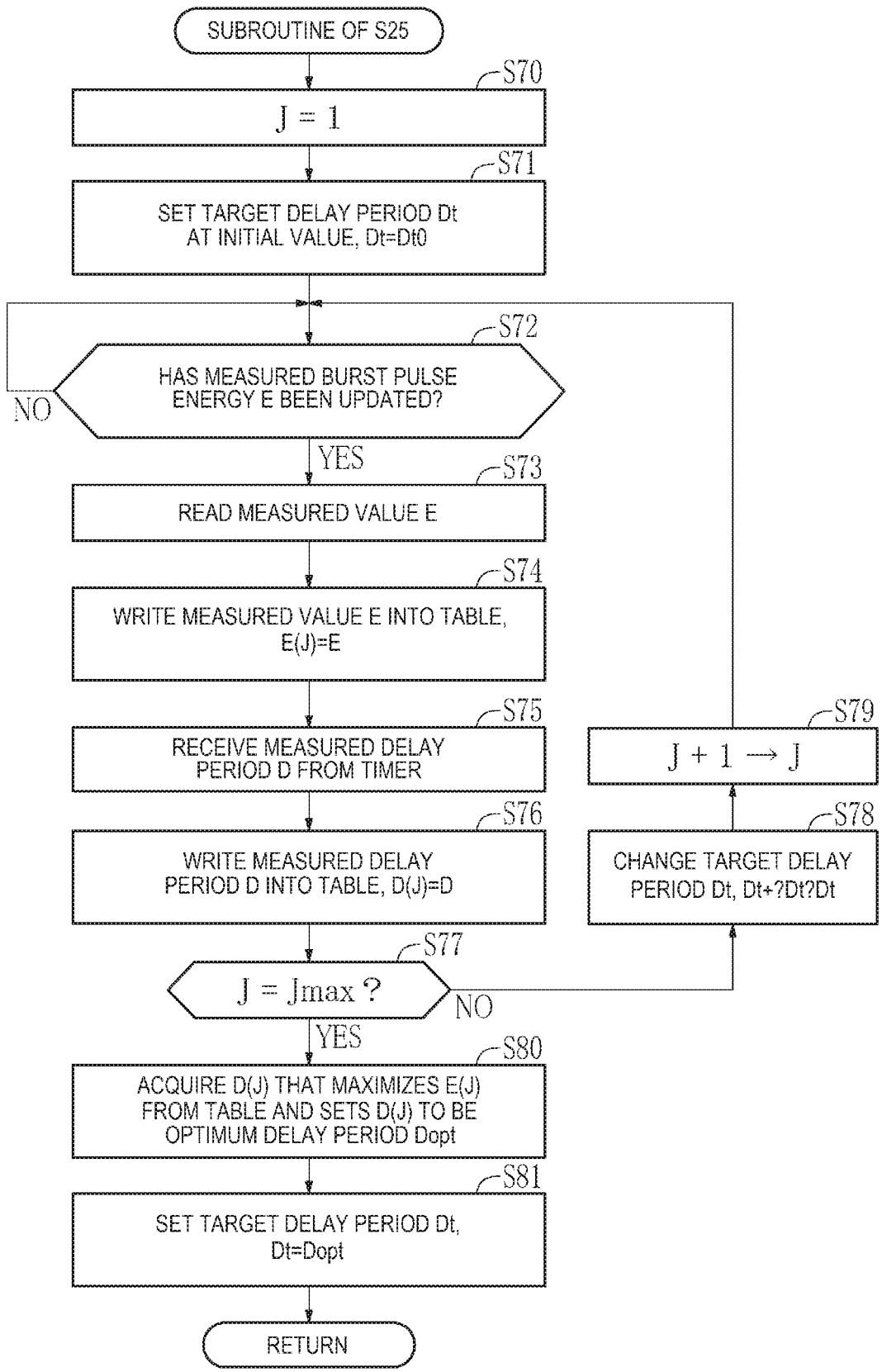
FIG. 15 is a flowchart for describing optimization of a target delay period.

Referring back to FIG. 11A, the laser controller 50 optimizes the target delay period Dt described above during the laser oscillation operation (step S25). In step S25, the laser controller 50 carries out the processes shown in the flowchart of FIG. 15. The laser controller 50 first sets the value of a counter J at "1" (step S70) and sets the target delay period Dt at an initial value Dt0 (step S71). The initial value Dt0 is a value corresponding to the initial value Tmod0 of the trigger delay period Tmod described above. The laser controller 50 sets the initial value Tmod0 as the trigger delay period Tmod in the synchronization circuit 60.

The laser controller 50 evaluates whether or not the energy sensor 33 has measured the burst pulse energy and the measured value E stored in the memory has been updated (step S72). In a case where the measured value E has been updated (YES in step S72), the laser controller 50 reads the measured value E from the memory (steps S73) and writes the measured value E into a table T1 shown in FIG. 16 with the measured value E related to the value of the counter J (step S74). In FIG. 16, E(J) represents the measured value E corresponding to the value of the counter J.

The laser controller 50 receives the measured delay period D from the timer 73 (step S75) and writes the received measured delay period D into the table T1 with the measured delay period D related to the value of the counter J (step S76). In FIG. 16, D(J) represents the measured delay period D corresponding to the value of the counter J.

The laser controller 50 evaluates whether or not the counter J indicates a maximum Jmax (step S77). In a case where the counter J does not indicate the maximum Jmax (NO in step S77), the laser controller 50 sets the current target delay period Dt to which a fixed period ΔDt is added as the target delay period Dt (step S78). In this process, the laser controller 50 sets the trigger delay period Tmod from which the fixed period ΔDt is subtracted as the trigger delay period Tmod in the synchronization circuit 60. The laser controller 50 then increments the current value of the counter J by 1 (step S79) and returns to step S72.

The processes in steps S72 to S79 are repeatedly carried out until the value of the counter J reaches the maximum Jmax. When the value of the counter J reaches the maximum Jmax (YES in step S77), the laser controller 50 acquires D(J) that maximizes E(J) from the table T1 and sets the acquired D(J) to be an optimum delay period Dopt (step S80). The laser controller 50 then sets the target delay period Dt to be the optical delay period Dopt (step S81). In this process, the laser controller 50 sets the trigger delay period Tmod corresponding to the optimum delay period Dopt in the synchronization circuit 60.

Figure 17:
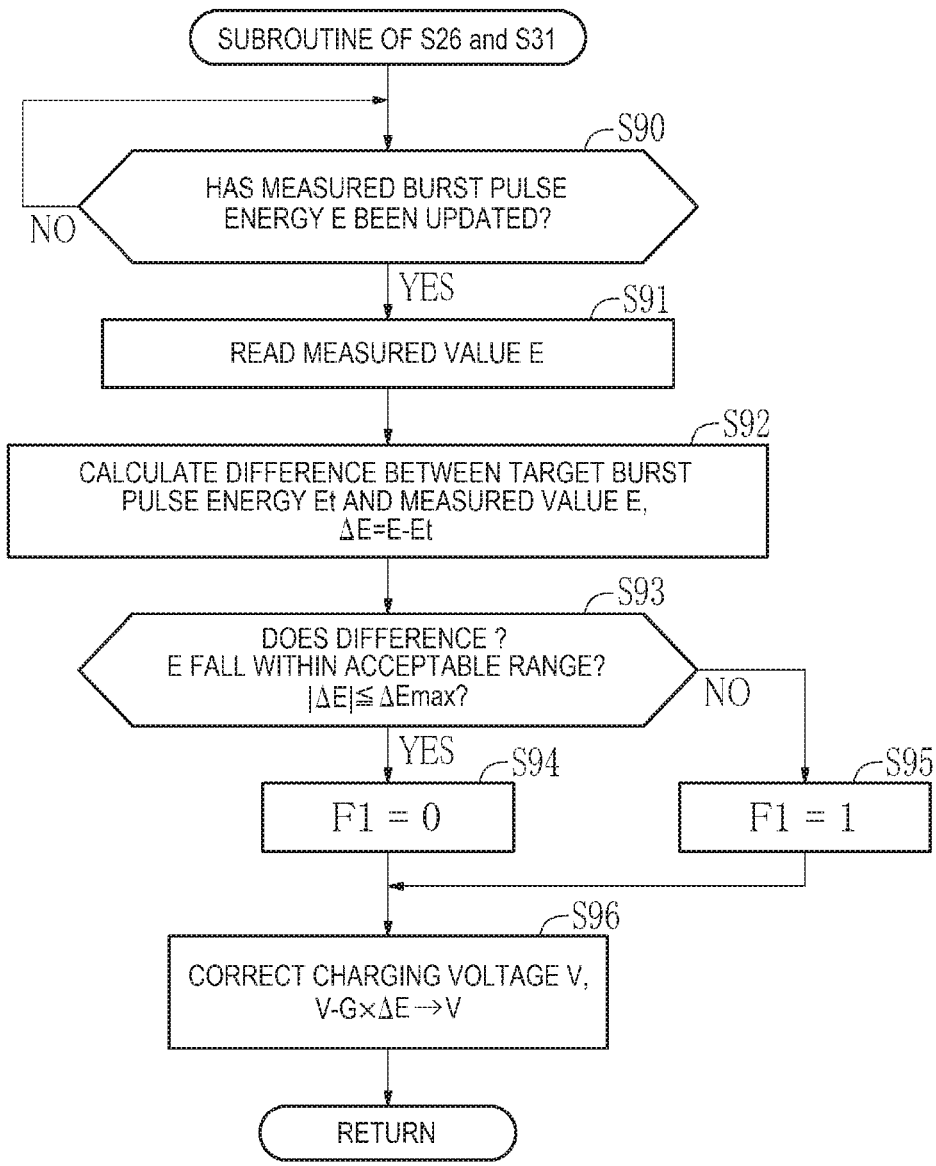
FIG. 17 is a flowchart for describing energy feedback control.

Referring back to FIG. 11A, the laser controller 50 performs burst pulse energy feedback control (energy feedback control) (step S26). In step S26, the laser controller 50 carries out the processes shown in the flowchart of FIG. 17. The laser controller 50 evaluates whether or not the energy sensor 33 has measured the burst pulse energy and the measured value E stored in the memory has been update (step S90). In a case where the measured value E has been updated (YES in step S90), the laser controller 50 reads the measured value E from the memory (step S91).

The laser controller 50 calculates the difference ΔE between the measured burst pulse energy E and the target burst pulse energy Et based on the following Expression (9):

$$\Delta E = E - Et \tag{9}$$

The laser controller 50 then evaluates whether or not the difference ΔE falls within an acceptable range expressed by the following Expression (10) (step S93):

$$|\Delta E| \leq \Delta E\max \tag{10}$$

In a case where the difference ΔE falls within the acceptable range (YES in step S93), the laser controller 50 sets a flag F1 at "0" (step S94). On the other hand, in a case where the difference ΔE does not fall within the acceptable range (NO in step S93), the laser controller 50 sets the flag F1 at "1" (step S95). The laser controller 50 then corrects the charging voltage V based on the difference ΔE (step S96). Specifically, the laser controller 50 multiplies the difference ΔE by a predetermined gain G, subtracts the result of the multiplication from the currently set charging voltage V, and newly sets the result of the subtraction to be the charging voltage V.

Referring back to FIG. 11A, the laser controller 50 evaluates whether or not the flag F1 is "0" (step S27). In a case where the flag F1 is not "0" (NO in step S27), the laser controller 50 returns to step S26 and performs the burst pulse energy feedback control again. On the other hand, in a case where the flag F1 is "0" (YES in step S27), the laser controller 50 causes the solid-state laser apparatus 10a and the excimer amplifier 20a to terminate the laser oscillation operation (step S28) and opens the shutter 40 (step S29). The laser oscillation preparation operation thus ends.

Referring next to FIG. 11B, the laser controller 50 transmits the radiation permission signal Ps to the laser radiation controller 3a (step S30). The laser controller 50, when it receives the light emission trigger signal Tr0 from the laser radiation controller 3a, inputs the received light emission trigger signal Tr0 to the synchronization circuit 60 to cause the solid-state laser apparatus 10a and the excimer amplifier 20a to perform the laser oscillation operation. The light emission trigger signal Tr0 is transmitted from the laser radiation controller 3a to the laser controller 50 at the repetition frequency Rp.

The laser controller 50 performs the burst pulse energy feedback control (step S31). Step S31 is the same as step S26 and will therefore not be described. The laser controller 50 evaluates whether or not the flag F1 is "0" (step S32). In the case where the flag F1 is not "0" (NO in step S32), the laser controller 50 closes the shutter 40 (step S34) and returns to the process in step S23, where the oscillation preparation operation is performed.

In the case where the flag F1 is "0" (YES in step S32), the laser controller 50 evaluates whether or not the target burst pulse data BPDt received from the laser radiation controller 3a has been updated (step S33). In a case where the target burst pulse data BPDt has not been updated (NO in step S33), the laser controller 50 returns to step S31 and performs the burst pulse energy feedback control again. On the other hand, in a case where the target burst pulse data BPDt has been updated (YES in step S33), the laser controller 50 returns to the process in step S20, where the oscillation preparation operation is performed.

Although not described in the above operation, the laser controller 50 acquires the wavelength λ measured by the wavelength monitor 34 and controls the wavelength of the light from the semiconductor laser 11 based on the measured wavelength λ and the target wavelength λt as appropriate.

2.4 Effects

In the first embodiment, the trigger delay period Tmod based on the value D measured by the timer 73 is corrected, and the target delay period Dt is made proper based on the measured burst pulse energy E. The operation of making the target delay period Dt proper is operation of detecting the optimum delay period Dopt, which maximizes the measured value E. Therefore, according to the first embodiment, the deviation between the timing at which the burst seed pulsed light BSP enters the discharge space and the discharge timing is minimized, whereby the burst pulse energy is maximized. Further, the first embodiment provides the effect of stabilizing the efficiency of the amplification of the burst seed pulsed light BSP in the discharge space, whereby the burst pulse energy is stabilized.

In the first embodiment, the wavelength monitor 34 measures the wavelength of the amplified burst pulsed light BAP. In a case where no precise wavelength control is required, the wavelength monitor 34 may be omitted.

In the first embodiment, to detect the timing at which the solid-state laser apparatus 10a outputs the burst seed pulsed light BSP, the first optical sensor 70 and the beam splitter 72 are provided, but they can also be omitted. The reason for this is that the jitter of the timing at which the burst seed pulsed light BSP is outputted is small with respect to the input of the second internal trigger signal Tr2 in the solid-state laser apparatus 10a. The first optical sensor 70 or the beam splitter 72 may not be disposed, but the laser controller 50 may transmit the second internal trigger signal Tr2 to the timer 73. In this case, the timer 73 measures as the measured value D described above the delay period from the time at which the timer 73 receives the second internal trigger signal Tr2 from the laser controller 50 to the time at which the timer 73 receives the second detection signal D2 from the second optical sensor 71.

In the first embodiment, the second optical sensor 71 detects the discharge timing. Instead, no second optical sensor 71 may be provided, and the energy sensor 33 may calculate the discharge timing.

3. Second Embodiment

A laser apparatus according to a second embodiment of the present disclosure will next be described. The laser apparatus according to the second embodiment has the function of controlling the waveform of the amplified burst pulsed light BAP to be supplied to the laser radiator 3 in addition to the function of the laser apparatus according to the first embodiment. In the following description, the same components as those of the laser apparatus 2a according to the first embodiment have the same reference characters and will not be described as appropriate.

3.1 Configuration

Figure 18:
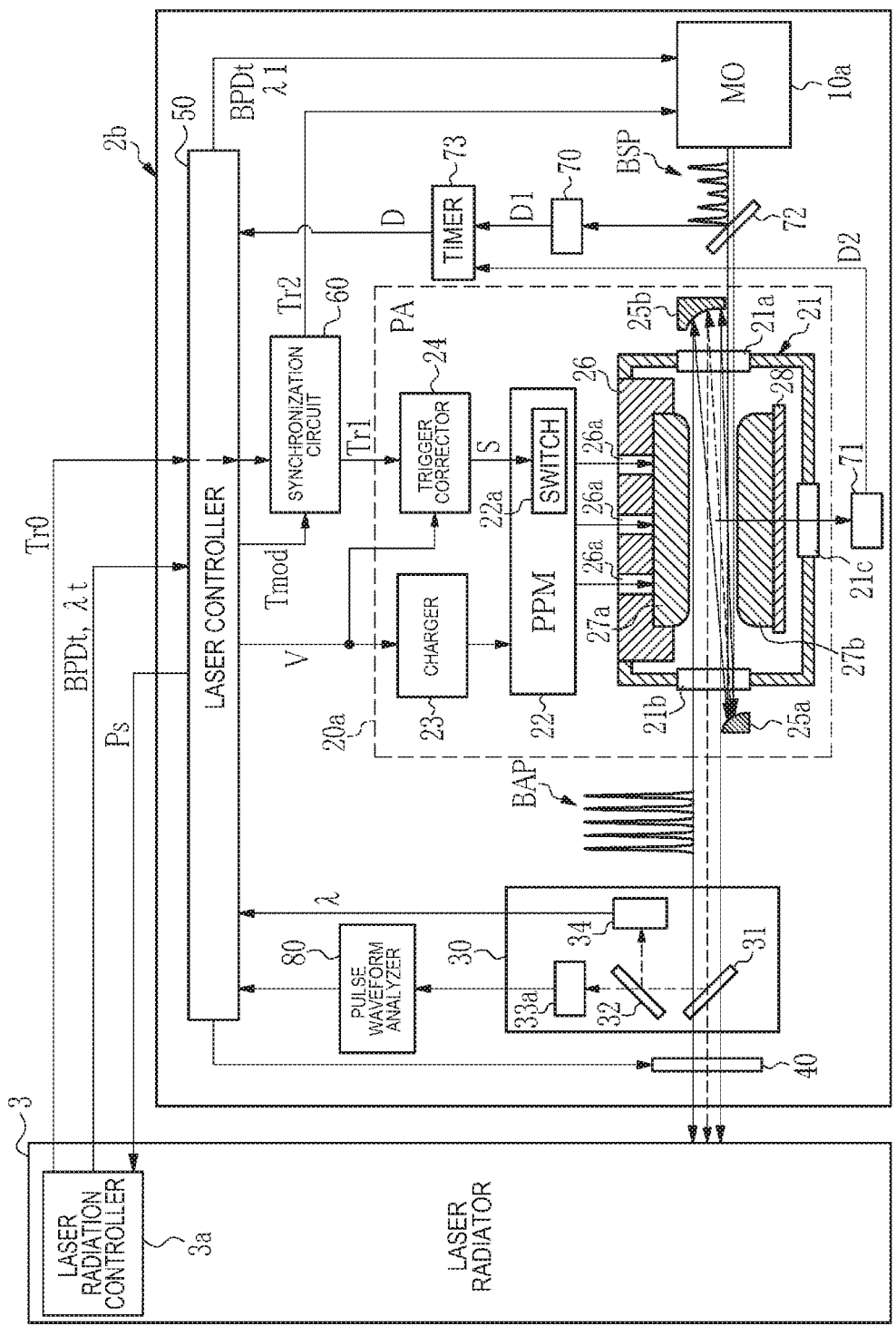
FIG. 18 schematically shows the configuration of a laser apparatus according to a second embodiment.

FIG. 18 schematically shows the configuration of a laser apparatus 2b according to the second embodiment. The laser apparatus 2b includes a pulse waveform analyzer 80 located between the monitor module 30 and the laser controller 50, and the monitor module 30 includes an optical sensor 33a in place of the energy sensor 33. The other configurations of the laser apparatus 2b are basically the same as those of the laser apparatus 2a according to the first embodiment.

The optical sensor 33a is a high-speed optical intensity sensor capable of measuring the optical intensity waveform of each of the m pulses $P_1$ to $P_m$ contained in the amplified burst pulsed light BAP and is formed of a photodiode or a photomultiplier tube. The optical sensor 33a outputs the detected optical intensity waveform of each of the pulses in the form of a voltage signal. Specific examples of the high-speed optical intensity sensor may include a PIN photodiode and a biplanar phototube.

The pulse waveform analyzer 80 is connected to the optical sensor 33a. The pulse waveform analyzer 80 AD-converts the voltage signal inputted from the optical sensor 33a at high speed from an analog signal to the digital signal and writes the digital signal as pulse waveform data onto a memory that is not shown. The pulse waveform analyzer 80 performs the AD conversion at a sampling cycle of, for example, 1 ns or shorter. The pulse waveform analyzer 80 further measures a plurality of parameters representing the characteristics of the pulses based on the pulse waveform data written onto the memory and inputs the measured values to the laser controller 50. The parameters include the peak intensity of each of the pulses, the pulse interval between the pulses, the pulse width of each of the pulses, and the burst pulse energy thereof.

In the present embodiment, the measured burst pulse energy E is provided by pulse waveform integration performed by the pulse waveform analyzer 80. The pulse waveform analyzer 80 may instead measure the burst pulse energy by using an analog integration circuit that is not shown to read the peak value of the waveform outputted from the circuit. The analog integration circuit may be a circuit capable of integrating the overall pulse energy of the amplified burst pulsed light BAP amplified in a single occurrence of the discharge produced by the excimer amplifier 20a. The period of the integration performed by the analog integration circuit may be longer than the period of the discharge produced by the excimer amplifier 20a or may, for example, be longer than or equal to several tens of nanoseconds but shorter than or equal to several microseconds. The pulse waveform analyzer 80 may still instead measure the burst pulse energy by integrating a pulse waveform in a digital form.

In the present embodiment, the target burst pulse data BPDt transmitted from the laser radiation controller 3a to the laser controller 50 contains the parameters that define the plurality of pulses contained in the amplified burst pulsed light BAP and the target burst pulse energy Et. Specifically, the target burst pulse data BPDt contains a target peak intensity Ipt(n) of each of the pulses, the target pulse interval Tdt(n), the target pulse width Twt(n), and the number of pulses m.

3.2 Operation

3.2.1 Basic Operation Timings

Figure 19:
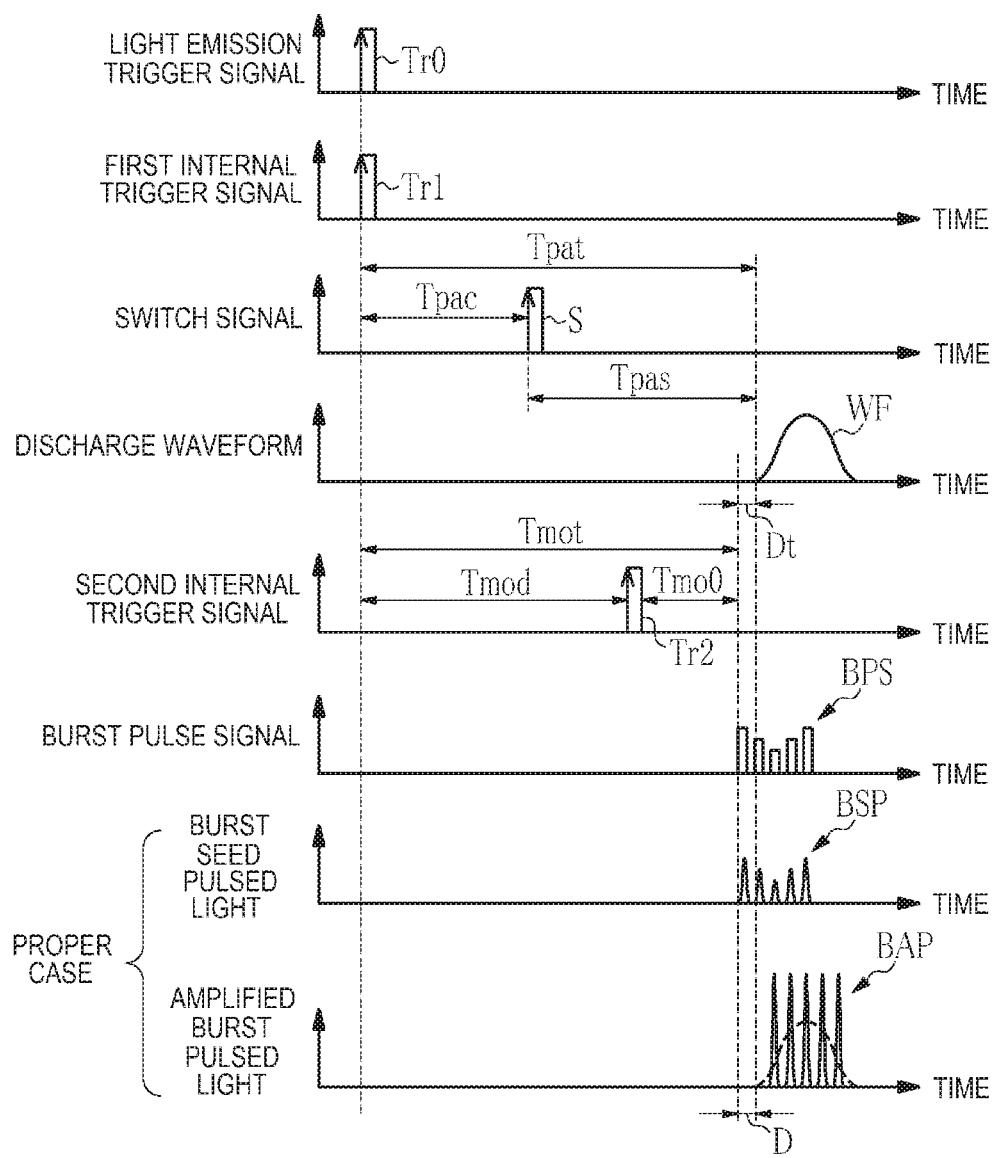
FIG. 19 is a timing chart showing the timings of operations performed by the laser apparatus according to the second embodiment.

FIG. 19 shows basic operation timings in the laser oscillation operation performed by the laser apparatus 2b according to the second embodiment. In the present embodiment, the signal intensities of the burst pulse signals BPS are so adjusted that the peak intensities of the pulses contained in the amplified burst pulsed light BAP are roughly equal to one another, as shown in FIG. 19. The reason for this is that when the signal intensities of the burst pulse signals BPS are uniform, the peak intensities of the pulses contained in the amplified burst pulsed light BAP change in accordance with the shape of a discharge waveform WF.

3.2.2 Correction of Trigger Delay Period

The correction of the trigger delay period Tmod in the second embodiment is the same as that in the first embodiment. Also in the present embodiment, the processes shown in the flowchart of FIG. 10 are carried out to achieve the proper relationship between the trigger delay period Tmod and the target delay period Dt.

3.2.3 Oscillation Control

Figure 20A:
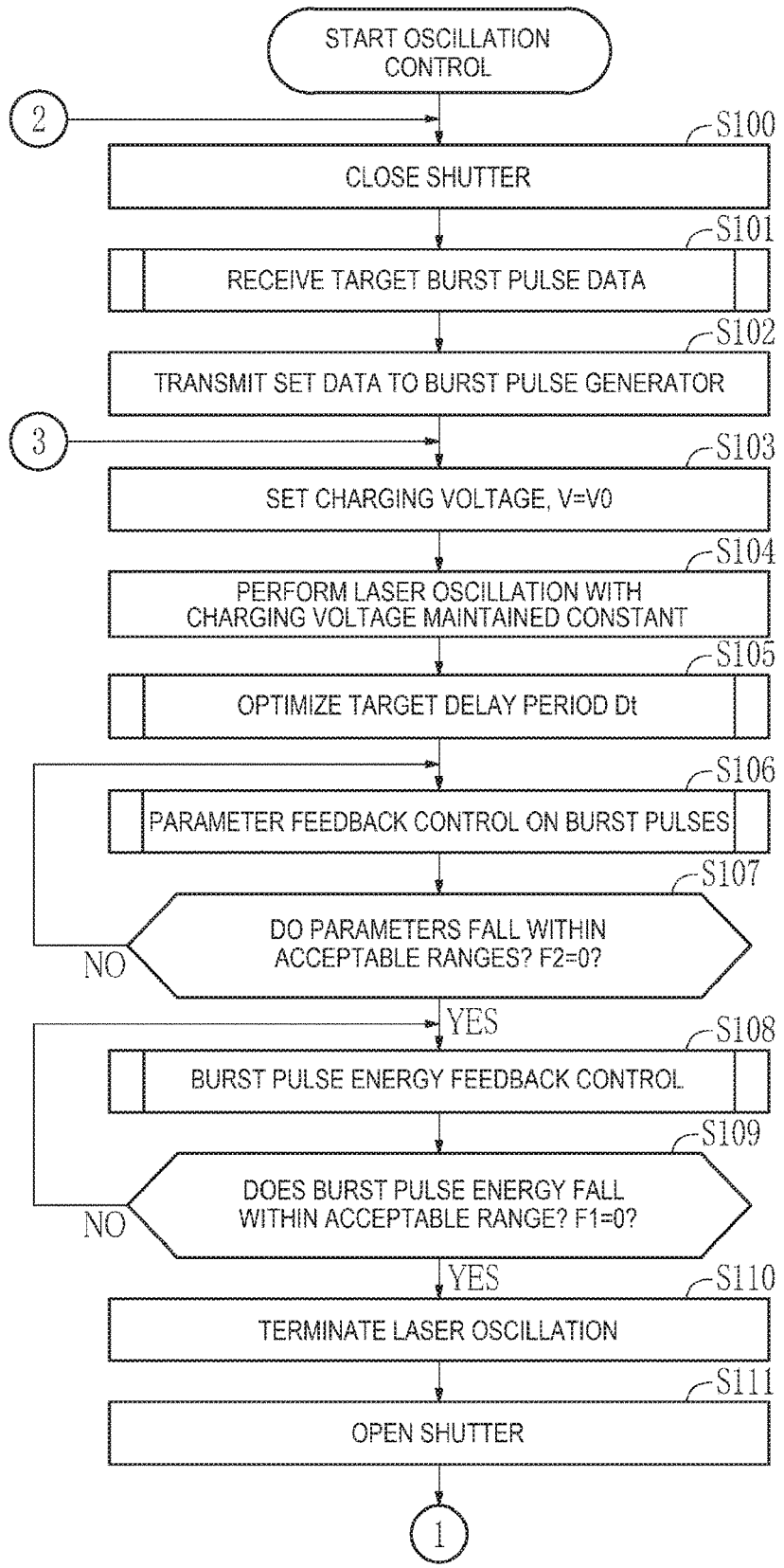
FIG. 20A is a flowchart for describing the oscillation preparation operation.
Figure 20B:
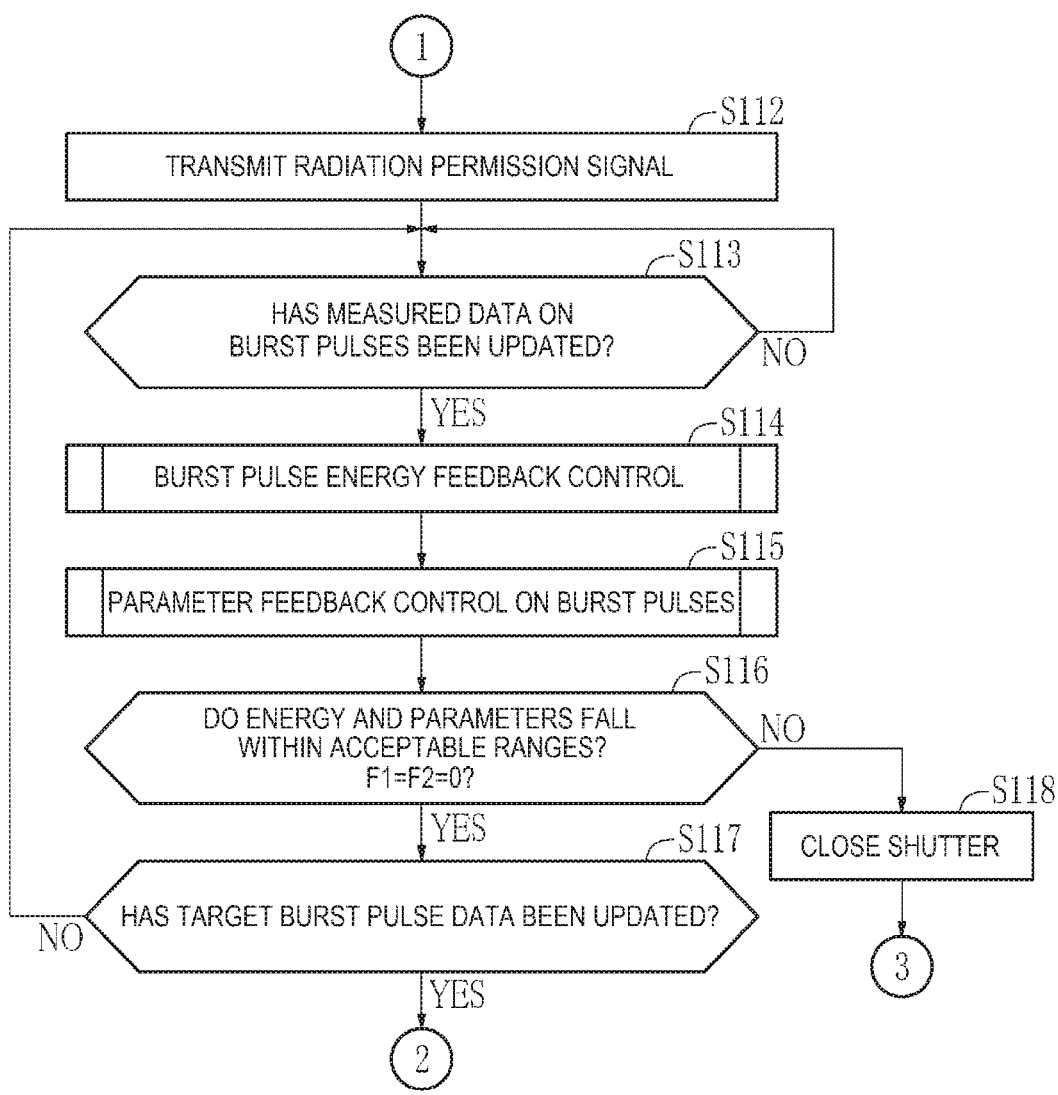
FIG. 20B is a flowchart for describing the main oscillation operation.

FIGS. 20A and 20B are flowcharts showing the oscillation control procedure in actual operation of the laser apparatus 2b. FIG. 20A shows the portion corresponding to the oscillation preparation operation performed before the main oscillation operation. FIG. 20B shows the portion corresponding to the main oscillation operation.

Figure 21:
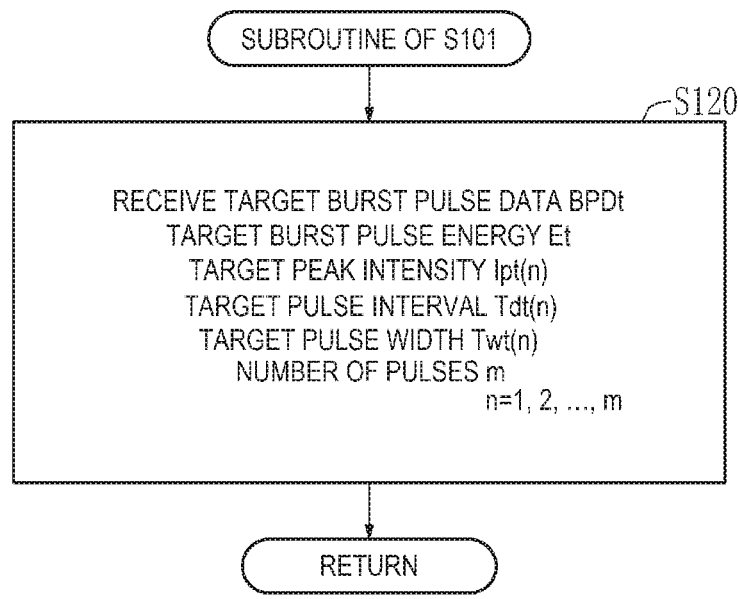
FIG. 21 is a flowchart for describing processes carried out when the target burst pulse data is received.

The oscillation control performed by the laser apparatus 2b will be described below. The laser controller 50 closes the shutter 40 (step S100) and receives the target burst pulse data BPDt from the laser radiation controller 3a (step S101), as in the first embodiment. In step S101, the laser controller 50 carries out the processes shown in the flowchart of FIG. 21. The laser controller 50 acquires the target burst pulse energy Et, the peak intensity Ipt(n), the target pulse interval Tdt(n), the target pulse width Twt(n), and the number of pulses m from the received target burst pulse data BPDt (step S120).

The laser controller 50 then transmits set data to the burst pulse generator 16 (step S102). The set data contains the signal intensity Ipg(n), the pulse interval Tdg(n), the pulse width Twg(n), and the number of pulses m. The laser controller 50 produces the set data as indicated by the following Expressions (11) to (13) and transmits the set data to the burst pulse generator 16:

$$Ipg(n)=Ipt(n) \quad (11);$$

$$Tdg(n)=Tdt(n) \quad (12); \text{ and}$$

$$Twg(n)=Twt(n) \quad (13),$$

where n=1, 2, . . . , m.

Figure 22:
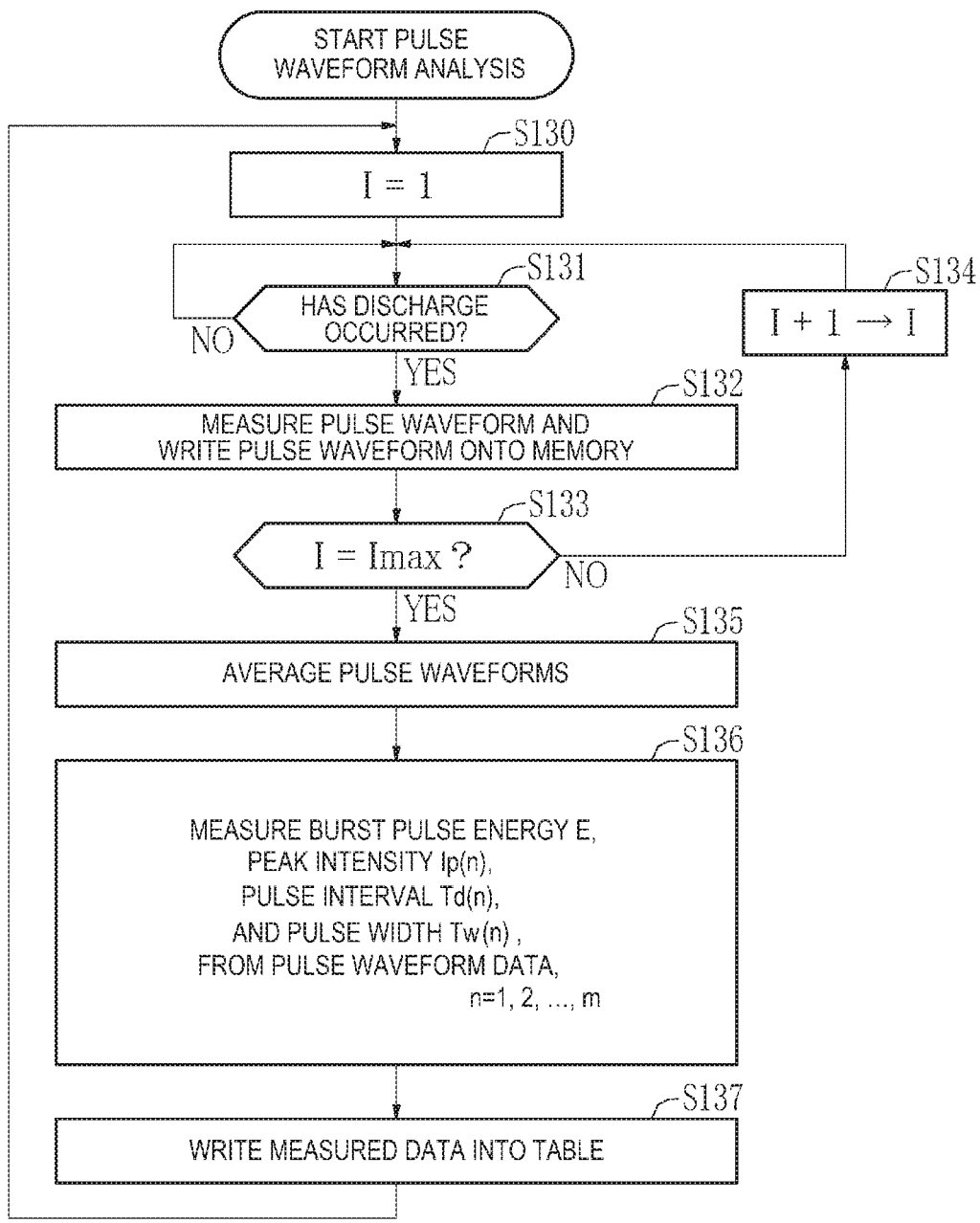
FIG. 22 is a flowchart for describing pulse waveform analysis operation.

The laser controller 50 then sets the charging voltage V to be set in the charger 23 at the constant V0 (step S103) and causes the solid-state laser apparatus 10a and the excimer amplifier 20a to perform the laser oscillation operation with the charging voltage V maintained constant (step S104), as in the first embodiment. The pulse waveform analyzer 80 performs pulse waveform analysis in synchronization with the laser oscillation operation, as shown in the flowchart of FIG. 22. The pulse waveform analyzer 80 first sets the value of a counter I at "1" (step S130). The pulse waveform analyzer 80 then senses that the optical sensor 33a has detected the amplified burst pulsed light BAP to detect whether or not the discharge has occurred in the excimer amplifier 20a (step S131).

The pulse waveform analyzer 80, when it detects the discharge (YES in step S131), measures the pulse waveform of each of the pulses contained in the amplified burst pulsed light BAP based on a signal outputted from the optical sensor 33a and writes the pulse waveforms as pulse waveform data onto the memory (step S132). The pulse waveform analyzer 80 evaluates whether or not the counter I indicates a maximum Imax (step S133). In a case where the counter I does not indicate the maximum Imax (NO in step S133), the pulse waveform analyzer 80 increments the current value of the counter I by 1 (step S134) and returns to step S131.

The processes in steps S131 to S134 are repeatedly carried out until the value of the counter I reaches the maximum Imax. When the counter I indicates the maximum Imax (YES in step S133), the pulse waveform analyzer 80 reads the data on the plurality of pulse waveforms stored in the memory and averages the pulse waveforms (step S135). Specifically, the pulse waveform analyzer 80 accumulates the data on the Imax pulse waveforms stored in the memory and divides the accumulated value by Imax to average the pulse waveforms. The maximum Imax is, for example, a value that falls within a range from 1 to 10,000.

The pulse waveform analyzer 80 then measures the burst pulse energy, the peak intensity, the pulse interval, and the pulse width based on data on the averaged pulse waveform (step S136). The pulse waveform analyzer 80 writes the measured data E, Ip(n), Td(n), and Tw(n) on the pulses into a table T2 shown in FIG. 23 (step S137). The pulse waveform analyzer 80 determines Tw(n), for example, by measuring the full width at half maximum of each of the pulses. Thereafter, the processes in step S130 to S137 are carried out whenever the discharge occurs.

Figure 24:
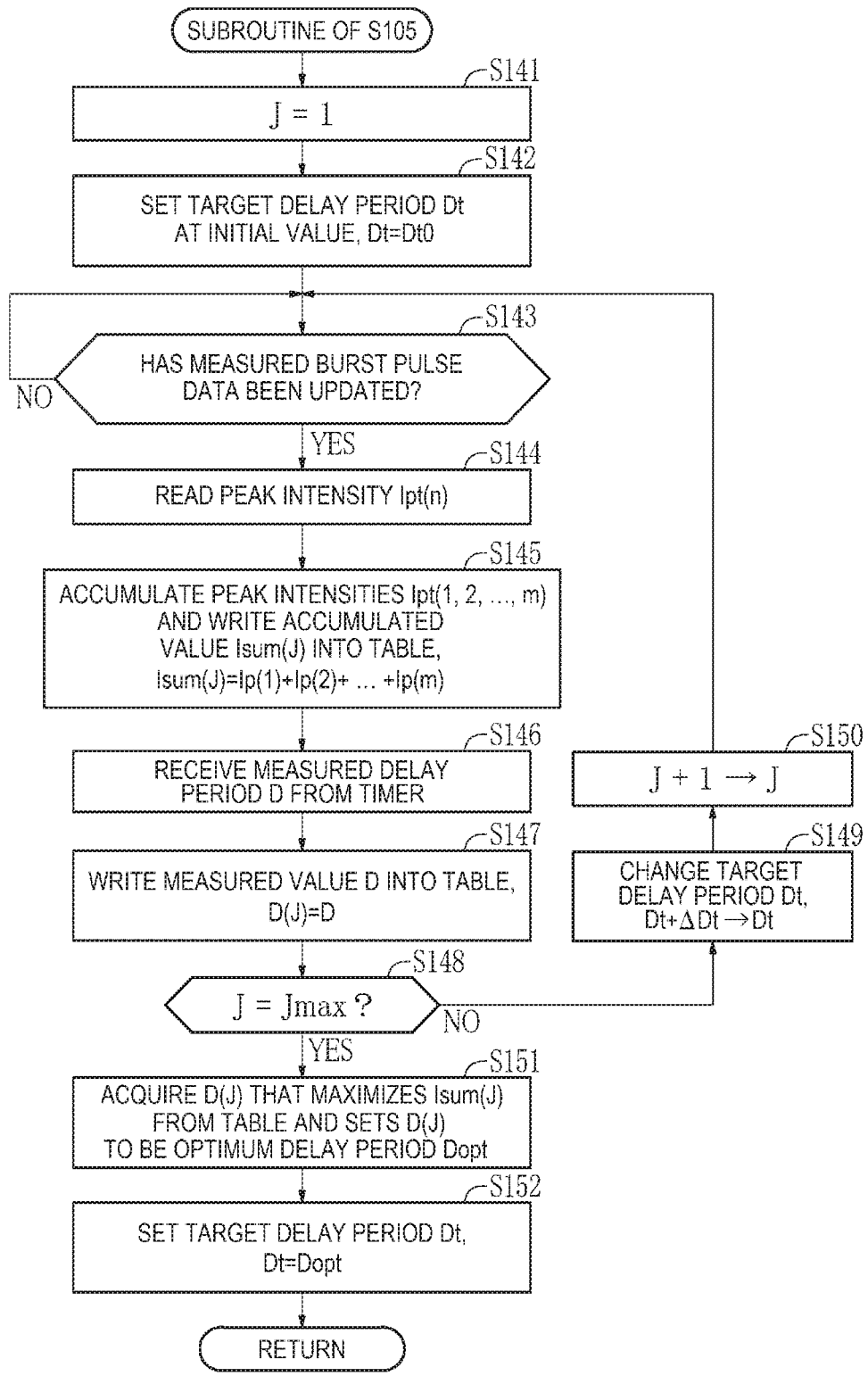
FIG. 24 is a flowchart for describing optimization of the target delay period.

Referring back to FIG. 20A, the laser controller 50 optimizes the target delay period Dt described above during the laser oscillation operation (step S105). In step S105, the laser controller 50 carries out the processes shown in the flowchart of FIG. 24. Only steps S143 to S144 and S151 differ from the steps in the first embodiments. The laser controller 50 first sets the value of the counter J at "1" (step S141) and sets the target delay period Dt at the initial value Dt0 (step S142).

The laser controller 50 evaluates whether or not the measured data stored in the table T2 has been updated (step S143). In a case where the measured data has been updated (YES in step S143), the laser controller 50 reads the measured peak intensity Ip(n) from the table T2 (step S144). The laser controller 50 sums the read measured values Ip (1, 2, . . . m) as indicated by the following Expression (14) to calculate a peak intensity sum Isum (J) (step S145). The sum Isum (J) corresponds to the burst pulse energy.

$$I\text{sum}(J)=Ip(1)+Ip(2)++Ip(m) \quad (14)$$

The laser controller 50 writes the calculated sum Isum (J) into a table T3 shown in FIG. 25 with the sum Isum(J) related to the value of the counter J (step S145). The laser controller 50 receives the measured delay period D from the timer 73 (step S146) and writes the received measured value D into the table T3 with the measured value D related to the value of the counter J (step S147).

The laser controller 50 evaluates whether or not the counter J indicates the maximum Jmax (step S148). In the case where the counter J does not indicate the maximum Jmax (NO in step S148), the laser controller 50 sets the current target delay period Dt to which the fixed period ΔDt is added as the target delay period Dt (step S149). The laser controller 50 then increments the current value of the counter J by 1 (step S150) and returns to step S143.

The processes in steps S143 to S150 are repeatedly carried out until the value of the counter J reaches the maximum Jmax. When the value of the counter J reaches the maximum Jmax (YES in step S148), the laser controller 50 acquires D(J) that maximizes Isum(J) from the table T3 and sets the acquired D(J) to be the optimum delay period Dopt (step S151). The laser controller 50 then sets the target delay period Dt to be the optical delay period Dopt (step S152). In this process, the laser controller 50 sets the trigger delay period Tmod corresponding to the optimum delay period Dopt in the synchronization circuit 60.

Figure 26:
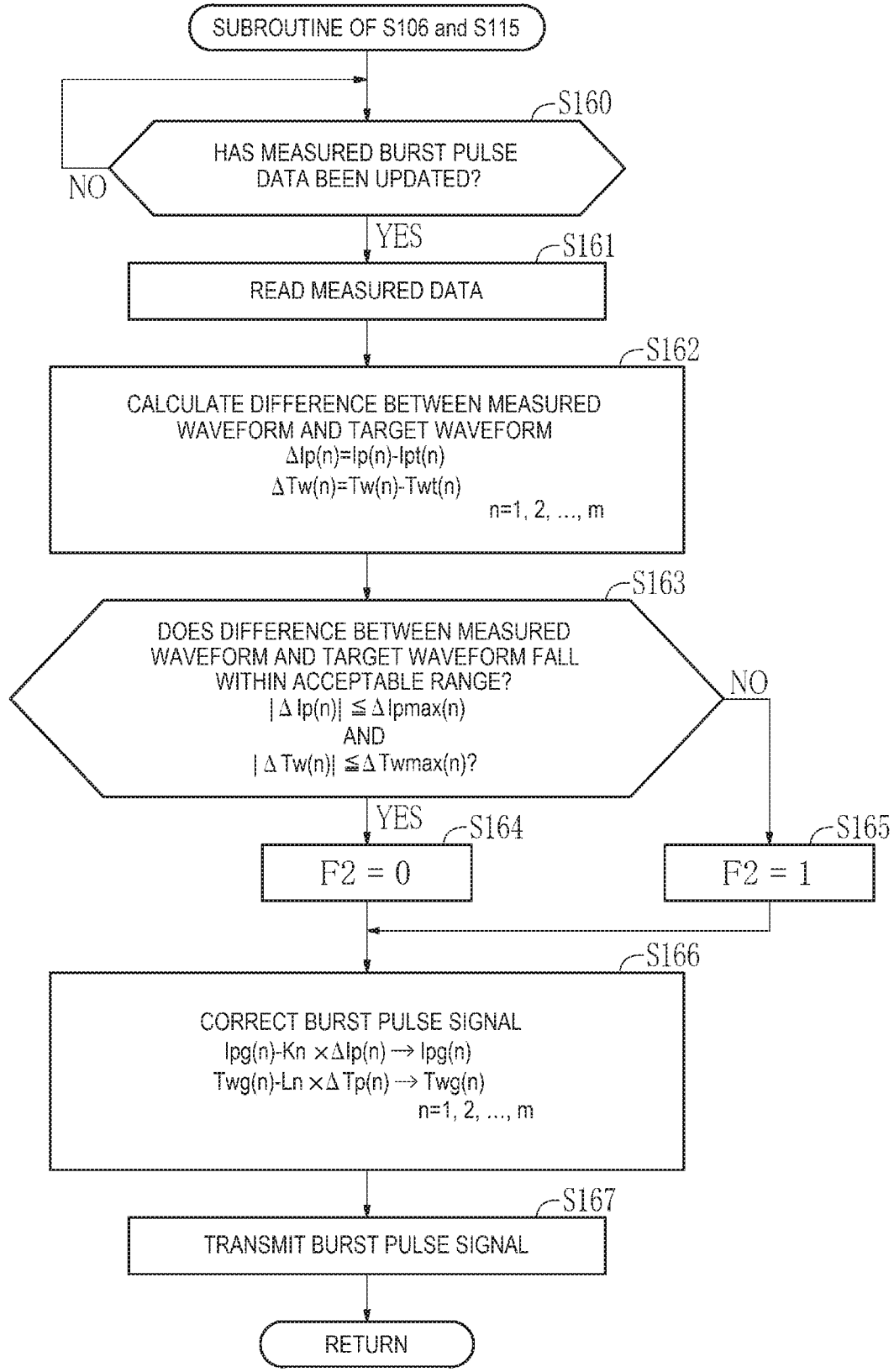
FIG. 26 is a flowchart for describing parameter feedback control.

Referring back to FIG. 20A, the laser controller 50 performs parameter feedback control on the burst pulses (step S106). In step S106, the laser controller 50 carries out the processes shown in the flowchart of FIG. 26. The laser controller 50 evaluates whether or not the measured data stored in the table T2 has been updated (step S160). In a case where the measured data has been updated (YES in step S160), the laser controller 50 reads the measured peak intensity Ip(n) and the measured pulse width Tw(n) from the table T2 (step S161).

The laser controller 50 then calculates the difference between the measured waveform and a target waveform (step S162). Specifically, the laser controller 50 calculates a difference ΔIp(n) between the measured peak intensity Ip(n) and the target peak intensity Ipt(n) based on the following Expression (15). Further, the laser controller 50 calculates a difference ΔTw(n) between the measured pulse width Tw(n) and the target pulse width Twt(n) based on the following Expression (16) (step S162):

$$\Delta Ip(n) = Ip(n) - Ipt(n) \quad (15)$$

$$\Delta Tw(n) = Tw(n) - Twt(n) \quad (16)$$

In the description, no difference between the measured pulse interval Td(n) and the target pulse interval Tdt(n) is calculated, but not necessarily, and the difference may be calculated.

The laser controller 50 evaluates whether or not the difference between the measured waveform and the target waveform falls within an acceptable range (step S163). Specifically, the laser controller 50 evaluates whether or not the difference ΔIp(n) falls within the acceptable range expressed by the following Expression (17) and the difference ΔTw(n) falls within the acceptable range expressed by the following Expression (18):

$$|\Delta Ip(n)| \leq Ip\max(n) \quad (17)$$

$$|\Delta Tw(n)| \leq Tw\max(n) \quad (18)$$

In a case where the difference ΔIp(n) and the difference ΔTw(n) fall within the respective acceptable ranges (YES in step S163), the laser controller 50 sets a flag F2 at "0" (step S164). On the other hand, in a case where at least one of the difference ΔIp(n) and the difference ΔTw(n) does not fall within the corresponding acceptable range (NO in step S163), the laser controller 50 sets the flag F2 at "1" (step S165).

The laser controller 50 corrects the burst pulse signal BPS based on the difference ΔIp(n) and the difference ΔTw(n) (step S166). Specifically, the laser controller 50 corrects the signal intensity Ipg(n) and the pulse width Twg(n) out of the components of the burst pulse signal BPS. The laser controller 50 multiplies the difference ΔIp(n) by a predetermined gain Kn, subtracts the result of the multiplication from the current signal intensity Ipg(n), and newly sets the result of the subtraction to be the signal intensity Ipg(n). The laser controller 50 multiplies the difference ΔTw(n) by a predetermined gain Ln, subtracts the result of the multiplication from the current pulse width Twg(n), and newly sets the result of the subtraction to be the pulse width Twg(n).

The laser controller 50 transmits the corrected burst pulse signal BPS to the burst pulse generator 16 (step S167). The waveform of the burst seed pulsed light BSP from the solid-state laser apparatus 10a is thus corrected.

Referring back to FIG. 20A, the laser controller 50 evaluates whether or not the flag F2 is "0" (step S107). In a case where the flag F2 is not "0" (NO in step S107), the laser controller 50 returns to step S106, where the laser controller 50 performs the parameter feedback control on the burst pulses again. On the other hand, in a case where the flag F2 is "0" (YES in step S107), the laser controller 50 transitions to step S108, where the laser controller 50 performs the burst pulse energy feedback control. Step S108 is the same as step S26 in the first embodiment described with reference to the flowchart of FIG. 17 and will therefore not be described. The measured burst pulse energy E in step S108 may be measured by the pulse waveform analyzer 80 that integrates the pulse waveforms or may be the sum Isum(J) described above.

The laser controller 50 evaluates whether or not the flag F1 is "0" (step S109). In the case where the flag F1 is not "0" (NO in step S109), the laser controller 50 returns to step S108, where the laser controller 50 performs the burst pulse energy feedback control on the burst pulses again. On the other hand, in the case where the flag F1 is "0" (YES in step S109), the laser controller 50 causes the solid-state laser apparatus 10a and the excimer amplifier 20a to terminate the laser oscillation operation (step S110) and opens the shutter 40 (step S111). The laser oscillation preparation operation thus ends.

Referring next to FIG. 20B, the laser controller 50 transmits the radiation permission signal Ps to the laser radiation controller 3a (step S112). The laser controller 50, when it receives the light emission trigger signal Tr0 from the laser radiation controller 3a, inputs the received light emission trigger signal Tr0 to the synchronization circuit 60 to cause the solid-state laser apparatus 10a and the excimer amplifier 20a to perform the laser oscillation operation. The light emission trigger signal Tr0 is transmitted from the laser radiation controller 3a to the laser controller 50 at the repetition frequency Rp.

The laser controller 50 then evaluates whether or not the measured burst pulse energy data stored in the table T2 has been updated (step S113). In a case where the measured data has not been updated (NO in step S113), the laser controller 50 repeatedly performs the evaluation in step S113. In a case where the measured data has been updated (YES in step S113), the laser controller 50 transitions to step S114. In step S114, the laser controller 50 performs the burst pulse energy feedback control. Step S114 is the same as step S108 and will therefore not be described. The laser controller 50 then performs the parameter feedback control on the burst pulses (step S115). Step S115 is the same as step S106 and will therefore not be described.

The laser controller 50 evaluates whether or not the flags F1 and F2 are both "0" (step S116). In a case where the flag F1 or F2 is not "0" (NO in step S116), the laser controller 50 closes the shutter 40 (step S118) and returns to the process in step S103, where the oscillation preparation operation is performed.

In a case where the flags F1 and F2 are "0 (YES in step S116), the laser controller 50 evaluates whether or not the target burst pulse data BPDt received from the laser radiation controller 3a has been updated (step S117). In the case where the target burst pulse data BPDt has not been updated (NO step S117), the laser controller 50 returns to step S113. In the case where the target burst pulse data BPDt has been updated (YES step S117), the laser controller 50 returns to step S100, where the oscillation preparation operation is performed.

The laser controller 50 acquires the wavelength $\lambda$ measured by the wavelength monitor 34 and controls the wavelength of the light from the semiconductor laser 11 based on the measured wavelength $\lambda$ and the target wavelength $\lambda t$ as appropriate, as in the first embodiment.

3.3 Effects

In the second embodiment, the waveform of the amplified burst pulsed light BAP can be controlled. Further, in the second embodiment, the difference between a measured waveform and a target waveform of the amplified burst pulsed light BAP supplied to the laser radiator 3 is measured, and the waveform of the burst seed pulsed light BSP can be so corrected that the difference decreases. That is, in the second embodiment, the waveform of the amplified burst pulsed light BAP is allowed to approach the target waveform based on the target burst pulse data BPDt.

In the second embodiment, in the optimization of the target delay period Dt, the optimum delay period Dopt is determined based on the sum Isum(J), which is the sum of the peak intensities of the pulses contained in the amplified burst pulsed light BAP. The optimum delay period Dopt may instead be determined based on the measured burst pulse energy E(J), as in the first embodiment. In this case, it is also preferable that the energy sensor 33 in the first embodiment is provided separately from the optical sensor 33a and the energy sensor 33 measures the burst pulse energy. A beam splitter for guiding the light to the energy sensor 33 may be further provided.

4. Third Embodiment

A laser apparatus according to a third embodiment of the present disclosure will next be described. The laser apparatus according to the third embodiment has the function of controlling the wavelength of each pulse contained in the amplified burst pulsed light BAP supplied to the laser radiator 3 in addition to the function of the laser apparatus according to the second embodiment. In the following description, the same components as those of the laser apparatus 2b according to the second embodiment have the same reference characters and will not be described as appropriate.

4.1 Configuration

Figure 27:
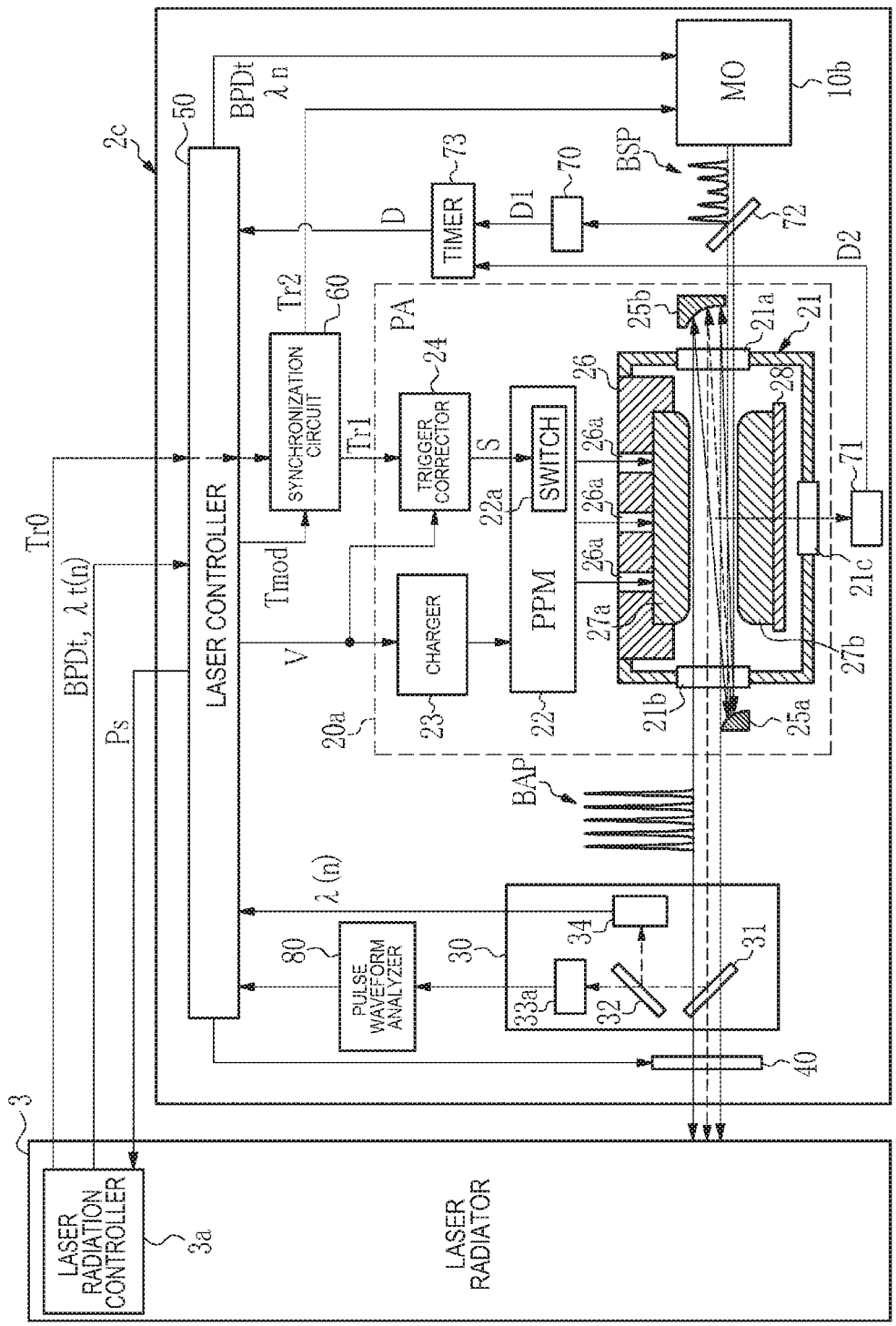
FIG. 27 schematically shows the configuration of a laser apparatus according to a third embodiment.
Figure 28:
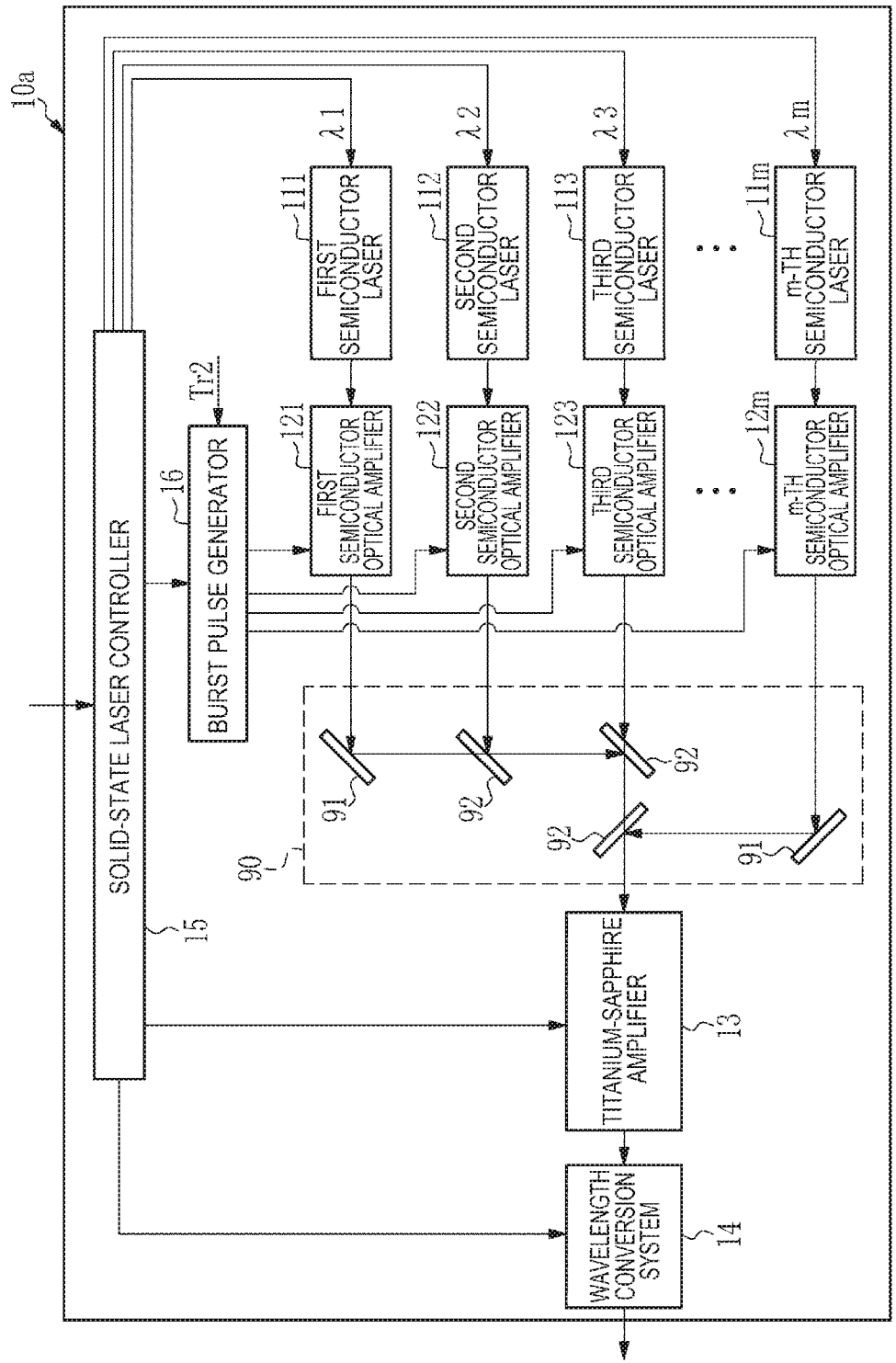
FIG. 28 shows the configuration of a solid-state laser apparatus according to the third embodiment.

FIGS. 27 and 28 schematically show the configuration of a laser apparatus 2c according to the third embodiment. The laser apparatus 2c includes a solid-state laser apparatus 10b, which is capable of changing the wavelength of the burst pulsed light on a pulse basis, and the wavelength monitor 34 can measure the wavelength on a pulse basis. The other configurations of the laser apparatus 2c are basically the same as those of the laser apparatus 2b according to the second embodiment.

In the present embodiment, the wavelength monitor 34 measures the wavelength of each of the m pulses $P_1$ to $P_m$ contained in the amplified burst pulsed light BAP. The wavelength monitor 34 outputs the measured wavelength of each pulse Pr, as measured wavelength data $\lambda(n)$ to the laser controller 50. In the present embodiment, the laser radiation controller 3a transmits a target wavelength $\lambda t(n)$ of each pulse $P_n$ to the laser controller 50.

The solid-state laser apparatus 10b includes first to m-th semiconductor lasers 111 to 11m, first to m-th semiconductor optical amplifiers 121 to 12m, and a beam combiner 90, as shown in FIG. 28. The solid-state laser apparatus 10b further includes the titanium-sapphire amplifier 13, the wavelength conversion system 14, the solid-state laser controller 15, and the burst pulse generator 16. The number m corresponds to the number of pulses m described above.

The first to m-th semiconductor lasers 111 to 11m each have the same configuration as that of the semiconductor laser 11 in the first and second embodiments. Wavelength data is individually set in each of the first to m-th semiconductor lasers 111 to 11m. The laser controller 50 sets wavelength data Xn in the n-th semiconductor laser 11n.

The first to m-th semiconductor optical amplifiers 121 to 12m each have the same configuration as that of the semiconductor optical amplifier 12 in the first and second embodiments. The n-th semiconductor optical amplifier 12n is disposed in a position corresponding to the n-th semiconductor laser 11n, and the laser light outputted from the n-th semiconductor laser 11n is incident on the n-th semiconductor optical amplifier 12n. The burst pulse signal BPS is inputted from the burst pulse generator 16 to the first to m-th semiconductor optical amplifiers 121 to 12m. A pulse signal $G_n$ corresponding to the signal intensity Ipg(n), the pulse width Twg(n), and the pulse interval Tdg(n) is inputted to the n-th semiconductor optical amplifier 12n.

The beam combiner 90 includes a plurality of high-reflectance mirrors 91 and a plurality of half-silvered mirrors 92. The numbers of high-reflectance mirrors 91 and half-silvered mirrors 92 are changed as appropriate in accordance with the number of pulses m. The beam combiner 90 combines the plurality of laser beams outputted from the first to m-th semiconductor lasers 111 to 11m with one another and outputs the combined laser beam in such a way that the optical paths of the laser beams are so combined with one another to coincide with a single optical path axis. The titanium-sapphire amplifier 13 and the wavelength conversion system 14 are disposed in the optical path of the light having exited out of the beam combiner 90.

The solid-state laser apparatus 10b can separately change the wavelength of each pulse contained in the burst seed pulsed light BSP outputted from the solid-state laser apparatus 10b by controlling the wavelength data $\lambda 1$ to $\lambda m$ set in the first to m-th semiconductor lasers 111 to 11m.

4.2 Operation

4.2.1 Oscillation Control

Figure 29A:
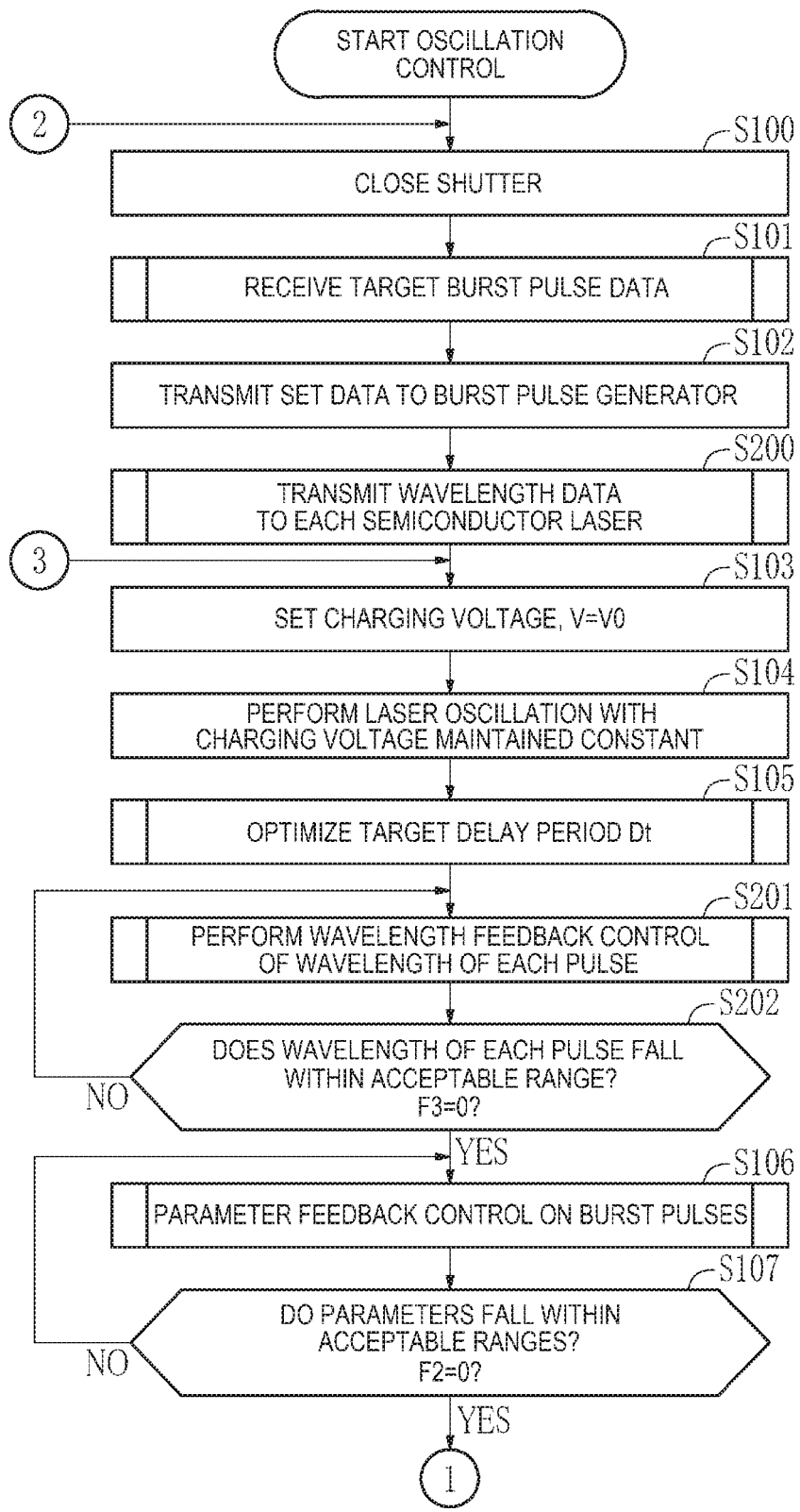
FIG. 29A is a flowchart for describing the oscillation preparation operation.
Figure 29B:
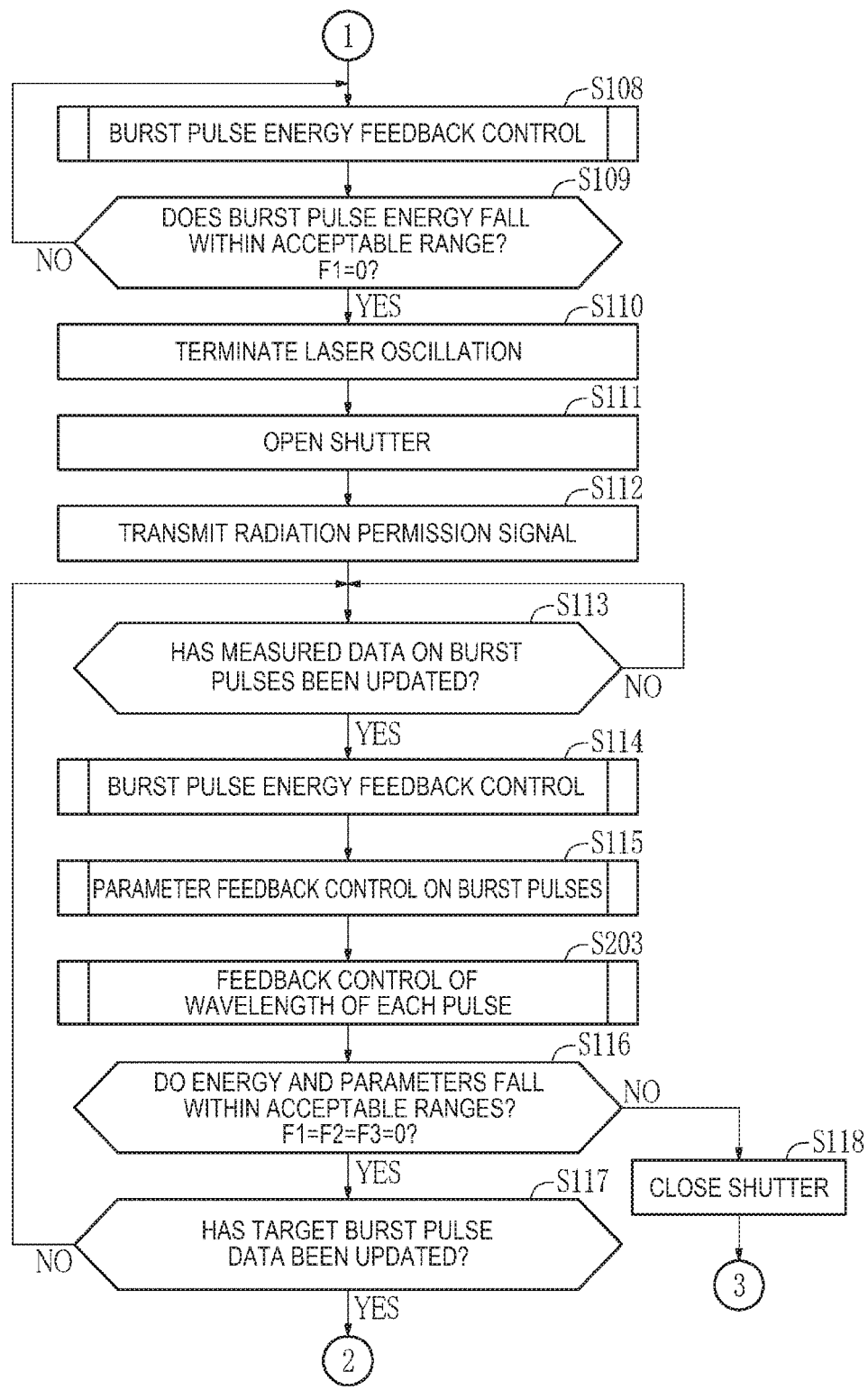
FIG. 29B is a flowchart for describing the main oscillation operation.

FIGS. 29A and 29B are flowcharts showing the oscillation control procedure in actual operation of the laser apparatus 2c. The flowcharts are basically the same as the flowcharts of FIGS. 20A and 20B in the second embodiment except that steps S200 to S203 are added thereto. Step S200 is added as a step between steps S102 and S103. Steps S201 and S202 are added as steps between steps S105 and S106. Step S203 is added as a step between steps S115 and S116.

Figure 30:
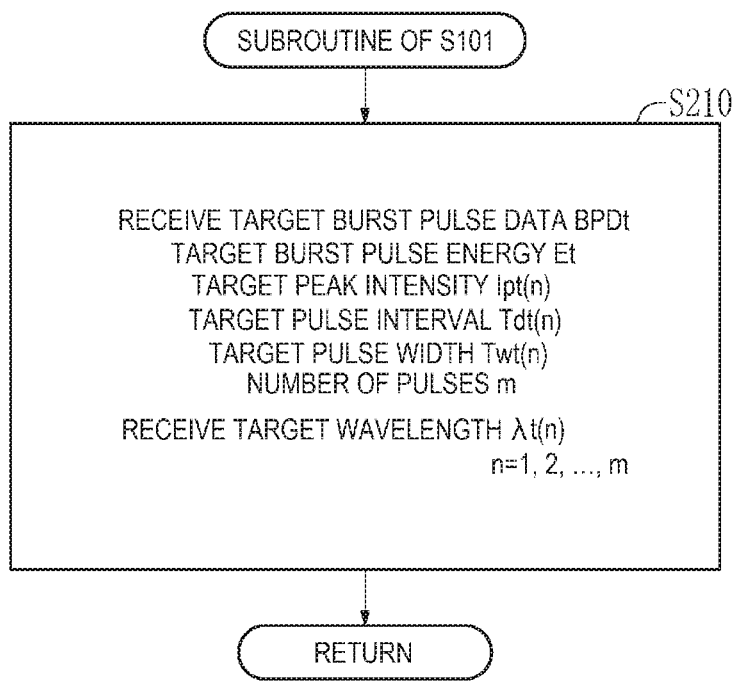
FIG. 30 is a flowchart for describing processes carried out when the target burst pulse data is received.

Differences between the third embodiment and the second embodiment will be described below. In the present embodiment, in step S101, the laser controller 50 receives the target wavelength λt(n) on a pulse basis from the laser radiation controller 3a (step S210) in addition to the target burst pulse data BPDt described above, as shown in FIG. 30.

Figure 31:
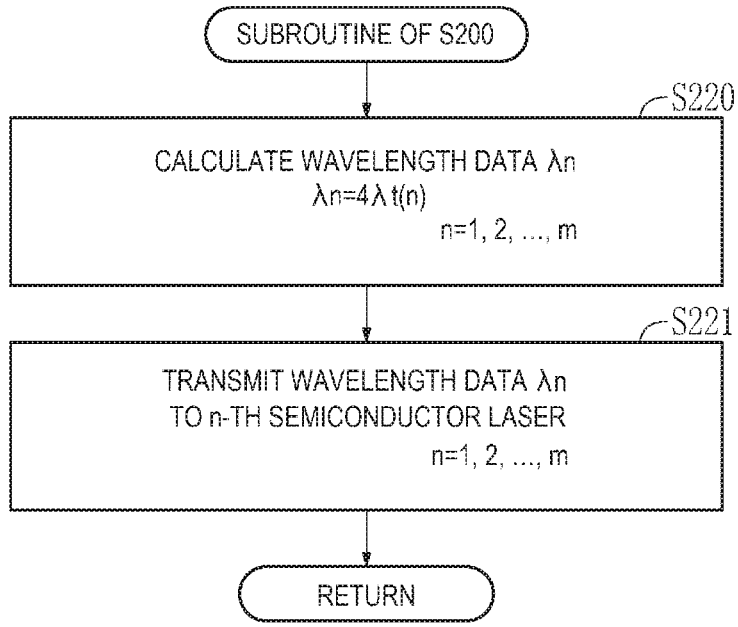
FIG. 31 is a flowchart for describing processes carried out when wavelength data is transmitted.

In step S200, the laser controller 50 sets the wavelength data λ1 to λm in the first to m-th semiconductor lasers 111 to 11m via the solid-state laser controller 15. Specifically, the laser controller 50 calculates wavelength data λn that satisfies the following Expression (19) based on the target wavelength λt(n) (step S220), as shown in FIG. 31.

$$\lambda n = 4\lambda t(n) \tag{19}$$

The laser controller 50 then transmits the calculated wavelength data λ1 to λm to the first to m-th semiconductor lasers 111 to 11m(step S221).

Figure 32:
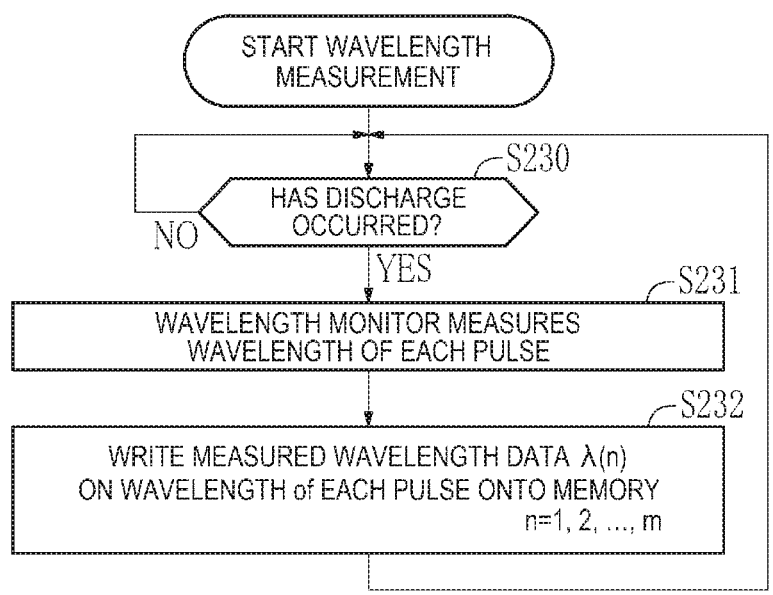
FIG. 32 is a flowchart for describing wavelength measurement operation.

In the present embodiment, the laser controller 50 performs wavelength measurement control shown in FIG. 32 in addition to the pulse waveform analysis control described with reference to FIG. 22 in the second embodiment. Specifically, the optical sensor 33a or the second optical sensor 71 detects whether or not the discharge has occurred in the excimer amplifier 20a (step S230).

The wavelength monitor 34, when it detects the discharge (YES in step S230), measures the wavelength of each pulse contained in the amplified burst pulsed light BAP (step S231). The laser controller 50 receives measured wavelength data λ(1) to λ(m) from the wavelength monitor 34 and writes the data onto a memory that is not shown (step S232). Thereafter, the processes in step S231 and S232 are carried out whenever the discharge occurs.

Figure 33:
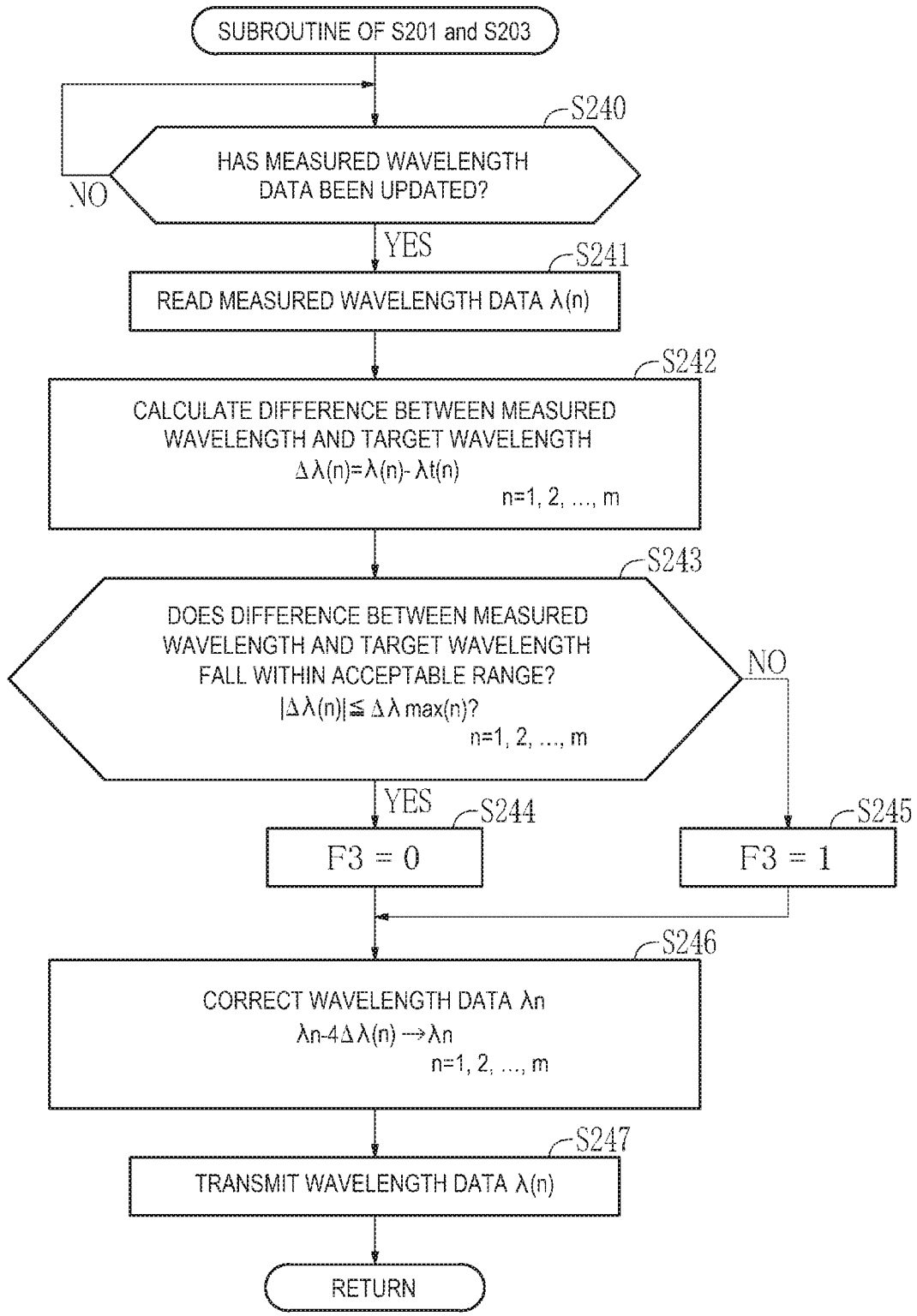
FIG. 33 is a flowchart for describing wavelength feedback control.

In step S201, the laser controller 50 performs wavelength feedback control shown in the flowchart of FIG. 33. Specifically, the laser controller 50 evaluates whether or not the measured wavelength data stored in the memory has been updated (step S240). In a case where the measured wavelength data has been updated (YES in step S240), the laser controller 50 reads the measured wavelength data λ(n) from the memory (step S241).

The laser controller 50 then calculates the difference between the measured wavelength and the target wavelength (step S242). Specifically, the laser controller 50 calculates a difference Δλ(n) between the measured wavelength data λ(n) and the target wavelength λt(n) based on the following Expression (20):

$$\Delta\lambda(n) = \lambda(n) - \lambda t(n) \tag{20}$$

The laser controller 50 performs the calculation from n=1 to n=m.

The laser controller 50 evaluates whether or not the difference between the measured wavelength and the target wavelength falls within an acceptable range (step S243). Specifically, the laser controller 50 evaluates whether or not the difference Δλ(n) falls within the acceptable range expressed by the following Expression (21):

$$|\Delta\lambda(n)| \leq \lambda \max(n) \tag{21}$$

The laser controller 50 performs the evaluation from n=1 to n=m.

In a case where the difference Δλ(n) falls within the acceptable range for each of n=1 to n=m (YES in step S243), the laser controller 50 sets a flag F3 at "0" (step S244). On the other hand, in a case where the difference Δλ(n) does not fall within the acceptable range for at least one of n=1 to n=m (NO in step S243), the laser controller 50 sets the flag F3 at "1" (step S245).

The laser controller 50 corrects the wavelength data Xn based on the difference Δλ(n) (step S246). Specifically, the laser controller 50 multiplies the difference Δλ(n) by "4", subtracts the result of the multiplication from the wavelength data λ, and newly sets the result of the subtraction to be the wavelength data λ. The laser controller 50 transmits the corrected measured wavelength data λ(1) to λ(m) to the first to m-th semiconductor lasers 111 to 11m(step S247). The wavelength of each pulse contained in the burst seed pulsed light BSP from the solid-state laser apparatus 10b is thus corrected.

In step S202 in FIG. 29A, the laser controller 50 evaluates whether or not the flag F3 is "0". In the case where the flag F3 is not "0" (NO in step S202), the laser controller 50 returns to the process in step S201. On the other hand, in a case where the flag F3 is "0" (YES in step S202), the laser controller 50 transitions to the process in step S106.

Step S203 in FIG. 29B is the same as step S201 and will therefore not be described. In the present embodiment, the laser controller 50 evaluates whether or not the flags F1 to F3 are all "0" in step S116 after step S203. In a case where at least one of the flags F1 to F3 is not "0" (NO in step S116), the laser controller 50 transitions to the process in step S118. In a case where the flags F1 to F3 are all "0", the laser controller 50 transitions to the process in step S117.

The other operations of the laser apparatus 2c according to the present embodiment are the same as those in the second embodiment.

4.3 Effects

In the third embodiment, in addition to the waveform of the amplified burst pulsed light BAP supplied to the laser radiator 3, the wavelength of each pulse contained in the waveform can be controlled. Further, in the third embodiment, the difference between a measured wavelength and a target wavelength of each pulse contained in the amplified burst pulsed light BAP is measured, and the wavelength of each pulse can be so corrected that the difference decreases.

In the third embodiment, the wavelength monitor 34 measures the wavelength of the amplified burst pulsed light BAP. In the case where no precise wavelength control is required, the wavelength monitor 34 may be omitted. In this case, the laser controller 50 may set the oscillation wavelength of the solid-state laser apparatus 10a and may not perform the wavelength feedback control.

5. Variation of Solid-State Laser Apparatus

5.1 First Variation

5.1.1 Configuration

Figure 34:
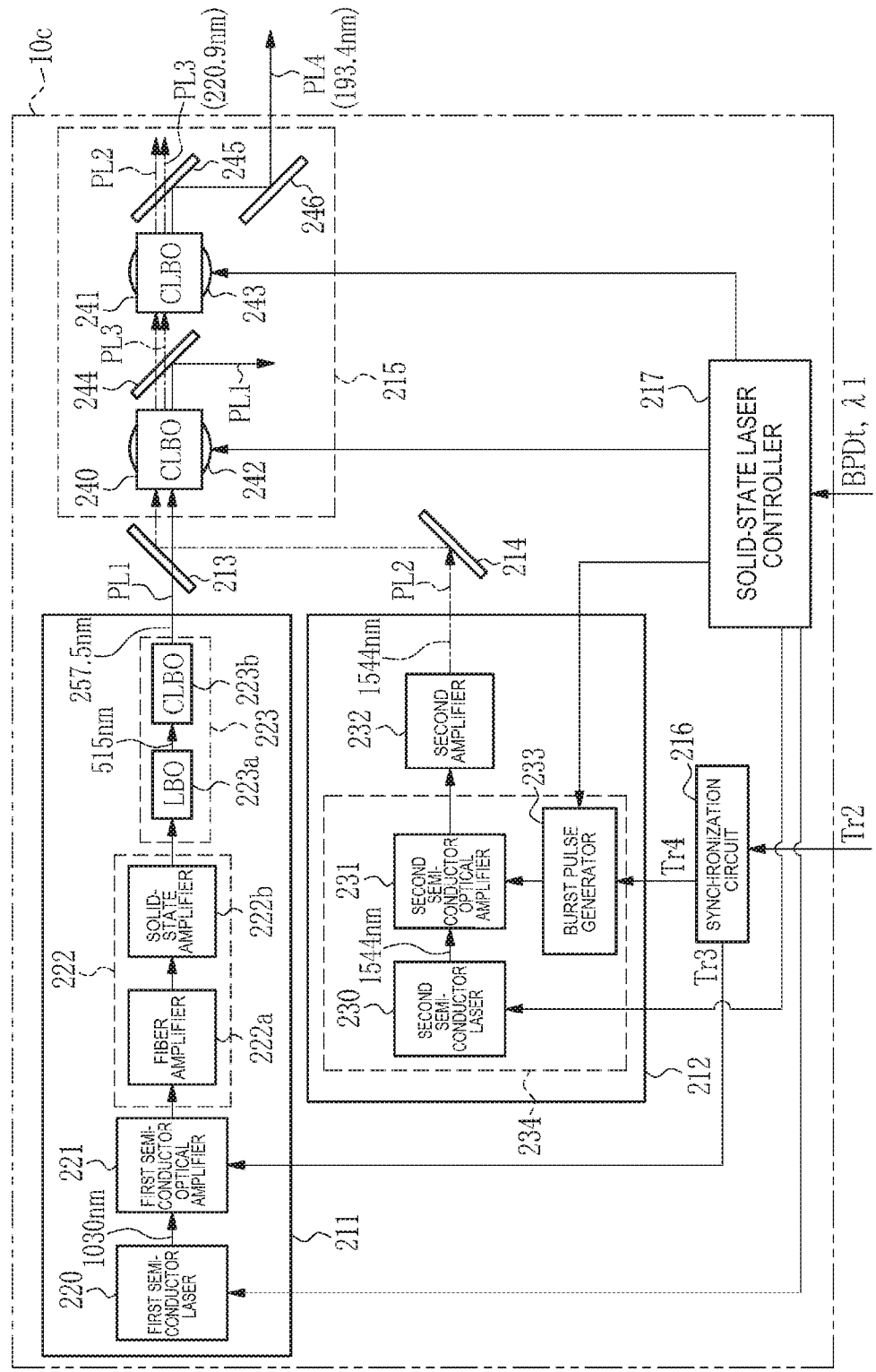
FIG. 34 shows the configuration of a solid-state laser apparatus according to a first variation.

A first variation of the solid-state laser apparatus will be described below. FIG. 34 shows the configuration of a solid-state laser apparatus 10c according to the first variation. The solid-state laser apparatus 10c includes a first solid-state laser apparatus 211, a second solid-state laser apparatus 212, a dichroic mirror 213, a high-reflectance mirror 214, a wavelength conversion system 215, a synchronization circuit 216, and a solid-state laser controller 217.

The first solid-state laser apparatus 211 includes a first semiconductor laser 220, a first semiconductor optical amplifier 221, a first amplifier 222, and a wavelength converter 223. The first amplifier 222 includes a fiber amplifier 222a, a solid-state amplifier 222b, and a CW excitation semiconductor laser that is not shown. The wavelength converter 223 includes an LBO crystal 223a and a CLBO crystal 223b.

The first semiconductor laser 220 outputs single-longitudinal-mode CW laser light having a wavelength of about 1030 nm as first seed light. The first semiconductor laser 220 is, for example, a distributed feedback semiconductor laser. The first semiconductor optical amplifier 221 amplifies the first seed light to produce laser light pulses each having a predetermined pulse width. The laser light produced by the first semiconductor optical amplifier 221 is hereinafter referred to as first seed pulsed light.

The fiber amplifier 222a is formed of a plurality of quartz fibers to which Yb is doped and which are connected to each other for multi-stage amplification. The solid-state amplifier 222b is a YAG crystal to which Yb is doped. The fiber amplifier 222a and the solid-state amplifier 222b are optically excited with CW excitation light inputted from the CW excitation semiconductor laser that is not shown. The first amplifier 222 amplifies the first seed pulsed light incident from the first semiconductor optical amplifier 221.

The wavelength converter 223 converts the wavelength of the first seed pulsed light amplified by the first amplifier 222 and outputs the resultant light as first pulsed laser light PL1. Specifically, the wavelength converter 223, which includes the LBO crystal 223a and the CLBO crystal 223b, produces fourth harmonic light having a wavelength of about 257.5 nm from the first seed pulsed light and outputs the fourth harmonic light as the pulsed laser beam PL1.

The second solid-state laser apparatus 212 includes a second semiconductor laser 230, a second semiconductor optical amplifier 231, a second amplifier 232, and a burst pulse generator 233. The second semiconductor laser 230, the second semiconductor optical amplifier 231, and the burst pulse generator 233 form a burst seed pulse generator 234. The second amplifier 232 includes an Er fiber amplifier that is not shown and is formed of a plurality of quartz fibers to which Er and Yb are doped and which are connected to each other for multi-stage amplification and further includes a CW excitation semiconductor laser that is not shown.

The second semiconductor laser 230 outputs single-longitudinal-mode CW laser light having a wavelength of about 1554 nm as second seed light. The second semiconductor laser 230 is, for example, a distributed feedback semiconductor laser. The second semiconductor laser 230 is preferably configured to be capable of changing the oscillation wavelength by changing the setting of the temperature of the semiconductor material.

The burst pulse generator 233 has the same configuration as that of the burst pulse generator 16 in the first embodiment. The burst pulse generator 233 inputs the burst pulse signal BPS received from the laser controller 50 via the solid-state laser controller 217 to the second semiconductor optical amplifier 231. The second semiconductor optical amplifier 231 converts the second seed light into laser light formed of burst pulses based on the burst pulse signal BPS. The laser light formed of burst pulses produced by the second semiconductor optical amplifier 231 is hereinafter referred to as second seed pulsed light.

The Er fiber amplifier provided in the second amplifier 232 is optically excited with CW excitation light inputted from the CW excitation semiconductor laser that is not shown. The second amplifier 232 amplifies the second seed pulsed light incident from the second semiconductor optical amplifier 231. The second amplifier 232 outputs the amplified second seed pulsed light as burst pulsed light PL2.

The dichroic mirror 213 is disposed in a position where the pulsed laser light PL1 outputted from the first solid-state laser apparatus 211 is incident. The high-reflectance mirror 214 is so disposed as to reflect the burst pulsed light PL2 outputted from the second solid-state laser apparatus 212 at high reflectance and cause the burst pulsed light PL2 reflected at high reflectance to be incident on the dichroic mirror 213.

A film is coated on the dichroic mirror 213, and the film transmits the pulsed laser light PL1 having the wavelength of about 257.5 nm at high transmittance and reflects the burst pulsed light PL2 having the wavelength of about 1554 nm at high reflectance. The dichroic mirror 213 is so disposed that the optical path axis of the pulsed laser light PL1 that the dichroic mirror 213 has transmitted at high transmittance coincide with the optical path axis of the burst pulsed light PL2 that the dichroic mirror 213 has reflected at high reflectance.

The wavelength conversion system 215 includes a first CLBO crystal 240, a second CLBO crystal 241, a first rotary stage 242, a second rotary stage 243, a first dichroic mirror 244, a second dichroic mirror 245, and a high-reflectance mirror 246.

The first CLBO crystal 240, the first dichroic mirror 244, the second CLBO crystal 241, and the second dichroic mirror 245 are arranged in the presented order along the optical paths of the pulsed laser beam PL1 and the burst pulsed light PL2. The pulsed laser light PL1 and the burst pulsed light PL2 are incident on the first CLBO crystal 240.

The first CLBO crystal 240 superimposes the pulsed laser light PL1 and the burst pulsed light PL2 on each other into burst pulsed light PL3 having a wavelength of about 220.9 nm corresponding to the sum frequency of the wavelength of about 257.5 nm and the wavelength of about 1554 nm. The pulsed laser light PL1 and the burst pulsed light PL2 that have not undergone the wavelength conversion pass through the first CLBO crystal 240.

A film is coated on the first dichroic mirror 244, and the film reflects the pulsed laser light PL1 at high reflectance and transmits the burst pulsed light PL2 and the burst pulsed light PL3 at high transmittance. The burst pulsed light PL2 and the burst pulsed light PL3 that the first dichroic mirror 244 has transmitted at high transmittance enter the second CLBO crystal 241.

The second CLBO crystal 241 superimposes the burst pulsed light PL2 and the burst pulsed light PL3 on each other into burst pulsed light PL4 having a wavelength of about 193.4 nm corresponding to the sum frequency of the wavelength of about 1554 nm and the wavelength of about 220.9 nm. The burst pulsed light PL2 and the burst pulsed light PL3 that have not undergone the wavelength conversion pass through the second CLBO crystal 241.

A film is coated on the second dichroic mirror 245, and the film reflects the burst pulsed light PL4 at high reflectance and transmits the burst pulsed light PL2 and the burst pulsed light PL3 at high transmittance. The high-reflectance mirror 246 is disposed in a position where the burst pulsed light PL4 that the second dichroic mirror 245 has reflected at high reflectance is reflected at high reflectance and outputted by the high-reflectance mirror 246 from the wavelength conversion system 215. The burst pulsed light PL4 corresponds to the burst seed pulsed light BSP described above.

The first rotary stage 242 rotatably holds the first CLBO crystal 240. The second rotary stage 243 rotatably holds the second CLBO crystal 241.

The solid-state laser controller 217 controls the rotation of the first and second rotary stages 242, 243. The solid-state laser controller 217 further controls the operation of the first semiconductor laser 220, the second semiconductor laser 230, and the burst pulse generator 233.

5.1.2 Operation

Figure 35:
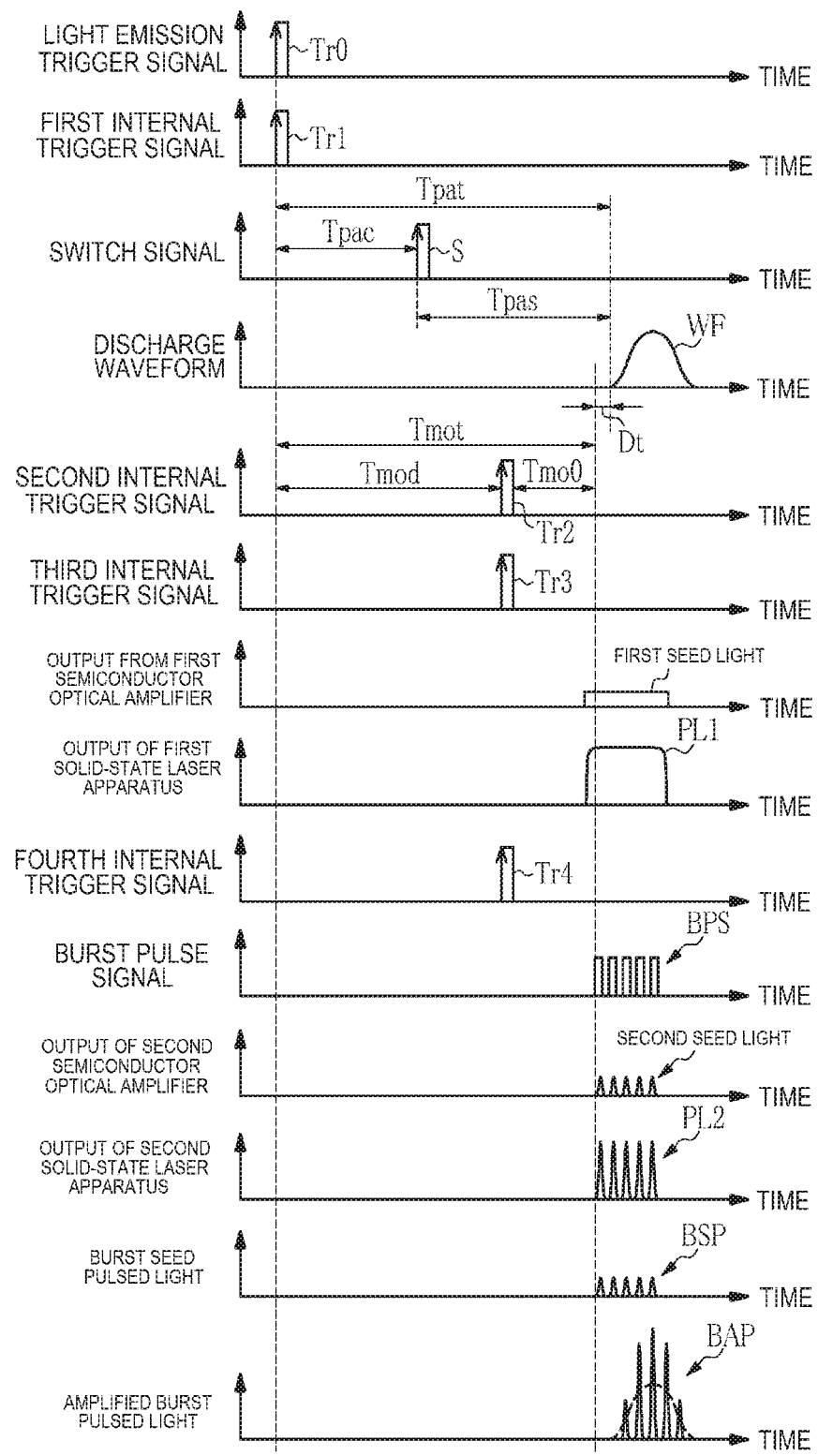
FIG. 35 is a timing chart showing the timings of operations performed by the laser apparatus according to the first variation.

The operation of the solid-state laser apparatus 10c will next be described. FIG. 35 shows basic operation timings in the laser oscillation operation performed by the solid-state laser apparatus 10c used as the MO.

The solid-state laser controller 217 receives the target burst pulse data BPDt from the laser radiation controller 3a via the laser controller 50. The target burst pulse data BPDt is transmitted as the set data to the burst pulse generator 233.

The synchronization circuit 216, when the second internal trigger signal Tr2 is inputted thereto from the synchronization circuit 60 described above, produces a third internal trigger signal Tr3 and a fourth internal trigger signal Tr4. The third internal trigger signal Tr3 is inputted to the first semiconductor optical amplifier 221. The fourth internal trigger signal Tr4 is inputted to the burst pulse generator 233.

The first wavelength optical amplifier 221 performs pulse amplification on the first seed light outputted from the first semiconductor laser 220 in response to the input of the third internal trigger signal Tr3 to produce the first seed pulsed light. The first semiconductor optical amplifier 221 sets the pulse width of the first seed pulsed light to be greater than the overall pulse width of each burst pulse, as shown in FIG. 35.

The first seed pulsed light is further amplified by the first amplifier 222 and enters the wavelength converter 223. The wavelength converter 223 produces fourth harmonic light from the incident first seed pulsed light. The fourth harmonic light is outputted as the pulsed laser light PL1 from the first solid-state laser apparatus 211.

The second semiconductor optical amplifier 231, when the fourth internal trigger signal Tr4 is inputted to the burst pulse generator 233, performs pulse amplification on the second seed light outputted from the second semiconductor laser 230 based on the burst pulse signal BPS to produce the second seed pulsed light formed of burst pulses. The second seed pulsed light is further amplified by the second amplifier 232 and outputted as the burst pulsed light PL2 from the second solid-state laser apparatus 212.

The pulsed laser light PL1 and the burst pulsed light PL2 enter the wavelength conversion system 215. The synchronization circuit 216 adjusts the timings of the third internal trigger signal Tr3 and the fourth internal trigger signal Tr4 in such a way that the pulsed laser light PL1 temporally coincides with the entire burst pulsed light PL2 in the wavelength conversion system 215. As a result, the wavelength conversion system 215 outputs the burst pulsed light PL4 having the wavelength of about 193.4 nm as the burst seed pulsed light BSP.

5.1.3 Effects

The solid-state laser apparatus 10c produces and outputs the sum-frequency light formed of the light outputted from the first solid-state laser apparatus 211 and the light outputted from the second solid-state laser apparatus 212 and can output high-intensity burst seed pulsed light BSP.

Further, the solid-state laser apparatus 10c does not convert first output light from the first solid-state laser apparatus 211 into burst pulses but converts second output light from the second solid-state laser apparatus 212 into burst pulses to produce the burst seed pulsed light BSP. Since the first output light has the wavelength of about 257.5 nm, whereas the second output light has the wavelength of about 1554 nm, each pulse has a higher peak intensity than in a case where the light outputted from the first solid-state laser apparatus 211 is converted into burst pulses, resulting in improvement in the wavelength conversion efficiency. Further, the wavelength conversion can be more readily performed by converting the second output light, which passes through a smaller number of nonlinear crystals, into burst pulses.

It is noted that the first output light and the second output light may both be converted into burst pulses. In this case, a burst pulse generator for the first semiconductor optical amplifier 221 may be further provided, and the synchronization circuit 216 may synchronize the output timing of the first output light with the output timing of the second output light.

5.2 Second Variation

5.2.1 Configuration and Operation

Figure 36:
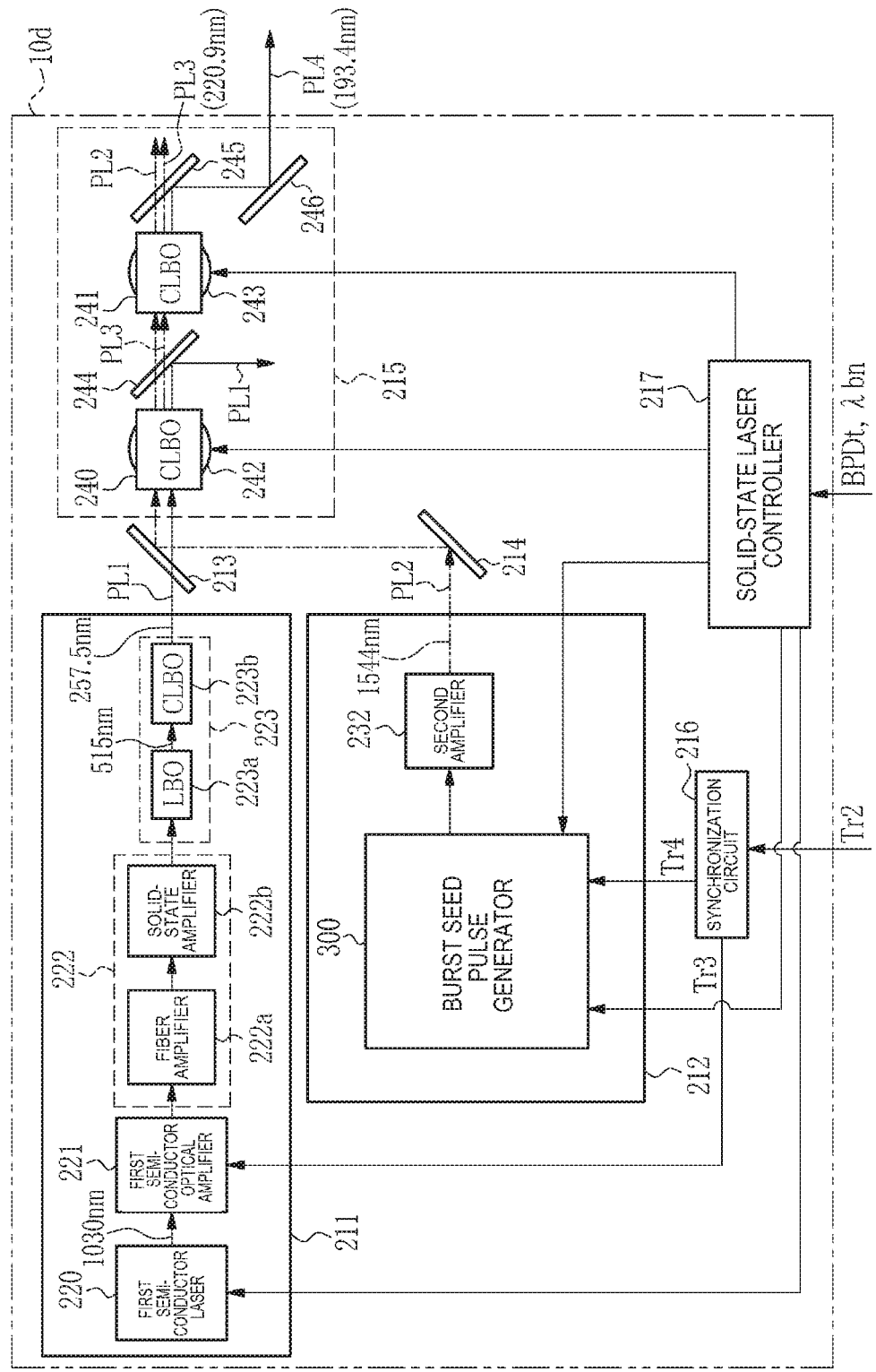
FIG. 36 shows the configuration of a solid-state laser apparatus according to a second variation.
Figure 37:
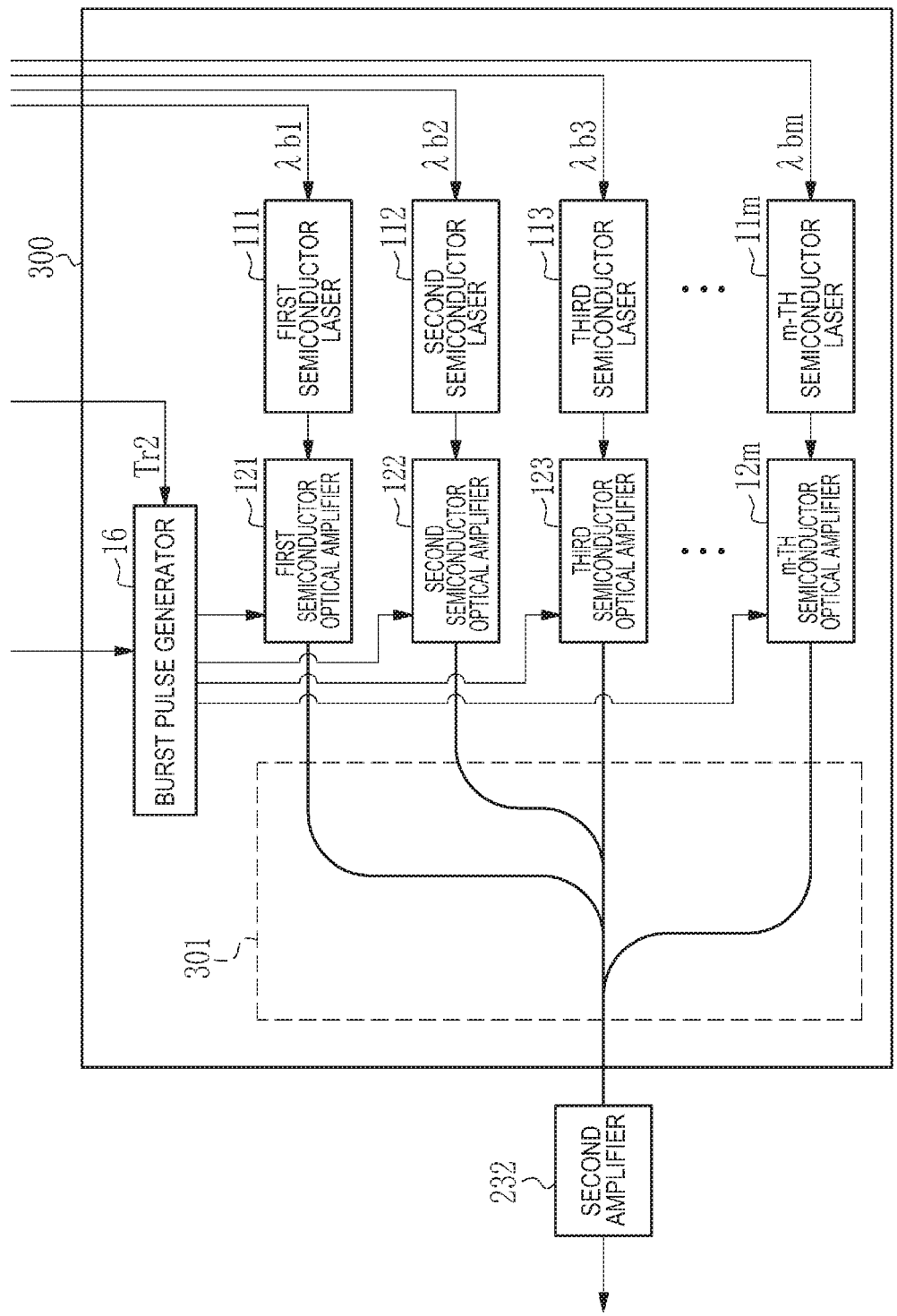
FIG. 37 shows the configuration of a burst seed pulse generator according to the second variation.

A second variation of the solid-state laser apparatus will be described below. FIGS. 36 and 37 show the configuration of a solid-state laser apparatus 10d according to the second variation. The solid-state laser apparatus 10d can change the wavelength of the burst pulsed light on a pulse basis, as can the solid-state laser apparatus 10b according to the third embodiment described above. The solid-state laser apparatus 10d has the same configuration as that of the solid-state laser apparatus 10b according to the third embodiment except that the solid-state laser apparatus 10d includes a burst seed pulse generator 300 in place of the burst seed pulse generator 234.

The burst seed pulse generator 300 includes the burst pulse generator 16, the first to m-th semiconductor lasers 111 to 11m, and the first to m-th semiconductor optical amplifiers 121 to 12m, which are the same as those in the third embodiment, and a beam combiner 301, as shown in FIG. 37. The beam combiner 301 in the present variation is formed of a plurality of optical fibers, and each of the optical fibers is connected to the other optical fibers in a fusion process. The first to m-th semiconductor lasers 111 to 11m are connected the plurality of input ends of the beam combiner 301, and the second amplifier 232 described above is connected to the output end of the beam combiner 301. The beam combiner 301 couples the optical paths of the plurality of laser beams outputted from the first to m-th semiconductor lasers 111 to 11m to one another.

In the present variation, the laser radiation controller 3a transmits the target wavelength $\lambda t(n)$ for each pulse $P_n$ contained in the amplified burst pulsed light BAP to the laser controller 50, as in the third embodiment. In the present variation, the solid-state laser apparatus 10d produces sum-frequency light, and the laser controller 50 therefore calculates wavelength data $\lambda bn$ that satisfies the following Expression (22) based on the target wavelength $\lambda t(n)$ and transmits the wavelength data $\lambda bn$ to the first to m-th semiconductor lasers 111 to 11m.

$$\lambda bn = 2/(1/\lambda t(n) - 1/257.5) \tag{22}$$

The operation of the solid-state laser apparatus 10d is the same as the operation of the solid-state laser apparatus 10c according to the first variation. The operation of the burst seed pulse generator 300 is the same as that in the third embodiment.

6. Laser Processing System

6.1 Configuration

Figure 38:
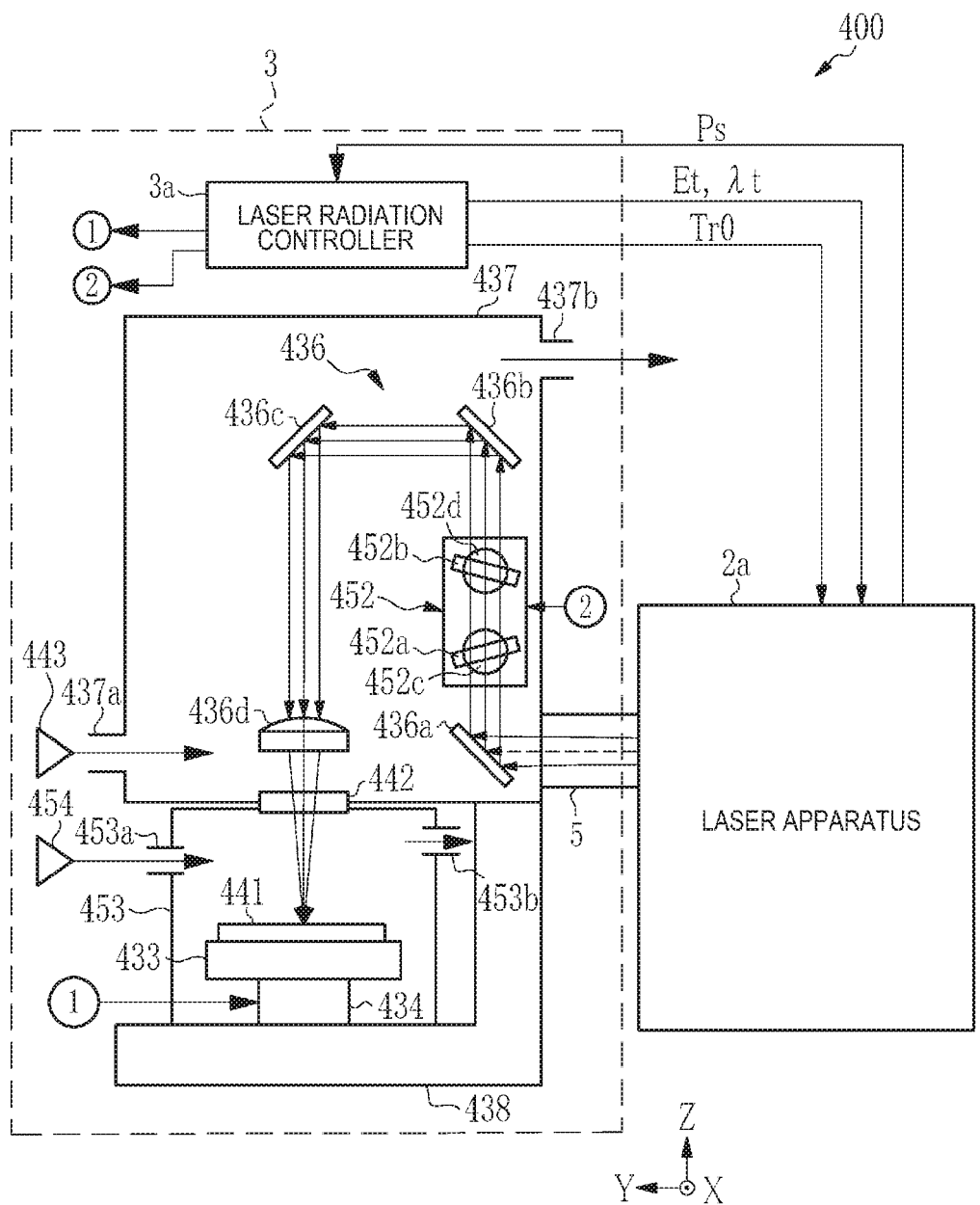
FIG. 38 shows a laser processing system.

FIG. 38 shows a laser processing system 400, which uses the laser apparatus according to any of the embodiments of the invention. The laser radiator 3 includes a table 433, an XYZ stage 434, an optical system 436, an enclosure 437, and a frame 438 in addition to the laser radiation controller 3*a* described above. The optical system 436 is disposed in the enclosure 437. The enclosure 437 and the XYZ stage 434 are fixed to the frame 438. The laser apparatus 2*a* and the enclosure 437 are connected to each other via an optical path tube 5.

The table 433 supports a workpiece 441. The workpiece 441 is a laser processing target to be irradiated with the pulsed laser light, and is, for example, a material containing a carbon atom. The XYZ stage 434 supports the table 433. The XYZ stage 434 is movable in the X-axis, Y-axis, and Z-axis directions and can adjust the position of the table 433 to adjust the position of the workpiece 441. The XYZ stage 434 adjusts the position of the workpiece 441 in such a way that the workpiece 441 is irradiated with the pulsed laser light outputted from the optical system 436.

The optical system 436 includes, for example, high-reflectance mirrors 436*a* to 436*c* and a light focusing lens 436*d*. The high-reflectance mirrors 436*a* to 436*c* and the light focusing lens 436*d* are each fixed to a holder that is not shown and disposed in predetermined positions in the enclosure 437.

The high-reflectance mirrors 436*a* to 436*c* reflect the pulsed laser light, which belongs to the ultraviolet region, at high reflectance. The high-reflectance mirror 436*a* reflects the pulsed laser light incident form the laser apparatus 2*a* toward the high-reflectance mirror 436*a*, and the high-reflectance mirror 436*b* reflects the pulsed laser light toward the high-reflectance mirror 436*c*. The high-reflectance mirror 436*c* reflects the pulsed laser light toward the light focusing lens 436*d*. The high-reflectance mirrors 436*a* to 436*c* are each formed of a transparent substrate made, for example, of synthesized quarts or calcium fluoride, and a reflection film that reflects the pulsed laser light at high reflectance is coated on a surface of the substrate.

The light focusing lens 436*d* is so disposed as to focus the pulsed laser light incident thereon onto the surface of the workpiece 441 via a window 442. The window 442 is disposed in the optical path between the light focusing lens 436*d* and the workpiece 441 and fixed to an opening formed in the enclosure 437 with the portion between the opening and the window 442 sealed by an O ring that is not shown.

A nitrogen gas, which is an inert gas, keeps flowing in the enclosure 437. The enclosure 437 is provided with an intake port 437*a*, through which the nitrogen gas is taken into the enclosure 437, and a discharge port 437*b*, through which the nitrogen gas is discharged out of the enclosure 437. A nitrogen gas supply source 443 is connected to the intake port 437*a*.

The laser radiator 3 further includes an attenuator 452, a shield 453, and a purge gas supply source 453. The attenuator 452 is disposed in the optical path between the high-reflectance mirrors 436*a* and 436*b* in the enclosure 437. The attenuator 452 includes, for example, two partial reflection mirrors 452*a* and 452*b* and rotary stages 452*c* and 452*d*, which rotate the partial reflection mirrors. The two partial reflection mirrors 452*a* and 452*b* are each an optical element having transmittance that changes in accordance with the angle of incidence of the pulsed laser light. The rotary stages 452*c* and 452*d* adjust the angles of inclination of the partial reflection mirrors 452*a* and 452*b* in such a way that the pulsed laser light is incident thereon at the same angle of incidence and desired transmittance of the pulsed laser light is achieved.

The pulsed laser light is thus so attenuated to have desired pulse energy and passes through the attenuator 452. The attenuator 452 is so configured that the transmittance of the pulsed laser light is controlled based on a control signal inputted from the laser radiation controller 3*a*. Controlling the transmittance at which the attenuator 452 transmits the pulsed laser light allows adjustment of the fluence of the pulsed laser light with which the surface of the workpiece 441 is irradiated.

The shield 453 covers the workpiece 441 supported on the table 433. The shield 453 is so sized as to cover the entire table 433 and the XYZ stage 434 and is fixed to the frame 438.

An opening is formed in the upper surface of the shield 453, and the opening is connected to the window 442 provided in the enclosure 437. The window 442 has a light incident surface and a light exiting surface. The light incident surface, on which the pulsed laser light from the light focusing lens 436*d* is incident, is disposed in the enclosure 437, and the light exiting surface, via which the pulsed laser light exits, is disposed in the shield 453. The shield 453 thus surrounds the pulsed laser light radiation optical path between the window 442 and the workpiece 441.

The purge gas supply source 454 is a gas supply source that supplies the shield 453 with a purge gas. The purge gas is, for example, nitrogen or clean dried air (CDA). CDA is, for example, an atmospheric gas from which particles, moisture, and other impurities are removed by using a mechanical filter and a molecular sieve. In the case where CDA is used as the purge gas, the solid-state laser apparatus 10*a* provided in the laser apparatus 2*a* is preferably caused to perform laser oscillation in such a way that the oscillation wavelength does not coincide with the wavelength corresponding to the oxygen absorption line.

An oxygen gas keeps flowing in the internal space of the shield 453. The shield 453 is provided with an intake port 453*a*, through which the oxygen gas is taken into the shield 453 from the oxygen gas supply source 454, and a discharge port 453*b*, through which the oxygen gas is discharged out of the shield 453.

6.2 Effects

In a case where a laser apparatus that outputs burst pulsed light, such as the laser apparatus 2*a*, is connected to the thus configured laser radiator 3, the peak intensity of each pulse can be lowered to prolong the life of an optical element, as compared with the case of pulsed light formed of a single pulse. Further, since the burst pulsed light supplied to the laser radiator 3 has a short pulse width, an excellent processed shape is achieved.

In a case where a laser apparatus capable of changing the wavelength of each pulse, such as the laser apparatus 2*c*, is connected to the laser radiator 3, controlling the wavelength of each pulse allows deep processing. For example, increasing the wavelength of the pulses contained in the burst pulsed light in the order of incidence of the pulses successively increases the focal length of the light focusing lens 436d, allowing deep processing.

7. Specific Example of Semiconductor Laser and Semiconductor Optical Amplifier

7.1 Configuration

Figure 39:
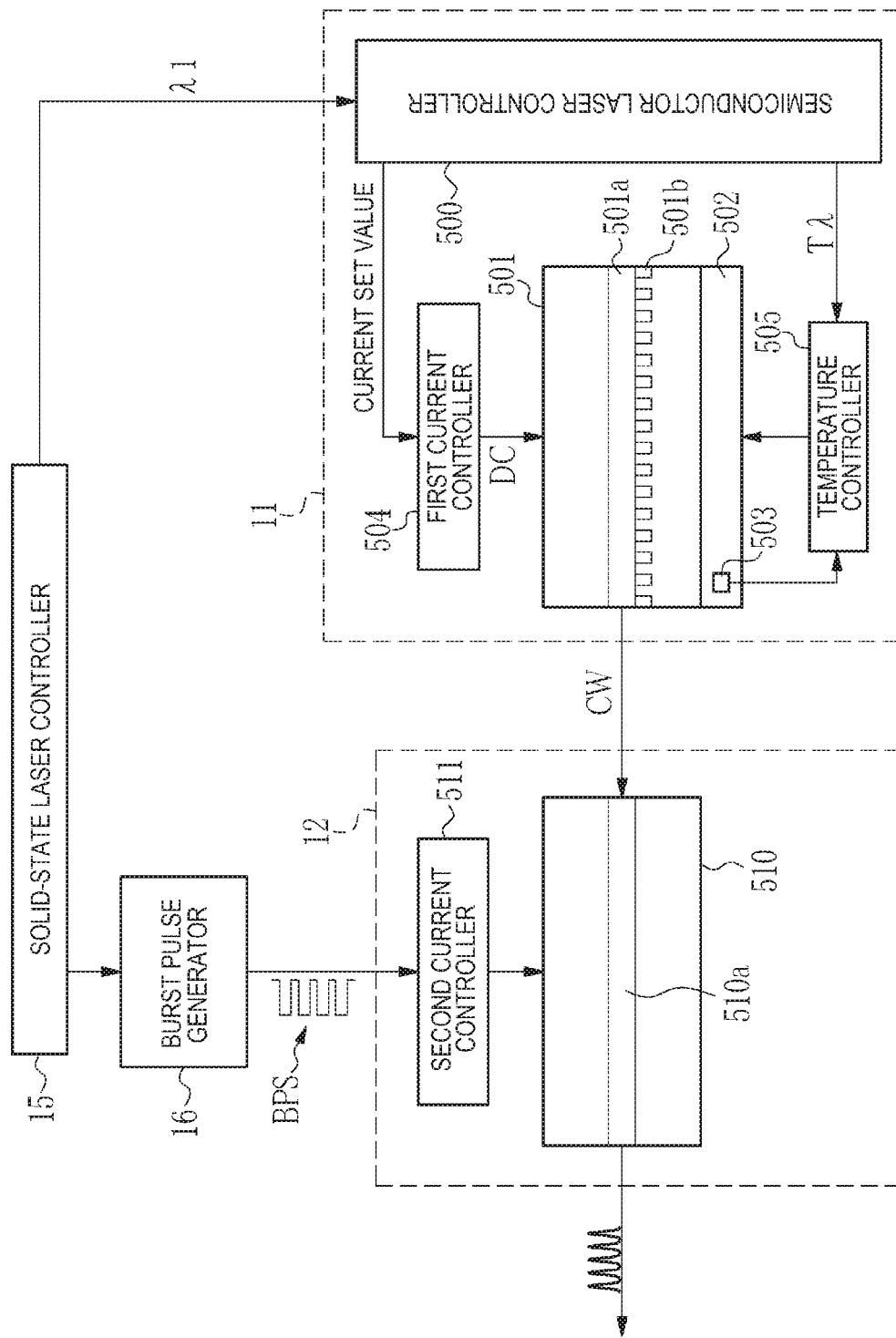
FIG. 39 shows a specific example of a semiconductor laser and a semiconductor optical amplifier.

FIG. 39 shows a specific example of the semiconductor laser 11 and the semiconductor optical amplifier 12. The semiconductor laser 11 includes a first semiconductor laser controller 500, a first semiconductor device 501, a Peltier device 502, a temperature sensor 503, a first current controller 504, and a temperature controller 505. The semiconductor laser 11 is a distributed feedback laser that performs laser oscillation in a single longitudinal mode and outputs CW laser light. The first semiconductor device 501 has an active layer 501a and a grating 50 1b.

The semiconductor optical amplifier 12 includes a second semiconductor device 510 and a second current controller 511. The second semiconductor device 510 has an active layer 510a.

7.2 Operation

The semiconductor laser controller 500, when the wavelength data λ1 is inputted thereto from the solid-state laser controller 15, inputs a temperature Tλ corresponding to the wavelength data λ1 to the temperature controller 505. The temperature controller 505 monitors the temperature of the Peltier device 502 detected with the temperature sensor 503 and controls the current flowing through the Peltier device 502 in such a way that the temperature of the Peltier device 502 is equal to the temperature Tλ. The first current controller 504 causes current to flow through the first semiconductor device 501 based on a current set value inputted from the solid-state laser controller 15. Fixed current flows through the active layer 501a of the first semiconductor device 501, and CW laser light having the wavelength λ1 is outputted.

The CW laser light outputted from the semiconductor laser 11 enters the active layer 510a of the second semiconductor device 510. The burst pulse signal BPS, which is the current control signal, is inputted to the second semiconductor device 510. Amplified seed pulsed light formed of burst pulses is outputted in synchronization with the burst pulse signal BPS.

7.3 Effects

According to the configuration described above, controlling the temperature of the first semiconductor device 501 allows the semiconductor laser 11 to change its oscillation wavelength.

In each of the embodiments described above, a semiconductor optical amplifier that performs pulse amplification is provided on the output side of a semiconductor laser. In place of the semiconductor optical amplifier, an optical shutter that is the combination of a polarizer and an EO Pockels cell may be used.

In FIG. 39, the semiconductor optical amplifier 12 and the burst pulse generator 16 may be omitted, and the seed pulsed light formed of burst pulses may be produced by inputting a current signal formed of burst pulses from the semiconductor laser controller 500 to the first current controller 504. Further, in FIG. 39, the seed pulsed light formed of burst pulses may be produced by inputting the current signal formed of burst pulses from the semiconductor laser controller 500 to the first current controller 504 with the semiconductor optical amplifier 12 and the burst pulse generator left in the laser apparatus. In this case, the operation of the semiconductor laser 11 and the operation of the semiconductor optical amplifier 12 are synchronized with each other.

8. Variation of Discharge Sensor

A variation of the discharge sensor will next be described. In each of the embodiments described above, the laser chamber 21 provided in the excimer amplifier 20 is provided with the discharge observation window 21c, and the second optical sensor 71 receives the discharge light via the discharge observation window 21c to detect the discharge. In the present variation, no discharge observation window 21c is provided, and the second optical sensor 71 receives the discharge light having passed through the concave mirror 25b to detect the discharge.

8.1 Configuration and Operation

Figure 40:
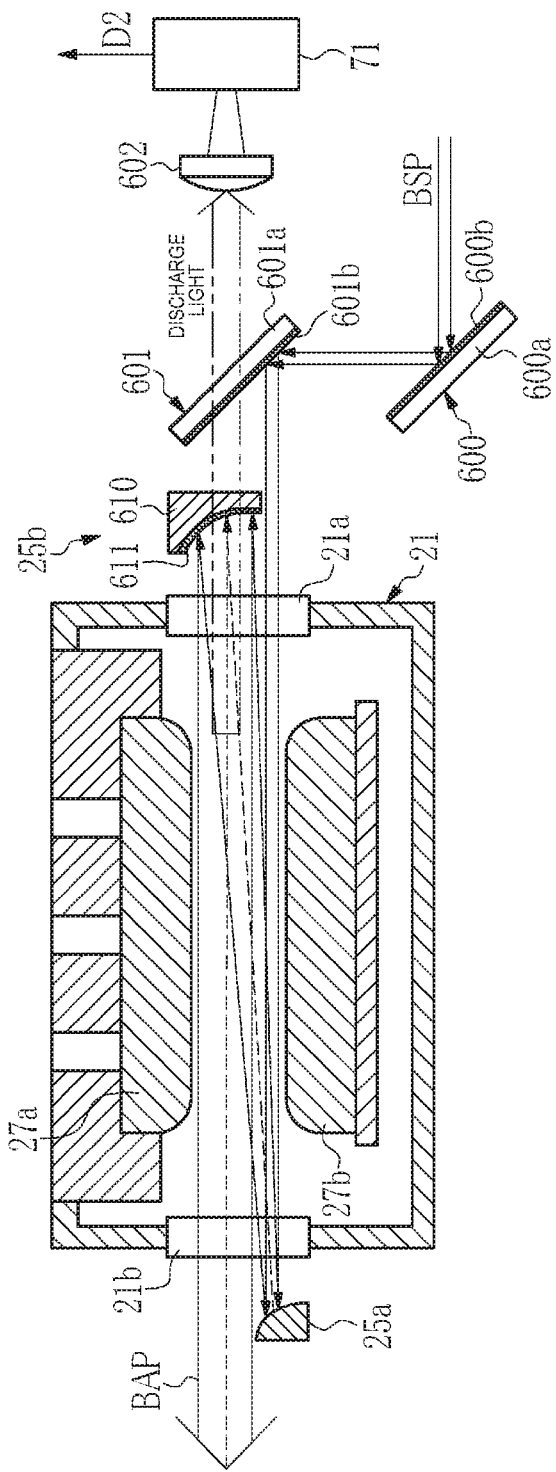
FIG. 40 shows a variation of a discharge sensor.

FIG. 40 shows part of an excimer amplifier according to the present variation. In the present variation, the excimer amplifier further includes a first high-reflectance mirror 600, a second high-reflectance mirror 601, and a transfer lens 602. In the present variation, the concave mirror 25b is formed of a substrate 610, which transmits visible light and on which a film 611, which transmits visible light and reflects light having the wavelength of 193.4 nm at high reflectance, is coated.

The first high-reflectance mirror 600 is formed of a substrate 600a, which transmits visible light and on which a film 600b, which transmits visible light and reflects light having the wavelength of 193.4 nm at high reflectance, is coated. Similarly, the second high-reflectance mirror 601 is formed of a substrate 601a, which transmits visible light and on which a film 601b, which transmits visible light and reflects light having the wavelength of 193.4 nm at high reflectance, is coated. The first high-reflectance mirror 600 and the second high-reflectance mirror 601 are so disposed as to cause the burst seed pulsed light BSP to enter the discharge space.

The transfer lens 602 is so disposed that the discharge light enters the transfer lens 602 from the discharge space via the window 21a, the concave mirror 25b, and the second high-reflectance mirror 601. The second optical sensor 71 described above is disposed in a position where the transfer lens 602 transfers an image of the discharge light. When the discharge occurs in the discharge space, the second optical sensor 71 receives the discharge light to detect the discharge timing.

8.2 Effects

According to the present variation, the laser chamber 21 needs to be provided with no discharge observation window 21c.

In the variation described above, the discharge light outputted from the discharge space toward the light incident side of the laser chamber 21 is detected. The discharge light outputted from the discharge space toward the light exiting side of the laser chamber 21 may instead be detected. In this case, high-reflectance mirrors similar to the first and second high-reflectance mirrors 600, 601 may be so located as to face the window 21b, and the discharge light may be detected with an optical sensor via the high-reflectance mirrors.

9. Other Variations

In each of the embodiments described above, in the optimization of the target delay period Dt by changing the target delay period Dt, the measured delay period D that maximizes the measured burst pulse energy E is set to be the optimum delay period Dopt. In a case where the target delay period Dt can be precisely controlled, however, the synchronization timing may be so controlled by gradually changing the target delay period Dt as to increase the measured burst pulse energy E.

The embodiments and specific example described above can be combined with each other as long as no contradiction occurs. Further, the above description is intended not to be limiting but merely to exemplary. It will therefore be apparent for a person skilled in the art that the embodiments of the present disclosure can be changed without departing from the accompanying claims.

The terms used in the entire specification and accompanying claims should each be construed as a "non-limiting" term. For example, the term "include" or "included" should be construed as "does not necessarily include only what is described." The term "have" should be construed as "does not necessarily have only what is described." Further, an indefinite article "a" described in the present specification and the accompanying claims should be construed as a term that means "at least one" or "one or more."

What is claimed is:

1. A laser apparatus comprising:
   (A) a solid-state laser apparatus configured to output burst seed pulsed light containing a plurality of pulses;
   (B) an excimer amplifier configured to amplify the burst seed pulsed light in a discharge space in a single occurrence of discharge and to output the amplified light as amplified burst pulsed light;
   (C) an energy sensor configured to measure energy of the amplified burst pulsed light; and
   (D) a laser controller configured to correct a timing at which the solid-state laser apparatus is caused to output the burst seed pulsed light based on a relationship of a difference between a timing at which the solid-state laser apparatus outputs the burst seed pulsed light and a timing at which discharge occurs in the discharge space, and the measured value of the energy.

2. The laser apparatus according to claim 1,
   wherein the excimer amplifier includes a pair of discharge electrodes, a pulse power module, and a charger, and
   the laser controller performs energy feedback control that corrects charging voltage set in the charger in such a way that the measured value of the energy approaches a target value.

3. The laser apparatus according to claim 2,
   wherein the laser controller corrects the timing at which the solid-state laser apparatus is caused to output the burst seed pulsed light and then performs the energy feedback control.

4. The laser apparatus according to claim 1, further comprising:
   (E) an optical intensity sensor configured to measure an optical intensity waveform of each pulse contained in the amplified burst pulsed light; and
   (F) a pulse waveform analyzer configured to measure at least one parameter representing a characteristic of each of the pulses based on the optical intensity waveform of the pulse.

5. The laser apparatus according to claim 4,
   wherein the laser controller performs parameter feedback control that controls the solid-state laser apparatus in such a way that a measured value of the parameter approaches a target value.

6. The laser apparatus according to claim 5,
   wherein the parameter includes a peak intensity, a pulse interval, and a pulse width.

7. The laser apparatus according to claim 6,
   wherein the laser controller corrects the timing at which the solid-state laser apparatus is caused to output the burst seed pulsed light and then performs the parameter feedback control.

8. The laser apparatus according to claim 1,
   the solid-state laser apparatus being configured to a change a wavelength of each pulse contained in the burst seed pulsed light.

9. The laser apparatus according to claim 8, further comprising:
   (G) a wavelength monitor configured to measure a wavelength of each pulse contained in the amplified burst seed pulsed light,
   wherein the laser controller performs wavelength feedback control that controls the solid-state laser apparatus in such a way that a measured value of the wavelength approaches a target value.

10. The laser apparatus according to claim 9,
    wherein the laser controller corrects the timing at which the solid-state laser apparatus is caused to output the burst seed pulsed light and then performs the wavelength feedback control.

11. The laser apparatus according to claim 1,
    wherein the solid-state laser apparatus includes a semiconductor laser, a semiconductor optical amplifier configured to perform pulse amplification on light outputted from the semiconductor laser and a burst pulse generator configured to control current in the semiconductor optical amplifier.

12. The laser apparatus according to claim 8,
    wherein the solid-state laser apparatus includes a plurality of semiconductor lasers, a plurality of semiconductor optical amplifiers, a beam combiner, and a burst pulse generator configured to control current in the plurality of semiconductor optical amplifiers.

13. The laser apparatus according to claim 1, further comprising:
    (H) a first optical sensor configured to detect the burst seed pulsed light outputted from the solid-state laser apparatus;
    (I) a second optical sensor configured to detect discharge light produced in the discharge space; and
    (J) a timer configured to receive a first detection signal outputted from the first optical sensor and a second detection signal outputted from the second optical sensor and to measure a delay period from the reception of the first detection signal to the reception of the second detection signal.

14. The laser apparatus according to claim 13,
    wherein the laser controller corrects the timing at which the solid-state laser apparatus is caused to output the burst seed pulsed light based on a relationship between a measured value of the delay period and a measured value of the energy.

15. The laser apparatus according to claim 14,
wherein the laser controller corrects the timing at which the solid-state laser apparatus is caused to output the burst seed pulsed light based on the measured value of the delay period that maximizes the measured value of the energy.

16. A laser processing system comprising:
(K) the laser apparatus according to claim 1; and
(L) a laser radiator configured to radiate the amplified burst seed pulsed light inputted from the laser apparatus onto a workpiece.

17. The laser apparatus according to claim 1,
wherein the laser controller causes the solid-state laser apparatus to output the burst seed pulsed light in response to one externally inputted light emission trigger signal.

* * * * *